(12) United States Patent
Kakizaki et al.

(10) Patent No.: US 10,710,194 B2
(45) Date of Patent: Jul. 14, 2020

(54) LASER PROCESSING SYSTEM AND LASER PROCESSING METHOD

(71) Applicant: Gigaphoton Inc., Tochigi (JP)

(72) Inventors: Kouji Kakizaki, Oyama (JP); Osamu Wakabayashi, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/429,091

(22) Filed: Jun. 3, 2019

(65) Prior Publication Data

US 2019/0283177 A1    Sep. 19, 2019

Related U.S. Application Data

(63) Continuation of application No. PCT/JP2017/001346, filed on Jan. 17, 2017.

(51) Int. Cl.
*B23K 26/0622* (2014.01)
*G02B 21/36* (2006.01)
(Continued)

(52) U.S. Cl.
CPC ........ *B23K 26/0622* (2015.10); *B23K 26/032* (2013.01); *B23K 26/042* (2015.10);
(Continued)

(58) Field of Classification Search
CPC ............... B23K 26/032; B23K 26/042; B23K 26/0622; B23K 26/0624; B23K 26/0861;
(Continued)

(56) References Cited

U.S. PATENT DOCUMENTS 5,061,850 A * 10/1991 Kelly ............... H01J 37/045
250/287
7,532,791 B2 * 5/2009 Jia ................. B23K 26/03
385/37
(Continued)

FOREIGN PATENT DOCUMENTS

JP    2002-273581 A    9/2002
JP    2004-186200 A    7/2004
(Continued)

OTHER PUBLICATIONS

International Search Report issued in PCT/JP2017/001346; dated Feb. 28, 2017.
(Continued)

*Primary Examiner* — Crystal J Barnes-Bullock
(74) *Attorney, Agent, or Firm* — Studebaker & Brackett PC

(57) ABSTRACT

A laser processing system includes a wavelength tunable laser apparatus capable of changing the wavelength of pulsed laser light to be outputted, an optical system irradiating a workpiece with the pulsed laser light, a reference wavelength acquisition section acquiring a reference wavelength corresponding to photon absorption according to the material of the workpiece, a laser processing controller controlling the wavelength tunable laser apparatus to perform preprocessing before final processing performed on the workpiece, changes the wavelength of the pulsed laser light over a predetermined range containing the reference wavelength, and performs wavelength search preprocessing at a plurality of wavelengths, a processed state measurer measuring a processed state on a wavelength basis achieved by the wavelength search preprocessing performed at the plurality of wavelengths, and an optimum wavelength determination section assessing the processed state on a wavelength (Continued)

basis to determine an optimum wavelength used in the final processing.

20 Claims, 38 Drawing Sheets

(51) Int. Cl.
*H01S 3/094* (2006.01)
*H03K 7/08* (2006.01)
*B23K 26/08* (2014.01)
*B23K 26/53* (2014.01)
*B23K 26/03* (2006.01)
*H01M 2/14* (2006.01)
*B23K 26/042* (2014.01)
*B23K 26/32* (2014.01)
*B23K 26/40* (2014.01)
*H01M 8/1069* (2016.01)
*H01J 37/244* (2006.01)
*H01J 37/285* (2006.01)
*H01J 37/04* (2006.01)
*H01J 49/00* (2006.01)

(52) U.S. Cl.
CPC ...... *B23K 26/0624* (2015.10); *B23K 26/0861* (2013.01); *B23K 26/32* (2013.01); *B23K 26/40* (2013.01); *B23K 26/53* (2015.10); *G02B 21/361* (2013.01); *H01J 37/045* (2013.01); *H01J 37/244* (2013.01); *H01J 37/285* (2013.01); *H01J 49/0004* (2013.01); *H01M 2/14* (2013.01); *H01M 8/1069* (2013.01); *H01S 3/094076* (2013.01); *H03K 7/08* (2013.01); *H01J 2237/2446* (2013.01); *H01J 2237/24495* (2013.01); *H01J 2237/24507* (2013.01); *H01J 2237/24592* (2013.01)

(58) Field of Classification Search
CPC ........ B23K 26/32; B23K 26/40; B23K 26/53; G02B 21/361; H01J 37/045; H01J 37/244; H01J 37/285; H01J 2237/2446; H01J 2237/24495; H01J 2237/24507; H01J 2237/24592; H01J 49/0004; H03K 7/08; H01M 2/14; H01M 8/1069; H01S 3/094076

See application file for complete search history.

(56) References Cited

U.S. PATENT DOCUMENTS

| | | | | |
|---|---|---|---|---|
| 8,942,267 B2* | 1/2015 | Ma | ............. | G02B 5/288 |
| | | | | 372/20 |
| 8,993,919 B2* | 3/2015 | Kusukame | ............ | G02F 1/3511 |
| | | | | 219/121.61 |
| 9,209,443 B2* | 12/2015 | L'Abee | ................. | H01M 2/162 |
| 2002/0172234 A1 | 11/2002 | Arisawa et al. | | |
| 2005/0150254 A1 | 7/2005 | Morita et al. | | |
| 2007/0057187 A1* | 3/2007 | Krummel | .................. | G01J 3/02 |
| | | | | 250/338.1 |
| 2007/0111477 A1 | 5/2007 | Maruyama et al. | | |
| 2012/0234807 A1* | 9/2012 | Sercel | ................ | B23K 26/0608 |
| | | | | 219/121.69 |

FOREIGN PATENT DOCUMENTS

| | | | | |
|---|---|---|---|---|
| JP | 2005288503 A | * | 10/2005 | ......... C03B 33/0222 |
| JP | 2007-165839 A | | 6/2007 | |
| JP | 2008-503032 A | | 1/2008 | |
| JP | 2010-158686 A | | 7/2010 | |
| WO | 2003/076151 A1 | | 9/2003 | |
| WO | 2005/111728 A2 | | 11/2005 | |

OTHER PUBLICATIONS

International Preliminary Report on Patentability and Written Opinion issued in PCT/JP2017/001346; dated Jul. 23, 2019.

* cited by examiner

FIG. 5

| FIRST WAVELENGTH SELECTION TABLE | | | |
|---|---|---|---|
| MATERIAL NAME MN | BANDGAP [eV] | ONE-PHOTON ABSORPTION WAVELENGTH [nm] | ~56 |
| GaP | 2.26 | 548.7 | |
| CdS | 2.42 | 512.4 | |
| AlP | 2.45 | 506.1 | |
| GaS | 2.5 | 496.0 | |
| ZnSe | 2.7 | 459.3 | |
| SiC | 2.86 | 433.6 | |
| 6H-SiC | 2.93 | 423.2 | |
| 4H-SiC | 3.26 | 380.4 | |
| ZnO | 3.37 | 368.0 | |
| GaN | 3.4 | 364.7 | |
| ZnS | 3.6 | 344.4 | |
| $Ga_2O_3$ | 4.9 ~ 5.3 | 234.0 ~ 253.1 | |
| Diamond | 5.5 | 225.5 | |
| $SiO_2$ | 5.8 | 213.8 | |
| cBN | 6.2 | 200.0 | |
| AlN | 6.0 ~ 6.3 | 196.8 ~ 206.7 | |
| Sapphire | 7.0 ~ 8.4 | 147.6 ~ 177.1 | |

FIG. 11

| | 67 | |
|---|---|---|
| FLUENCE ASSESSMENT VALUE TABLE | | |
| N | FLp(N) | Dok(N) |
| N=1 | FLp(1) | UNSUCCESSFUL PROCESSING |
| N=2 | FLp(2) | UNSUCCESSFUL PROCESSING |
| N=3 | FLp(3) | UNSUCCESSFUL PROCESSING |
| N=4 | FLp(4) | UNSUCCESSFUL PROCESSING |
| N=5 | FLp(5) | UNSUCCESSFUL PROCESSING | ← FLth
| N=6 | FLp(6) | SUCCESSFUL PROCESSING |
| N=7 | FLp(7) | SUCCESSFUL PROCESSING |
| N=8 | FLp(8) | SUCCESSFUL PROCESSING |
| N=9 | FLp(9) | SUCCESSFUL PROCESSING |
| N=10 | FLp(10) | SUCCESSFUL PROCESSING |

FIG. 14

| FIRST WAVELENGTH ASSESSMENT VALUE TABLE | | | |
|---|---|---|---|
| N | $\lambda p(N)$ | Dok(N) | ~69 |
| N=1 | $\lambda p(1)$ | UNSUCCESSFUL PROCESSING | |
| N=2 | $\lambda p(2)$ | UNSUCCESSFUL PROCESSING | |
| N=3 | $\lambda p(3)$ | UNSUCCESSFUL PROCESSING | |
| N=4 | $\lambda p(4)$ | UNSUCCESSFUL PROCESSING | |
| N=5 | $\lambda p(5)$ | UNSUCCESSFUL PROCESSING | |
| N=6 | $\lambda p(6)$ | UNSUCCESSFUL PROCESSING | |
| N=7 | $\lambda p(7)$ | UNSUCCESSFUL PROCESSING | |
| N=8 | $\lambda p(8)$ | UNSUCCESSFUL PROCESSING | |
| N=9 | $\lambda p(9)$ | UNSUCCESSFUL PROCESSING | |
| N=10 | $\lambda p(10)$ | UNSUCCESSFUL PROCESSING | ← $\lambda a$ |
| N=11 | $\lambda p(11)$ | UNSUCCESSFUL PROCESSING | |
| N=12 | $\lambda p(12)$ | SUCCESSFUL PROCESSING | ← $\lambda okmin$ |
| N=13 | $\lambda p(13)$ | SUCCESSFUL PROCESSING | |
| N=14 | $\lambda p(14)$ | SUCCESSFUL PROCESSING | |
| N=15 | $\lambda p(15)$ | SUCCESSFUL PROCESSING | ← $\lambda okmax$ |
| N=16 | $\lambda p(16)$ | UNSUCCESSFUL PROCESSING | |
| N=17 | $\lambda p(17)$ | UNSUCCESSFUL PROCESSING | |
| N=18 | $\lambda p(18)$ | UNSUCCESSFUL PROCESSING | |
| N=19 | $\lambda p(19)$ | UNSUCCESSFUL PROCESSING | |
| N=20 | $\lambda p(20)$ | UNSUCCESSFUL PROCESSING | |

FIG. 22

| SECOND WAVELENGTH ASSESSMENT VALUE TABLE | | |
|---|---|---|
| N | $\lambda p(N)$ | PS(N) |
| N=1 | $\lambda p(1)$ | PS(1) |
| N=2 | $\lambda p(2)$ | PS(2) |
| N=3 | $\lambda p(3)$ | PS(3) |
| N=4 | $\lambda p(4)$ | PS(4) |
| N=5 | $\lambda p(5)$ | PS(5) |
| N=6 | $\lambda p(6)$ | PS(6) |
| N=7 | $\lambda p(7)$ | PS(7) |
| N=8 | $\lambda p(8)$ | PS(8) |
| N=9 | $\lambda p(9)$ | PS(9) |
| N=10 | $\lambda p(10)$ | PS(10) |

| SECOND WAVELENGTH SELECTION TABLE ~84 | | | |
|---|---|---|---|
| MATERIAL NAME MN | BANDGAP [eV] | ONE-PHOTON ABSORPTION WAVELENGTH $\lambda 1h\nu$ [nm] | TWO-PHOTON ABSORPTION WAVELENGTH $\lambda 2h\nu$ [nm] |
| GaP | 2.26 | 548.7 | 1097.3 |
| CdS | 2.42 | 512.4 | 1024.8 |
| AlP | 2.45 | 506.1 | 1012.2 |
| GaS | 2.5 | 496.0 | 992.0 |
| ZnSe | 2.7 | 459.3 | 918.5 |
| SiC | 2.86 | 433.6 | 867.1 |
| 6H-SiC | 2.93 | 423.2 | 846.4 |
| 4H-SiC | 3.26 | 380.4 | 760.7 |
| ZnO | 3.37 | 368.0 | 735.9 |
| GaN | 3.4 | 364.7 | 729.4 |
| ZnS | 3.6 | 344.4 | 688.9 |
| Ga$_2$O$_3$ | 4.9 ~ 5.3 | 234.0 ~ 253.1 | 467.9 ~ 506.1 |
| Diamond | 5.5 | 225.5 | 450.9 |
| SiO$_2$ | 5.8 | 213.8 | 427.6 |
| cBN | 6.2 | 200.0 | 400.0 |
| AlN | 6.0 ~ 6.3 | 196.8 ~ 206.7 | 393.7 ~ 413.3 |
| Sapphire | 7.0 ~ 8.4 | 147.6 ~ 177.1 | 295.2 ~ 354.3 |

FIG. 36

| PULSE WIDTH ASSESSMENT VALUE TABLE | | |
|---|---|---|
| N | $\Delta Tp(N)$ | $PS(N)$ |
| N=1 | $\Delta Tp(1)$ | $PS(1)$ |
| N=2 | $\Delta Tp(2)$ | $PS(2)$ |
| N=3 | $\Delta pT(3)$ | $PS(3)$ |
| N=4 | $\Delta Tp(4)$ | $PS(4)$ |
| N=5 | $\Delta Tp(5)$ | $PS(5)$ |
| N=6 | $\Delta Tp(6)$ | $PS(6)$ |
| N=7 | $\Delta Tp(7)$ | $PS(7)$ |
| N=8 | $\Delta Tp(8)$ | $PS(8)$ |
| N=9 | $\Delta Tp(9)$ | $PS(9)$ |
| N=10 | $\Delta Tp(10)$ | $PS(10)$ |

~86

LASER PROCESSING SYSTEM AND LASER PROCESSING METHOD

CROSS REFERENCE TO RELATED APPLICATIONS

The present application is a continuation application of International Application No. PCT/JP2017/001346 filed on Jan. 17, 2017. The content of the application is incorporated herein by reference in its entirety.

BACKGROUND

1. Technical Field

The present disclosure relates to a laser processing system and a laser processing method.

2. Related Art

In recent years, in the laser processing field, attention has been directed toward laser processing using pulsed laser light in the form of ultrashort pulses each having a very small pulse width. For example, it is known that irradiating a material under processing with pulsed laser light having a pulse width of picoseconds or femtoseconds causes photon absorption at the surface of the material under processing to achieve an excellent processed shape in no-heat processing.

Further, there has been an attempt to perform laser processing by using a wavelength tunable laser apparatus capable of changing the wavelength of the outputted pulsed laser light to select pulsed laser light having an appropriate wavelength according to a workpiece. For example, in a case where the workpiece is made of a crystal material, the appropriate wavelength is so selected as to be a light absorption wavelength theoretically determined in correspondence with the bandgap of the material.

CITATION LIST

Patent Literature

[PTL 1] JP-A-2002-273581
[PTL 2] JP-A-2008-503032
[PTL 3] WO2003/076151

SUMMARY

A laser processing system that irradiates a workpiece with pulsed laser light to perform laser processing on the workpiece according to a viewpoint of the present disclosure includes:

A: a wavelength tunable laser apparatus configured to output the pulsed laser light and be capable of changing a wavelength of the pulsed laser light;

B: an optical system configured to irradiate the workpiece with the pulsed laser light outputted from the wavelength tunable laser apparatus;

C: a reference wavelength acquisition section configured to acquire a reference wavelength corresponding to photon absorption according to a material of the workpiece;

D: a laser processing controller configured to control the wavelength tunable laser apparatus to perform preprocessing before final processing is performed on the workpiece, change the wavelength of the pulsed laser light outputted from the wavelength tunable laser apparatus over a predetermined range containing the reference wavelength, and perform wavelength search preprocessing at a plurality of wavelengths;

E: a processed state measurer configured to measure a processed state on a wavelength basis achieved by the wavelength search preprocessing performed at the plurality of wavelengths: and F: an optimum wavelength determination section configured to assess the processed state on a wavelength basis to determine an optimum wavelength used in the final processing.

A laser processing method for irradiating a workpiece with pulsed laser light to perform laser processing on the workpiece according to another viewpoint of the present disclosure includes:

A. a reference wavelength acquisition step of acquiring a reference wavelength corresponding to photon absorption according to a material of the workpiece;

B: a wavelength search preprocessing step of changing a wavelength of the pulsed laser light, which is outputted from a wavelength tunable laser apparatus capable of changing the wavelength of the pulsed laser light, over a predetermined range containing the reference wavelength and performing wavelength search preprocessing at a plurality of wavelengths;

C: a processed state measurement step of measuring a processed state on a wavelength basis achieved by the wavelength search preprocessing performed at the plurality of wavelengths: and D: an optimum wavelength determination step of assessing the processed state on a wavelength basis to determine an optimum wavelength used in final processing.

BRIEF DESCRIPTION OF THE DRAWINGS

Embodiments of the present disclosure will be described below only by way of example with reference to the accompanying drawings.

FIG. 5 describes a first wavelength selection table.

FIG. 11 describes a fluence assessment value table.

FIG. 14 describes a first assessment value table.

FIG. 22 describes a second assessment value table.

FIG. 26 describes a second wavelength selection table.

FIG. 36 describes a pulse width assessment value table.

DETAILED DESCRIPTION

Figure 1:
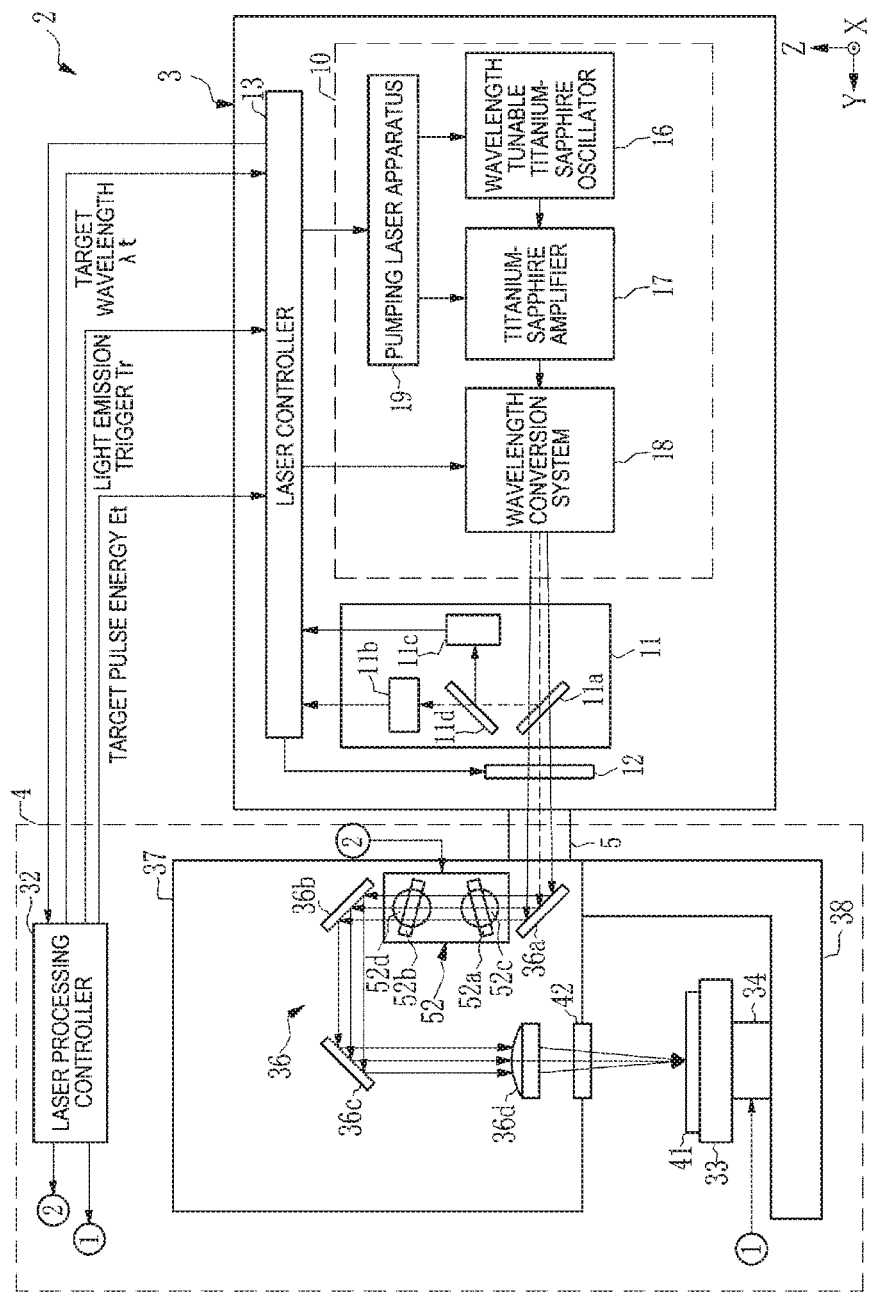
FIG. 1 schematically shows the configuration of a laser processing system according to Comparative Example.

<Contents>
1. Overview
2. Laser processing system according to Comparative Example
2.1 Configuration of laser processing system
2.2 Operation of laser processing system
2.3 Problems
3. Laser processing system according to first embodiment
3.1 Configuration
3.2 Operation
3.3 Effects
3.4 Variation
4. Laser processing system according to second embodiment
4.1 Configuration
4.2 Operation
4.3 Effects
5. Laser processing system according to third embodiment
5.1 Configuration
5.2 Operation
5.3 Effects
5.4 Variation
6. Laser processing system according to fourth embodiment
6.1 Configuration
6.2 Operation
6.3 Effects
7. Specific example of wavelength tunable laser apparatus
7.1 Configuration
7.2 Operation
7.3 Variation
8. Variation of laser processing apparatus
8.1 Configuration
8.2 Operation
9. Reflective optical system
9.1 Reflective light collection optical system
9.2 Reflective transfer optical system Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Overview

The present disclosure relates to a laser processing system that irradiates a workpiece with laser light to perform laser processing on the workpiece.

2. Laser Processing System According to Comparative Example 2.1 Configuration of Laser Processing System FIG. 1 schematically shows the configuration of a laser processing system according to Comparative Example. A laser processing system 2 includes a laser apparatus 3 and a laser processing apparatus 4. The laser apparatus 3 and the laser processing apparatus 4 are connected to each other via an optical path tube 5.

The laser apparatus 3 includes a solid-state laser apparatus 10, a monitor module 11, a shutter 12, and a laser controller 13. The laser apparatus 3, which is a laser apparatus that outputs pulsed laser light, is a wavelength tunable laser apparatus capable of changing the wavelength of the pulsed laser light.

The solid-state laser apparatus 10 includes a wavelength tunable titanium-sapphire oscillator 16, a titanium-sapphire amplifier 17, a wavelength conversion system 18, and a pumping laser apparatus 19. The wavelength tunable titanium-sapphire oscillator 16 includes an optical resonator formed of a titanium-sapphire crystal, a wavelength selection element, and an output coupling mirror. Pulsed laser light outputted from the pumping laser apparatus 19 excites the titanium-sapphire crystal in the form of pulses. Seed light outputted from the wavelength tunable titanium-sapphire oscillator 16 undergoes wavelength selection performed by the wavelength selection element in the optical resonator and is outputted as pulsed laser light that belongs to a range from 650 to 1100 nm. A specific example of the wavelength selection element is, for example, a grating.

The titanium-sapphire amplifier 17 includes a titanium-sapphire crystal and an optical system for multiple-path amplification. In synchronization with the incidence of the seed light on the titanium-sapphire crystal, the pulsed laser light outputted from the pumping laser apparatus 19 excites the titanium-sapphire crystal in the form of pulses. As a result, the titanium-sapphire amplifier 17 amplifies the seed light, which is pulsed laser light, and outputs the amplified pulsed laser light.

The pulse width of the amplified pulsed laser light depends on the pulse width of the excitation pulsed laser light outputted from the pumping laser apparatus 19. For example, the pulse width of the excitation pulsed laser light is so set as to be equal to a pulse width that allows one photon to be absorbed by the material of a workpiece 41. Specifically, the pulse width of the excitation pulsed laser light is so set that the pulse width of the pulsed laser light with which the workpiece 41 is irradiated is greater than or equal to 1 ns but smaller than or equal to 100 ns.

The pumping laser apparatus 19 is, for example, a laser apparatus that outputs, as the excitation light, second harmonic pulsed laser light from a YLF laser. The pumping laser apparatus 19 inputs the excitation light to the wavelength tunable titanium-sapphire oscillator 16 and the titanium-sapphire amplifier 17.

The wavelength conversion system 18 converts the wavelength of the seed light amplified by the titanium-sapphire amplifier 17. In the wavelength conversion system 18, the seed light is selectively converted into any of second harmonic light (325 to 550 nm), third harmonic light (217 to 367 nm), and fourth harmonic light (162 to 275 nm). The solid-state laser apparatus 10 outputs the pulsed laser light having the wavelength converted by the wavelength conversion system 18.

The monitor module 11 is disposed in the optical path of the pulsed laser light outputted from the solid-state laser apparatus 10. The monitor module 11 includes, for example, a beam splitter 11a, an optical sensor 11b, and a wavelength monitor 11c.

The beam splitter 11a transmits the pulsed laser light outputted from the solid-state laser apparatus 10 at high transmittance toward the shutter 12 and reflects part of the pulsed laser light toward a beam splitter 11d. The beam splitter 11d is disposed between the beam splitter 11a and the optical sensor 11b on the optical path of the light reflected off the beam splitter 11a. The beam splitter 11d reflects part of the light reflected off the beam splitter 11a and transmits the remainder. The light having passed through the beam splitter 11d is incident on the optical sensor 11b, and the light reflected off the beam splitter 11d is incident on the wavelength monitor 11c.

The optical sensor 11b detects pulse energy of the pulsed laser light incident on the light receiving surface thereof and outputs data on the detected pulse energy to the laser controller 13.

The wavelength monitor 11c is, for example, a spectrometer that includes a wavelength dispersive element, such as a grating, detects a diffraction image from the wavelength dispersive element with an image sensor, and detects the wavelength of the pulsed laser light based on the detected diffraction image.

The laser controller 13 transmits and receives a variety of signals to and from a laser processing controller 32 of the laser processing apparatus 4. For example, the laser controller 13 receives a light emission trigger Tr, a target pulse energy Et, a target wavelength λt, and other data from the laser processing controller 32.

The laser controller 13 receives the data on the pulse energy from the optical sensor 11b of the monitor module 11. The laser controller 13 controls the pulse energy of the excitation pulsed laser light outputted from the pumping laser apparatus 19 based on the received data on the pulse energy. The pumping laser apparatus 19 outputs the excitation pulsed laser light to the wavelength tunable titanium-sapphire oscillator 16 and the titanium-sapphire amplifier 17. Controlling the pulse energy of the excitation pulsed laser light allows control of the pulse energy of the pulsed laser light outputted from the wavelength tunable titanium-sapphire oscillator 16 and the titanium-sapphire amplifier 17.

The shutter 12 is disposed in the optical path of the pulsed laser light having passed through the beam splitter 11a of the monitor module 11. After the laser oscillation starts, the laser controller 13 closes the shutter 12 until the difference between the pulse energy received from the monitor module 11 and the target pulse energy Et falls within an acceptable range. The laser controller 13 opens the shutter 12 when the difference between the pulse energy received from the monitor module 11 and the target pulse energy Et falls within the acceptable range. The laser controller 13 transmits a laser processing permission signal representing that the pulsed laser light emission trigger Tr is receivable to the laser processing controller 32 in synchronization with an open signal for opening the shutter 12.

The laser processing apparatus 4 includes the laser processing controller 32, a table 33, an XYZ stage 34, an optical system 36, an enclosure 37, and a frame 38. The optical system 36 is disposed in the enclosure 37. The enclosure 37 and the XYZ stage 34 are fixed to the frame 38.

The table 33 supports the workpiece 41. The workpiece 41 is a processing target on which laser processing is performed when irradiated with the pulsed laser light. The workpiece 41 is, for example, a crystal material. The XYZ stage 34 supports the table 33. The XYZ stage 34 is movable in an X-axis direction, a Y-axis direction, and a Z-axis direction and can adjust the position of the table 33 to adjust the position of the workpiece 41. The XYZ stage 34 adjusts the position of the workpiece 41 in such a way that the workpiece 41 is irradiated with the pulsed laser light having exited out of the optical system 36.

The optical system 36 includes, for example, high-reflectance mirrors 36a to 36c, a light collection lens 36d as a light collection optical system, and an attenuator 52. The high-reflectance mirrors 36a to 36c, the light collection lens 36d, and the attenuator 52 are fixed to respective holders, which are not shown, and disposed in predetermined positions in the enclosure 37.

The high-reflectance mirrors 36a to 36c reflect the pulsed laser light at high reflectance. The high-reflectance mirror 36a reflects the pulsed laser light inputted from the laser apparatus 3 toward the high-reflectance mirror 36b, and the high-reflectance mirror 36b reflects the pulsed laser light toward the high-reflectance mirror 36c. The high-reflectance mirror 36c reflects the pulsed laser light toward the light collection lens 36d. The high-reflectance mirrors 36a to 36c are each, for example, so configured that a surface of a transparent substrate made of synthetic quartz or calcium fluoride is coated with a reflection film that reflects the pulsed laser light at high reflectance.

The attenuator 52 is disposed in the enclosure 37 in the optical path between the high-reflectance mirrors 36a and 36b. The attenuator 52 includes, for example, two partial reflection mirrors 52a and 52b and rotary stages 52c and 52d, which rotate the partial reflection mirrors 52a and 52b. The two partial reflection mirrors 52a and 52b are each an optical element that provides transmittance T that changes in accordance with the angle of incidence of the pulsed laser light. The rotary stages 52c and 52d adjust the inclination angles of the partial reflection mirrors 52a and 52b in such a way that the angles of incidence of the pulsed laser light incident on the partial reflection mirrors 52a and 52b coincide with each other and desired transmittance T is achieved.

The transmittance T provided by the attenuator 52 is controlled based on a control signal from the laser processing controller 32. The attenuator 52 adjusts the pulse energy of the pulsed laser light incident thereon to desired pulse energy based on the control of the transmittance T.

The light collection lens 36d is so disposed as to collect the pulsed laser light incident thereon onto the surface of the workpiece 41 via a window 42. The light collection lens 36d is, for example, a chromatic aberration correction lens that is the combination of lenses made of different materials, such as synthetic quartz and $CaF_2$ crystal. The chromatic aberration correction range is set in accordance, for example, with the wavelength range of the pulsed laser light outputted from the laser apparatus 3, which is a wavelength tunable laser apparatus.

The window 42 is disposed in the optical path between the light collection lens 36d and the workpiece 41 and fixed to an opening formed in the enclosure 37 with the portion between the opening and the window 42 sealed with an O ring (not shown).

A nitrogen ($N_2$) gas, which is an inert gas, keeps flowing in the enclosure 37 during the operation of the laser processing system 2. The enclosure 37 is provided with an intake port (not shown) through which the nitrogen gas is taken into the enclosure 37 and a discharge port (not shown) through which the nitrogen gas is discharged out of the enclosure 37. The intake port and the discharge port are configured to be connectable to an intake tube and a discharge tube that are not shown, respectively. The intake port and the discharge port to which the intake tube and the discharge tube are connected are sealed with O rings (not shown) that prevent outside air from entering the enclosure 37. A nitrogen gas supply source (not shown) is connected to the intake port.

The nitrogen gas flows also through the optical path tube 5, and the portion where the optical path tube 5 and the laser processing apparatus 4 are connected to each other and the portion where the optical path tube 5 and the laser apparatus 3 are connected to each other are also sealed with O rings.

The reason why the nitrogen gas is caused to flow in the enclosure 37 comes from the fact that light that belongs to the ultraviolet region is partially absorbed by the air, and the flowing nitrogen gas discharges the air from the enclosure 37. Therefore, in a case where the wavelength of the pulsed laser light does not belong to the ultraviolet region, no nitrogen gas needs to flow in the enclosure 37. The window 42, which prevents the air from entering the enclosure 37, is disposed as part of the enclosure 37. In the case where the wavelength of the pulsed laser light does not belong to the ultraviolet region, however, no window 42 may be disposed.

2.2 Operation of Laser Processing System

Figure 2:
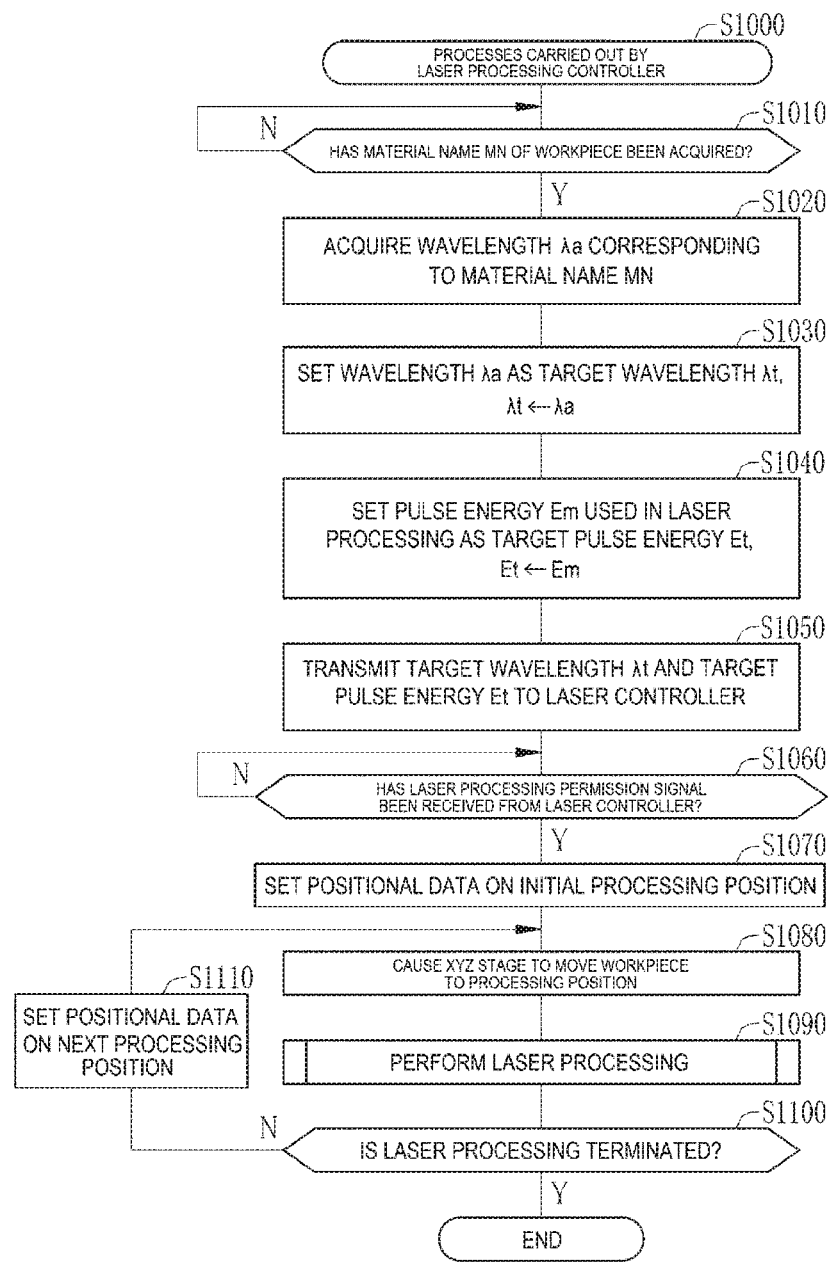
FIG. 2 is a flowchart showing the procedure of processes carried out by a laser processing controller in Comparative Example.

The operation of the laser processing system 2 will be described with reference to the flowcharts shown in FIGS. 2 to 4. S1000 shown in FIG. 2 is the flowchart showing processes carried out by the laser processing controller 32 of the laser processing apparatus 4, and S2000 shown in FIG. 4 is the flowchart showing processes carried out by the laser controller 13 of the laser apparatus 3.

To perform the laser processing, the workpiece 41 is first placed on the table 33 on the XYZ stage 34. The laser processing controller 32 then in S1010 waits for input of a material name MN of the placed workpiece 41, as shown in FIG. 2. The input of the material name MN is performed, for example, through an operator's manual input of the material name MN via an operation panel or reception of data on the material name MN transmitted from an external apparatus. The external apparatus is, for example, an operation terminal, such as a factory management system in a factory where the laser processing system 2 is installed.

The laser processing controller 32, when it acquires the material name MN of the workpiece 41 (Y in S1010), acquires a wavelength $\lambda a$ corresponding to the maternal name MN in S1020. Specifically, the laser processing controller 32 reads the wavelength $\lambda a$ corresponding to the maternal name MN from a first wavelength selection table 56 shown in FIG. 5. The first wavelength selection table 56 is tabulated data that records the wavelength $\lambda a$ set in advance for each of a variety of materials of the workpiece 41, such as diamond and silicon carbide (SiC).

The first wavelength selection table 56 is stored, for example, in an internal memory of the laser processing controller 32. A storage section that stores the first wavelength selection table 56 is not limited to the internal memory of the laser processing controller 32 and may instead be a data storage provided in the laser processing system 2. The storage section may still instead be a computer or any other external storage device communicably connected to the laser processing system 2.

The wavelength $\lambda a$ is a reference wavelength corresponding to photon absorption according to the material of the workpiece 41. More specifically, the reference wavelength $\lambda a$ is a wavelength assumed to be the absorption wavelength at which photon absorption occurs in the material. The photon absorption is the process in which a material absorbs photons and the photons excite electrons. In a case where the material is a crystal material, the absorption wavelength is determined in accordance with the bandgap of the crystal material. Specifically, since the greater the bandgap, the greater the energy required to cause the photon absorption to occur, and hence the shorter the one-photon absorption wavelength. The reference wavelength $\lambda a$, which theoretically maximizes the processing speed, is an optimum wavelength as the wavelength used in the laser processing. The processing speed is a processed depth Depth per pulse of the pulsed laser light with which the material is irradiated and is defined by the following Expression (1):

$$PS = \text{Depth}/Nm \qquad (1)$$

where PS represents the processing speed, and Nm represents the number of pulses.

The first wavelength selection table 56 is a table that records data on the one-photon absorption wavelength as the reference wavelength $\lambda a$ for each material name MN. In FIG. 5, the first wavelength selection table 56 further records data on the bandgap in addition to the one-photon absorption wavelength. In FIG. 5, the reason why the bandgap data is recorded is to show the correlation with the one-photon absorption wavelength, and the first wavelength selection table 56 may not record the bandgap data. The unit of the bandgap is [eV], and the unit of the one-photon absorption wavelength is [nm].

The laser processing controller 32 sets the acquired reference wavelength λa as the target wavelength λt in S1030 and sets pulse energy Em used in the laser processing as the target pulse energy Et in S1040. The laser processing controller 32 then transmits data on the set target wavelength λt and target pulse energy Et to the laser controller 13 in S1050.

In S1060, the laser processing controller 32 waits for reception of the laser processing permission signal from the laser controller 13 until the preparation operation of the laser apparatus 3 is completed. The laser processing permission signal is a signal representing that the laser apparatus 3 has completed the preparation for reception of the light emission trigger Tr and transmitted by the laser controller 13 to the laser processing controller 32.

The laser processing controller 32, when it receives the laser processing permission signal from the laser controller 13 (Y in S1060), sets positional data on an initial processing position in the XYZ stage 34 in S1070. The laser processing controller 32 controls the XYZ stage 34 to move the workpiece 41 to the initial laser processing position in S1080. Specifically, the workpiece 41 is positioned in the plane XY and in the Z-axis direction. The position in the Z-axis direction to which the workpiece 41 is moved is the position where the pulsed laser light having exited out of the light collection lens 36d is collected into a spot having a desired radiation diameter on the surface of the workpiece 41. The radiation diameter of the pulsed laser light is the diameter of the pulsed laser beam radiated onto the surface of the workpiece 41.

Once the workpiece 41 is positioned, the laser processing controller 32 transmits the light emission trigger Tr to the laser controller 13 to perform the laser processing on the workpiece 41 in S1090. The laser apparatus 3 outputs the pulsed laser light in synchronization with the light emission trigger Tr. The pulsed laser light enters the laser processing apparatus 4.

The pulsed laser light having entered the laser processing apparatus 4 travels via the high-reflectance mirror 36a, the attenuator 52, and the high-reflectance mirrors 36b and 36c and enters the light collection lens 36d. The pulse energy of the pulsed laser light is adjusted when the pulsed laser light passes through the attenuator 52. The pulsed laser light having passed through the light collection lens 36d is collected on and radiated onto the surface of the workpiece 41 via the window 42. The laser radiation allows laser processing to be performed on the workpiece 41.

After the laser processing in the initial processing position is completed, and in a case where there is a next processing position (N in S1100), the laser processing controller 32 sets positional data on the next processing position in the XYZ stage 34 in S1110. The XYZ stage 34 then moves the workpiece 41 to the next processing position in S1080. The laser processing is performed on the workpiece 41 in the next processing position in S1090. In a case where there is no next processing position, the laser processing is terminated (Y in S1100). The procedure described above is repeated until the laser processing in all processing positions is completed.

Figure 3:
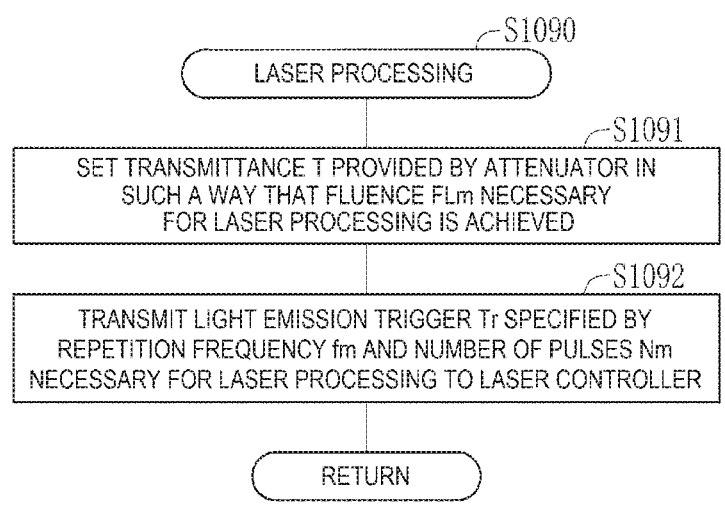
FIG. 3 is a flowchart showing the procedure of processes carried out in laser processing in Comparative Example.
Figure 4:
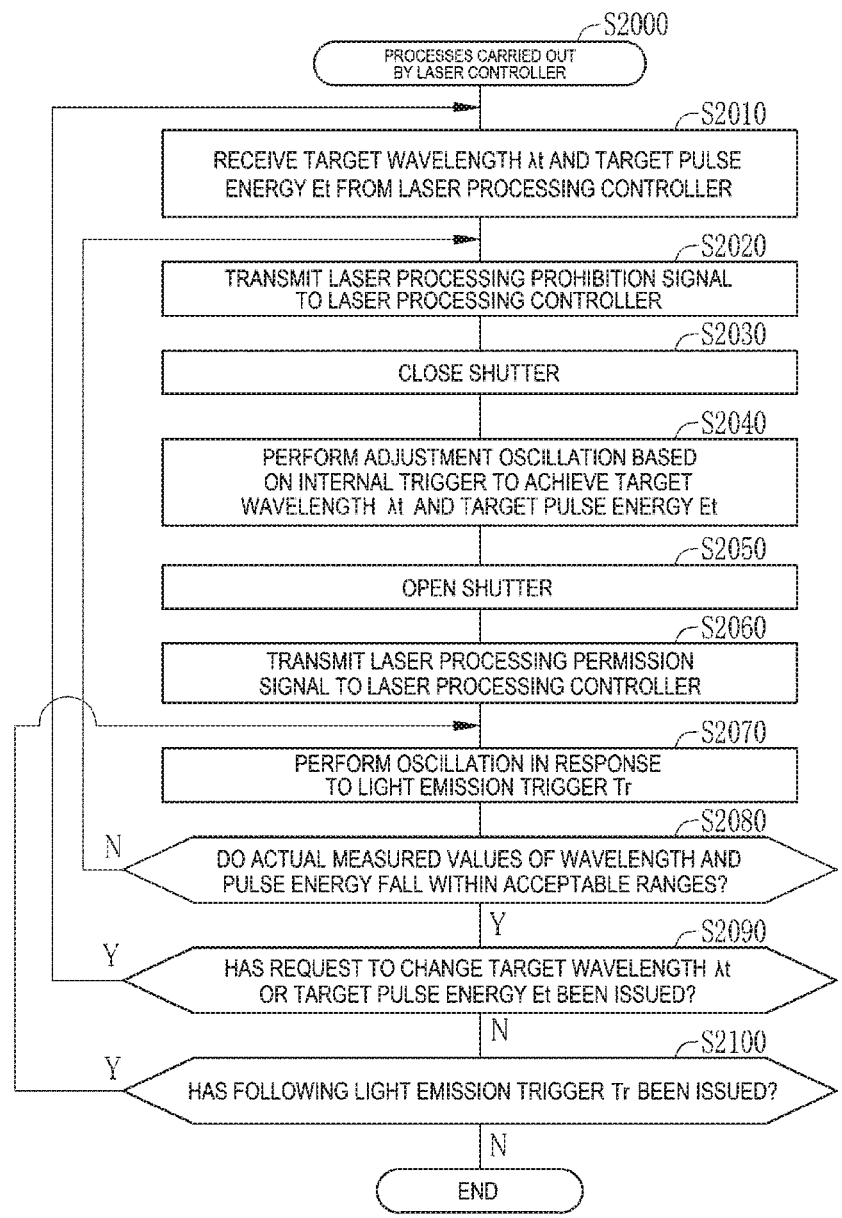
FIG. 4 is a flowchart showing the procedure of processes carried out by a laser controller in Comparative Example.

The laser processing in S1090 is performed in accordance with the flowchart shown in FIG. 3. The laser processing controller 32 controls the pulse energy in such a way that the pulsed laser light radiated onto the surface of the workpiece 41 has a desired fluence FLm necessary for the laser processing.

The fluence FL is the energy density of the pulsed laser light on the surface of the workpiece 41 on which the pulsed laser light is radiated and is defined by the following Expression (2) in a case where optical loss caused by the optical system 36 is negligible.

$$FL=Et/S[mJ/cm^2] \quad (2)$$

where S represents the radiation area, and $S=\pi(D/2)^2$ [cm$^2$], where D represents the radiation diameter.

The fluence FLm necessary for the laser processing is then defined by the following Expression (3):

$$FLm=Em/Sm[mJ/cm^2] \quad (3)$$

where Sm represents the radiation area in the laser processing, and Em represents the target pulse energy Et necessary for the laser processing.

The laser processing controller 32 not only controls the fluence FL of the pulsed laser light based on the target pulsed energy Et but controls the transmittance T provided by the attenuator 52 to control the fluence FL of the pulsed laser light. The control of the fluence FL through the transmittance T provided by the attenuator 52 is effective in a case where the laser apparatus 3 cannot greatly change the pulse energy.

The transmittance T provided by the attenuator 52 is determined based on the following Expression (4) in a case where the optical system 36 produces no optical loss:

$$T=\pi(D/2)^2(FL/Et) \quad (4)$$

where FL represents the fluence, Et represents the target pulse energy, and D represents the radiation diameter of the pulsed laser light on the surface of the workpiece 41. To determine the transmittance T for obtaining the fluence FLm necessary for the laser processing, Expression (4) is written to $T=\pi(D/2)^2(FLm/Em)$.

Having set the transmittance T in S1091, the laser processing controller 32 transmits the light emission trigger Tr specified by a predetermined repetition frequency fm and a predetermined number of pulses Nm necessary for the laser processing to the laser controller 13 in S1092. Laser radiation according to the light emission trigger Tr is thus performed.

Having received the data on the target wavelength λt and the target pulse energy Et from the laser processing controller 32 in S2010, the laser controller 13 transmits a laser processing prohibition signal to the laser processing controller 32 in S2020, as shown in FIG. 4. The laser processing prohibition signal is a signal that prohibits the laser processing controller 32 from transmitting the light emission trigger Tr. Having transmitted the laser processing prohibition signal, the laser controller 13 closes the shutter 12 in S2030. The laser controller 13 thus starts the preparation operation for outputting the pulsed laser light according to the target wavelength λt and the target pulse energy Et.

The laser controller 13 causes the solid-state laser apparatus 10 to perform in S2040 adjustment oscillation at the predetermined repetition frequency based on an internal light emission trigger that is not shown in such a way that the pulsed laser light outputted from the solid-state laser apparatus 10 has the target wavelength λt and the target pulse energy Et.

The monitor module 11 samples the pulsed laser light outputted from the solid-state laser apparatus 10 to measure an actual measured value of the pulse energy and an actual measured value of the wavelength. The laser controller 13 controls the pulse energy of the excitation light from the pumping laser apparatus 19 in such a way that the difference $\Delta E$ between the actual measured value of the pulse energy and the target pulse energy Et approaches 0. The laser controller 13 further controls a wavelength selected by the wavelength selection element in the wavelength tunable titanium-sapphire oscillator 16 in such a way that the difference $\Delta X$ between the actual measured value of the wavelength and the target wavelength $\lambda$t approaches 0 to control the output wavelength of the light outputted from the wavelength tunable titanium-sapphire oscillator 16. Specifically, the laser controller 13 can control the pulse energy of the excitation light in such a way that $\Delta E$ falls within an acceptable range and control the wavelength selected by the wavelength selection element in the wavelength tunable titanium-sapphire oscillator 16 in such a way that $\Delta\lambda$ falls within an acceptable range to control the pulse energy and the wavelength of the pulsed laser light.

When $\Delta E$ and $\Delta\lambda$ each falls within the acceptable range, the laser controller 13 stops the adjustment oscillation. The laser controller 13 then opens the shutter 12 in S2050 and transmits the laser processing permission signal, which represents that the laser controller 13 has completed the preparation for reception of the light emission trigger Tr, to the laser processing controller 32 in S2060.

Having transmitted the laser processing permission signal, the laser controller 13 receives the light emission trigger Tr. In S2070, the laser controller 13 causes the solid-state laser apparatus 10 to perform laser oscillation based on the light emission trigger Tr from the laser processing controller 32. The laser controller 13 performs feedback control based on the actual measured values from the monitor module 11 during the laser oscillation in response to the light emission trigger Tr. In a case where the actual measured values of the pulse energy and the wavelength do not fall within the acceptable ranges (N in S2080), the laser controller 13 returns to S2020 and carries out steps S2020 to S2070. The feedback control is thus so performed that the actual measured values of the pulse energy and the wavelength fall within the acceptable ranges.

Further, the laser controller 13 accepts a request to change the target wavelength $\lambda$t or the target pulse energy Et from the laser processing controller 32 during the laser oscillation (S2090). In a case where the request to change the target wavelength $\lambda$t or the target pulse energy Et has been issued (Y in S2090), the laser controller 13 returns to S2010 and repeats the steps described above. In a case where the laser processing controller 32 has issued the following light emission trigger Tr (Y in S2100), the laser controller 13 keeps the laser oscillation. The laser controller 13 repeats the steps described above until the laser processing controller 32 stops transmitting the following light emission trigger Tr (N in S2100).

2.3 Problems

The laser processing system 2 according to Comparative Example performs the laser processing by using the pulsed laser light having the reference wavelength $\lambda$a corresponding to the bandgap of the material of the workpiece 41. The reference wavelength $\lambda$a is believed in theory to be an optimum wavelength at which the processing speed PS is maximized, as described above. In the laser processing, however, setting the wavelength of the pulsed laser light to be the reference wavelength $\lambda$a to improve the processing speed PS does not in practice improve the processing speed PS in some cases. A conceivable reason for this is that the theoretical bandgap of the material of the workpiece 41 slightly differs from the bandgap of the actually processed material due, for example, to impurities.

3. Laser Processing System According to First Embodiment 3.1 Configuration

Figure 6:
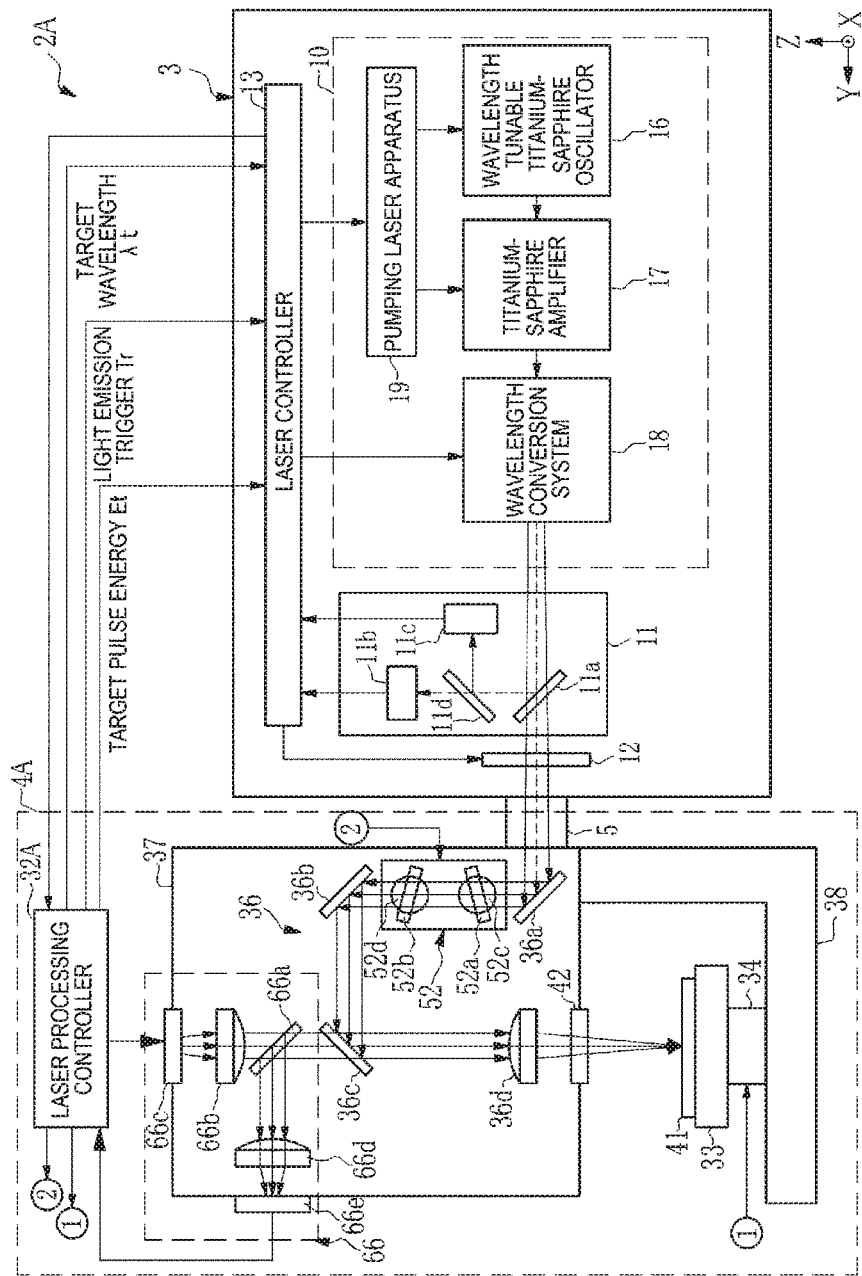
FIG. 6 schematically shows the configuration of a laser processing system according to a first embodiment.
Figure 7:
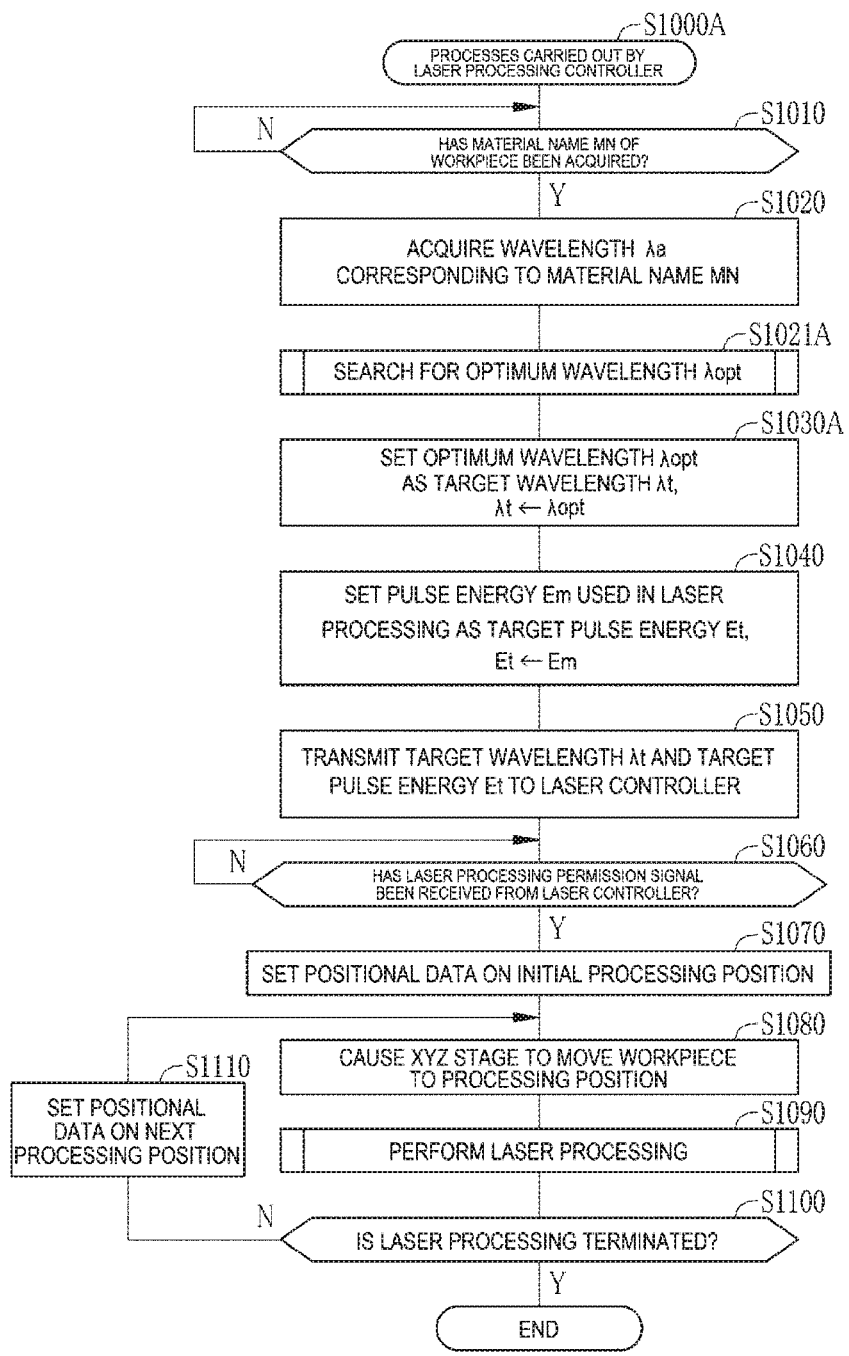
FIG. 7 is a flowchart showing the procedure of processes carried out by a laser processing controller in the first embodiment.

FIG. 6 schematically shows the configuration of a laser processing system 2A according to a first embodiment. The laser processing system 2A according to the first embodiment includes a laser processing apparatus 4A in place of the laser processing apparatus 4 of the laser processing system 2 according to Comparative Example shown in FIG. 1. A laser apparatus 3 in the first embodiment is the same as the laser apparatus 3 in Comparative Example. The following description of the first embodiment will be primarily made of the differences from the laser processing system 2 according to Comparative Example.

The laser processing system 2A has the function of searching for an optimum wavelength $\lambda$opt used in the laser processing to be performed on the workpiece 41. The laser processing apparatus 4A in the first embodiment includes a laser processing controller 32A in place of the laser processing controller 32 in Comparative Example. An internal memory of the laser processing controller 32A stores the first wavelength selection table 56, as in the laser processing controller 32.

The laser processing controller 32A carries out the process of searching for the optimum wavelength $\lambda$opt. The optimum wavelength $\lambda$opt is searched for by performing preprocessing before final laser processing is performed on the workpiece 41 to assess the processed state achieved by the preprocessing. The laser processing controller 32A controls the laser apparatus 3 via the laser controller 13 to perform the preprocessing. The laser processing apparatus 4A in the first embodiment includes an observation apparatus 66 in addition to the laser processing apparatus 4 in Comparative Example.

The observation apparatus 66 captures an image of the surface of the workpiece 41 on which the preprocessing is performed at a plurality of wavelength and records an observed image showing the processed state achieved by the preprocessing on a wavelength basis. The observation apparatus 66 records an observed image to measure as the processed state whether or not the workpiece 41 has been at least processed. In the present example, the observation apparatus 66 functions as a processed state measurer. The observation apparatus 66 includes a half-silvered mirror 66a, a collimator lens 66b, an illumination light source 66c, an image forming lens 66d, and an image sensor 66e. The high-reflectance mirror 36c is replaced with a mirror that reflects the pulsed laser light at high reflectance and transmits visible light emitted from the illumination light source 66c.

The illumination light source 66c emits illumination light with which the surface of the workpiece 41 is illuminated. The illumination light is collimated by the collimator lens 66b. The half-silvered mirror 66a, the high-reflectance mirror 36c, and the light collection lens 36d are disposed along the optical path of the collimated illumination light. The workpiece 41 is thus irradiated with the illumination light.

The half-silvered mirror 66a is so disposed as to reflect the light having been reflected off the surface of the workpiece 41 on the table 33 and having passed through the light collection lens 36d and the high-reflectance mirror 36c toward the image forming lens 66d. The image forming lens 66d is so disposed as to allow observation of an image of the surface of the workpiece 41 located in the processing position where the laser processing is performed. Specifically, the image forming lens 66d is so disposed as to focus the light having been reflected off the surface of the workpiece 41 and having entered the image forming lens 66d on the light receiving surface of the image sensor 66e.

3.2 Operation

The operation of the laser processing system 2A will be described with reference to FIGS. 7 to 15. The flowchart of processes carried out by the laser processing controller 32A shown in S1000A in FIG. 7 differs from the flowchart of the processes in S1000 in Comparative Example shown in FIG. 2 in two points. One difference is that S1021A as the process of searching for the optimum wavelength λopt is added immediately after S1020.

The other difference is that S1030 in Comparative Example shown in FIG. 2 is changed to S1030A. Specifically, in S1030 in Comparative Example, the reference wavelength λa itself is set as the target wavelength λt. In contrast, in S1030A in the first embodiment, the optimum wavelength λopt determined in the search process is set as the target wavelength λt. Therefore, in the first embodiment, the final laser processing is performed by using the optimum wavelength λopt. The other steps are the same as those in Comparative Example shown in FIG. 2.

Figure 8:
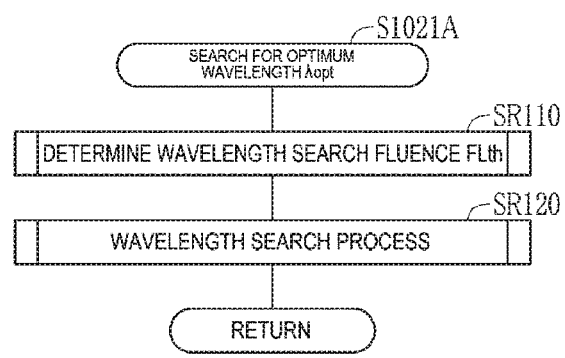
FIG. 8 is a flowchart showing the procedure of processes of searching for an optimum wavelength in the first embodiment.

The search for the optimum wavelength λopt in S1021A includes SR110 as the process of determining a wavelength search fluence FLth and SR120 as a wavelength search process of searching for the optimum wavelength λopt by using the determined wavelength search fluence FLth, as shown in FIG. 8. The SR110 as the process of determining the wavelength search fluence FLth and SR120 as the wavelength search process are both carried out by performing preprocessing on the workpiece 41.

To distinguish the preprocessing in the fluence determination process and the preprocessing in the wavelength search process, in the first embodiment, preprocessing for the fluence determination performed in the process of determining the wavelength search fluence FLth is called first preprocessing, and preprocessing for the wavelength search performed by using the wavelength search fluence FLth is called second preprocessing The laser processing controller 32A functions as a wavelength search fluence determination section that determines the wavelength search fluence FLth used in the second preprocessing.

Figure 9:
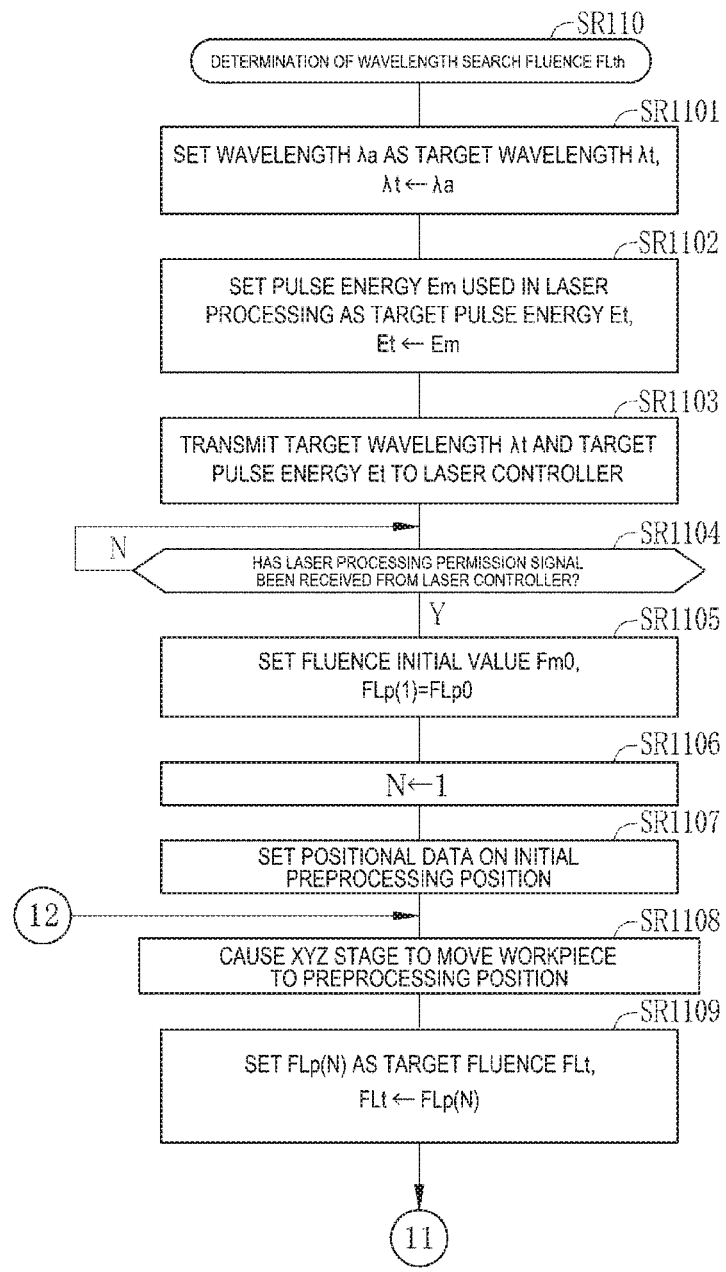
FIG. 9 is the first half of the flowchart showing the procedure of processes of determining a wavelength search fluence.
Figure 10:
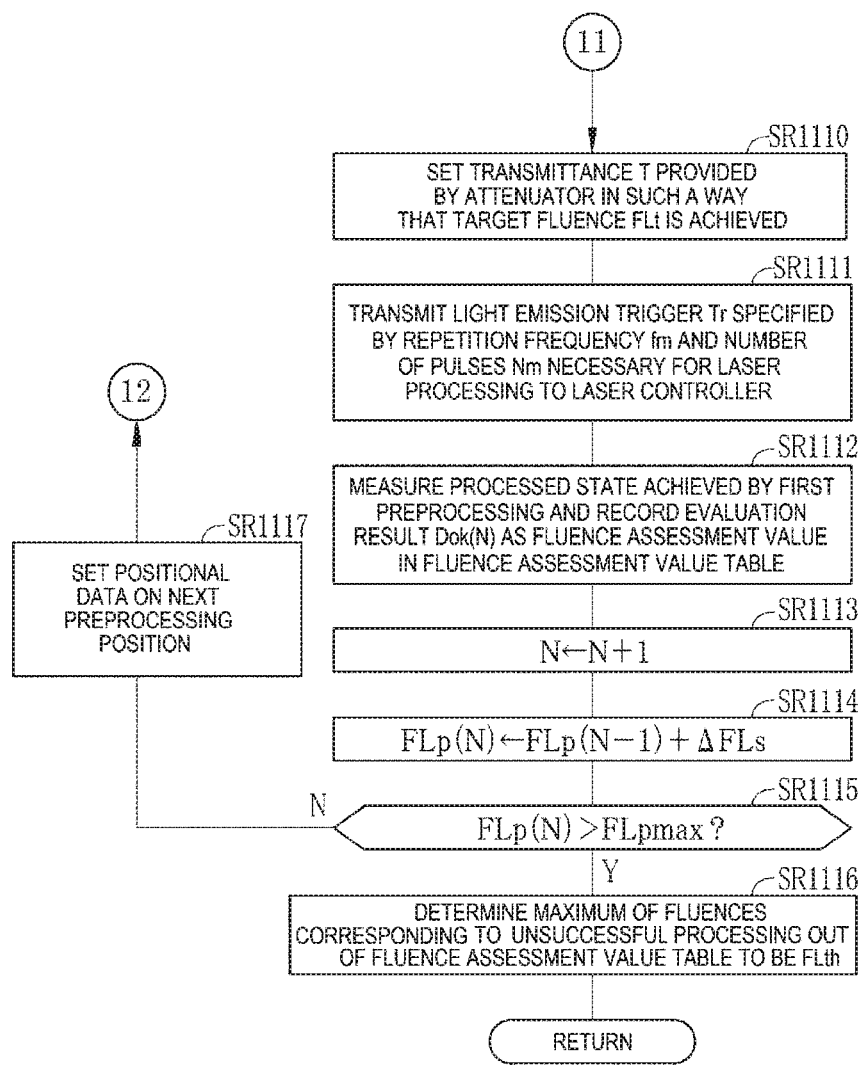
FIG. 10 is the second half of the flowchart showing the procedure of the processes of determining the wavelength search fluence.

FIGS. 9 and 10 are flowcharts of the process of determining the wavelength search fluence FLth in the present example (SR110). In SR110, the laser processing controller 32A performs the first preprocessing by changing the fluence to a plurality of fluences with the target wavelength λt fixed at the reference wavelength λa.

The laser processing controller 32A sets the reference wavelength λa as the target wavelength λt in SR1101 shown in FIG. 9 and sets the pulse energy Em used in the laser processing as the target pulse energy Et in SR1102. The laser processing controller 32A then transmits data on the set target wavelength λt and target pulse energy Et to the laser controller 13 in SR1103.

The laser processing controller 32A waits for reception of the laser processing permission signal in SR1104. In a case where the laser processing controller 32A receives the laser processing permission signal from the laser controller 13 (Y in SR1104), the laser processing controller 32A initializes in SR1105 the value of a fluence FLp(N) used in the first preprocessing. Specifically, an initial value Fm0 is set as a first fluence FLp(1) used in the first preprocessing in SR1105. Thereafter, in SR1106, the number N of the fluence FLp(N) to be used is set at "1", and FLp(1) is selected.

The laser processing controller 32A sets positional data on an initial preprocessing position in SR1107. The laser processing controller 32A causes the XYZ stage 34 to move the workpiece 41 to the initial preprocessing position based on the set positional data in SR1108. On the surface of the workpiece 41, a region where the preprocessing is performed is a region of the workpiece 41 other than the portion where the final processing is performed, for example, a peripheral region of the workpiece 41. The preprocessing position is the position where the region coincides with the position irradiated with the pulsed laser light.

The laser processing controller 32A sets the fluence FLp(N) as the target fluence FLt in SR1109. In a case where the number N of the fluence FLp(N) has been set at "1", an initial value FLp0, which is the first fluence FLp(1), is set as the target fluence FLt. In SR1110, the laser processing controller 32A sets the transmittance T provided by the attenuator 52 in such a way that the target fluence FLt is achieved, as shown in FIG. 10. In SR1111, the laser processing controller 32A transmits the light emission trigger Tr specified by the repetition frequency fm and the number of pulses Nm necessary for the laser processing to the laser controller 13. The laser apparatus 3 then outputs the pulsed laser light to perform the first preprocessing in the preprocessing position on the workpiece 41.

When the first preprocessing using the fluence FLp(N) is performed, the observation apparatus 66 measures the processed state achieved by the first preprocessing in SR1112. The observation apparatus 66 captures an image of the surface of the workpiece 41 with the image sensor 66e and records an observed image showing the processed state achieved by the first preprocessing using the fluence FLp(N). The observed image is stored in a data storage, such as a memory that is not shown. The laser processing controller 32A assesses the processed state achieved by the first preprocessing using the fluence FLp(N) based on the recorded observed image.

Specifically, the laser processing controller 32A evaluates whether or not processing has been performed on the preprocessing position on the workpiece 41 in the first preprocessing using the fluence FLp(N). For example, in a case where the first preprocessing forms a round hole in the surface of the workpiece 41, the laser processing controller 32A determines that the processing has been performed if the hole has been formed, whereas determining that no processing has been performed if no hole has been formed. The laser processing controller 32A then records an evaluation result Dok(N) as a fluence assessment value in a fluence assessment value table 67 shown in FIG. 11. In a case where the number N is "1", an evaluation result Dok(1), which is the result of the evaluation of the first preprocessing using the first fluence FLp(1), is recorded as the fluence assessment value in the fluence assessment value table 67.

When the fluence assessment value has been recorded for one fluence FLp(N), the laser processing controller 32A increments the number N by 1 in SR1113. In SR1114, the laser processing controller 32A sets the value of the fluence FLp(N−1) to which ΔFLs is added as the value of fluence FLp(N). For example, when the fluence assessment value of FLp(1) has been recorded, N is incremented by 1. When the first preprocessing performed on the initial preprocessing position is completed, N=1, so that N is incremented by 1, resulting in N=2. Since N=2, N−1=2−1=1 in SR1114. The value obtained by adding ΔFLs to the value of FLp(1) is set as the value of the fluence FLp(2). Since the value of FLp(1) is the initial value FLp0, FLp(2)=FLp0+ΔFLs.

In a case where the value of FLp(N) set in SR1114 is smaller than or equal to FLpmax (N in SR1115), the laser processing controller 32A sets positional data on a next preprocessing position (SR1117). The laser processing controller 32A then controls the XYZ stage 34 to cause it to move the workpiece 41 to the next preprocessing position in SR1108. In the next preprocessing position, steps SR1109 to SR1114 are carried out. In a case where FLp(N)=FLp(2), the laser processing controller 32A records an evaluation result Dok(2), which is the result of the evaluation of FLp(2), as the fluence assessment value in the fluence assessment value table 67 in SR1112. The processes described above are repeated until the value of FLp(N) exceeds FLpmax (Y in SR1115).

The fluence assessment value table 67 is a table that records the values of a plurality of fluences FLp(N) used in the first preprocessing and the evaluation results Dok(N), which are the fluence assessment values corresponding to the fluences FLp(N), with the fluences FLp(N) and the evaluation results Dok(N) associated with each other, as shown in FIG. 11. In the case where the first preprocessing forms a hole in the surface of the workpiece 41, and the value of the fluence FLp(N) is too small, no hole is formed, and increasing the value of the fluence FLp(N) allows a hole to be formed when the fluence FLp(N) reaches a certain value. In the case where no hole is formed, the laser processing controller 32A determines that no processing has been performed and records "unsuccessful processing" representing that no processing has been performed as the evaluation result Dok(N). On the other hand, in the case where the hole is formed, the laser processing controller 32A determines that the processing has been performed and records "successful processing" representing that the processing has been performed as the evaluation result Dok(N).

The fluence assessment value table 67 records the evaluation results Dok(N) obtained when the value of the fluence FLp(N) is incremented by ΔFLp in the first preprocessing as the fluence assessment value.

In SR1116 in FIG. 10, the laser processing controller 32A refers to the fluence assessment value table 67 to determine the maximum of the fluences FLp(N) each having the fluence assessment value of "unsuccessful processing" as the wavelength search fluence FLth. The maximum of the fluences FLp(N) each having the fluence assessment value of "unsuccessful processing" is in other words the maximum of the fluences FLp(N) immediately before the processing is performed on the workpiece 41. In the example shown in FIG. 11, the value of the hatched FLp(5) is determined as FLth. The thus determined wavelength search fluence FLth is used to carry out the wavelength search process of searching for the optimum wavelength λopt.

Figure 12:
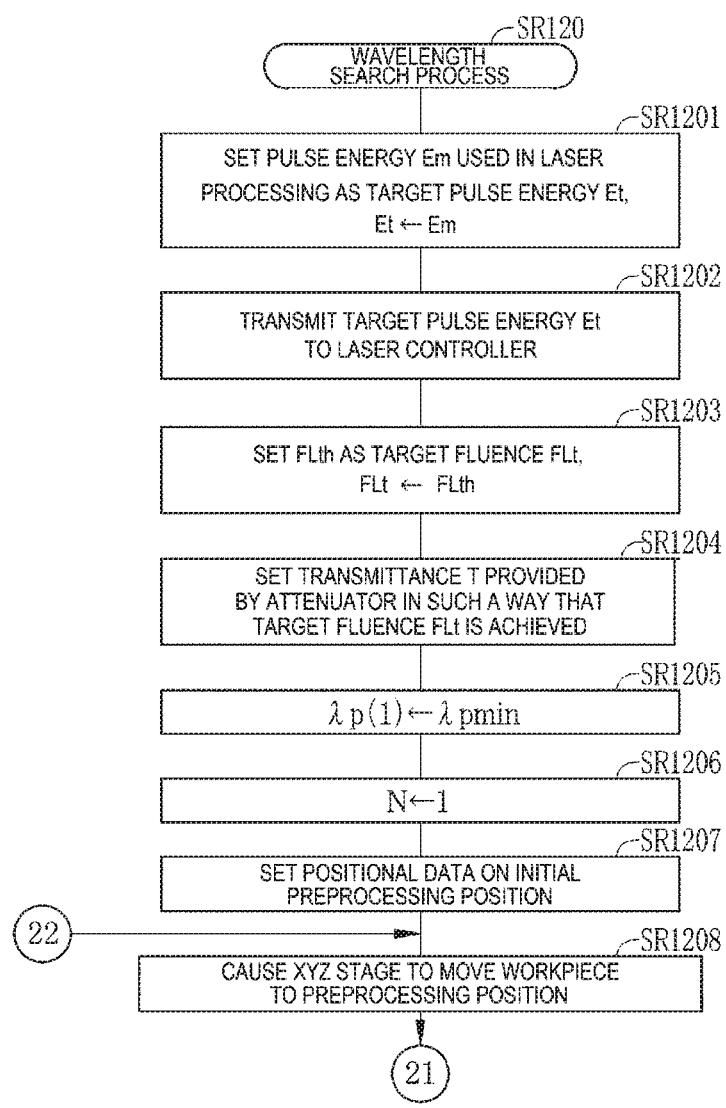
FIG. 12 is the first half of the flowchart showing the procedure of a wavelength search process.

In SR120 as the wavelength search process in FIG. 12, the laser processing controller 32A performs the second preprocessing by changing the wavelength to a plurality of wavelengths with the fluence fixed at the wavelength search fluence FLth.

The laser processing controller 32A sets the pulse energy Em used in the laser processing as the target pulse energy Et in SR1201. The laser processing controller 32A then transmits data on the set target pulse energy Et to the laser controller 13 in SR1202. The laser processing controller 32A then sets in SR1203 the wavelength search fluence FLth as the target fluence FLt and sets in SR1204 the transmittance T provided by the attenuator 52 in such a way that the target fluence FLt is achieved.

The laser processing controller 32A initializes in SR1205 the value of a wavelength λp(N) used in the second preprocessing. Specifically, a minimum wavelength λpmin, which is set as a first wavelength λp(1) used in the second preprocessing in SR1205. In SR1206, the number N of the wavelength λp(N) to be used is set at "1", and λp(1) is selected.

The minimum wavelength λpmin is the lower limit of the wavelength range used in the second preprocessing. The wavelength range used in the second preprocessing is a predetermined range containing the reference wavelength λa. The minimum wavelength λpmin is determined as "reference wavelength λa−ΔλL". ΔλL is the difference between the reference wavelength λa and the minimum wavelength λpmin.

The laser processing controller 32A sets positional data on an initial preprocessing position in SR1207. The laser processing controller 32A causes the XYZ stage 34 to move the workpiece 41 to the initial preprocessing position based on the set positional data in SR1208. The preprocessing position in the second preprocessing is located in the region other than the portion where the final processing is performed, as the preprocessing position in the first preprocessing does, but is set in a region that does not contain the preprocessing position in the first preprocessing.

Figure 13:
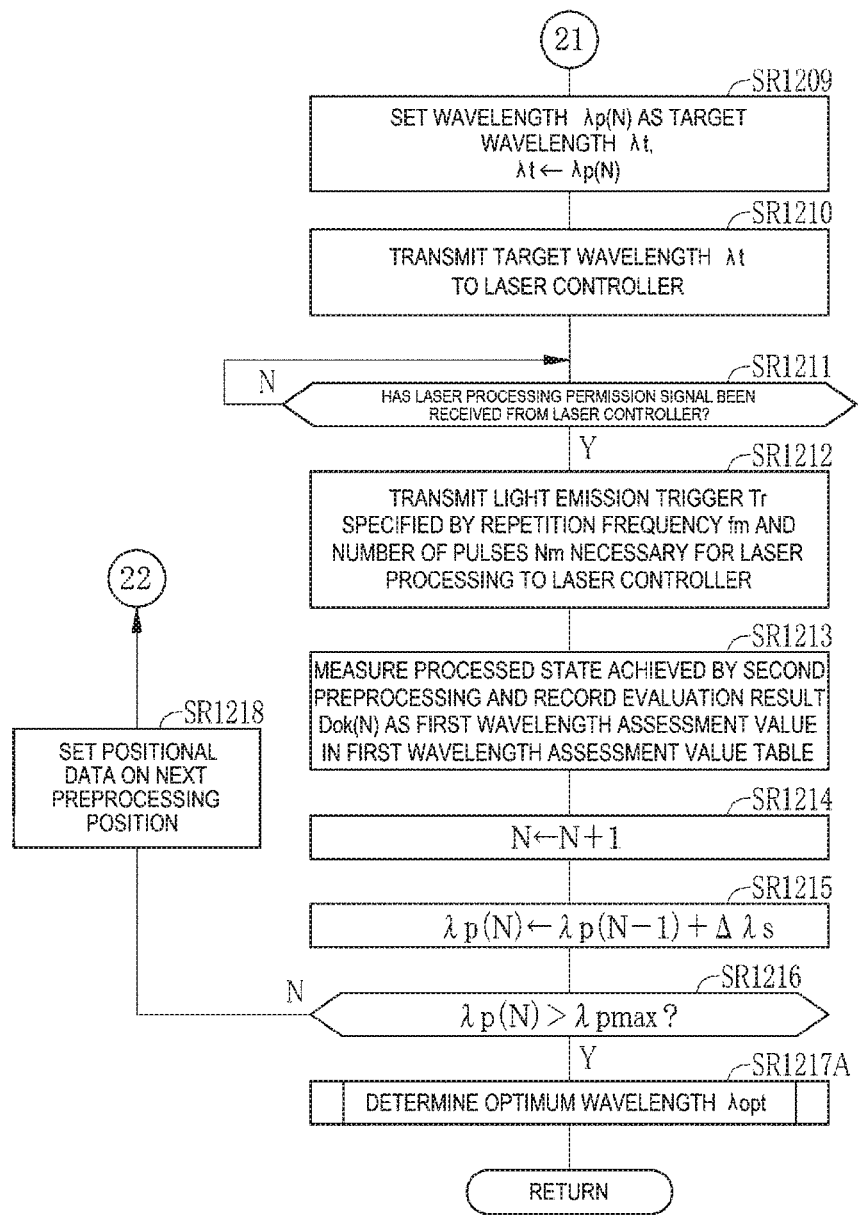
FIG. 13 is the second half of the flowchart showing the procedure of the wavelength search process.

The laser processing controller 32A sets the wavelength λp(N) as the target wavelength λt in SR1209, as shown in FIG. 13. In a case where the number N of the wavelength λp(N) has been set at "1", the minimum wavelength λpmin, which is the first wavelength λp(1), is set as the target wavelength λt. The laser processing controller 32A then transmits the target wavelength λt to the laser controller 13 in SR1210.

The laser processing controller 32A waits for the laser processing permission signal from the laser controller 13 in SR1211. The laser processing controller 32A, when it receives the laser processing permission signal (Y in SR1211), transmits in SR1212 the light emission trigger Tr specified by the repetition frequency fm and the number of pulses Nm necessary for the laser processing to the laser controller 13. The laser apparatus 3 then outputs the pulsed laser light to perform the second preprocessing in the preprocessing position on the workpiece 41.

When the second preprocessing using the wavelength λp(N) is performed, the observation apparatus 66 measures the processed state achieved by the second preprocessing on a wavelength basis in SR1213. The observation apparatus 66 captures an image of the surface of the workpiece 41 with the image sensor 66e and records an observed image showing the processed state achieved by the second preprocessing using the wavelength λp(N). The laser processing controller 32A then assesses the processed state achieved by the second preprocessing using the wavelength λp(N) based on the recorded observed image.

Specifically, the laser processing controller 32A evaluates whether or not processing has been performed on the preprocessing position on the workpiece 41 in the second preprocessing using the wavelength λp(N). For example, in a case where the second preprocessing forms a round hole in the surface of the workpiece 41, the laser processing controller 32A determines that the processing has been performed if the hole has been formed, whereas determining that no processing has been performed if no hole has been formed. The laser processing controller 32A then records an evaluation result Dok(N) as a first wavelength assessment value in a first wavelength assessment value table 69 shown in FIG. 14. In a case where the number N is "1", an evaluation result Dok(1) which is the result of the evaluation of the second preprocessing using the first wavelength λp(1), is recorded as the first wavelength assessment value in the first wavelength assessment value table 69.

When the first wavelength assessment value has been recorded for one wavelength λp(N), the laser processing controller 32A increments the number N by 1 in SR1214. In SR1215, the laser processing controller 32A sets the value of the wavelength λp(N−1) to which Δλs is added as the value of wavelength λp(N). For example, when the first wavelength assessment value of λp(1) has been recorded, N is incremented by 1. When the second preprocessing performed on the initial preprocessing position is completed, N=1, so that N is incremented by 1, resulting in N=2. Since N=2, N−1=2−1=1 in SR1215. The value obtained by adding Δλs to the value of λp(1) is set as the value of the wavelength λp(2). Since the value of λp(1) is the minimum wavelength λpmin, which is the initial value, λp(2)=λpmin+Δλs.

In a case where the value of λp(N) set in SR1215 is smaller than or equal to a maximum wavelength λpmax (N in SR1216), the laser processing controller 32A sets positional data on a next preprocessing position (SR1218). The maximum wavelength λpmax is the upper limit of the wavelength range used in the second preprocessing. The maximum wavelength λpmax is determined as "reference wavelength λa+ΔλU". ΔλU is the difference between the reference wavelength λa and the maximum wavelength λpmax.

After the positional data is set in SR1218, the laser processing controller 32A controls the XYZ stage 34 to cause it to move the workpiece 41 to the next preprocessing position in SR1208. In the next preprocessing position, steps SR1209 to SR1215 are carried out. In a case where λp(N) =λp(2), the laser processing controller 32A records an evaluation result Dok(2), which is the result of the evaluation of λp(2), as the first wavelength assessment value in the first wavelength assessment value table 69 in SR1213.

The processes described above are repeated until the value of λp(N) exceeds λpmax (Y in SR1216). The laser processing controller 32A thus performs the second preprocessing, which is the wavelength search preprocessing, by changing the wavelength of the pulsed laser light to a plurality of wavelengths over a predetermined wavelength range containing the reference wavelength λa.

The first wavelength assessment value table 69 is a table that records the values of a plurality of wavelengths λp(N) used in the second preprocessing and the evaluation results Dok(N), which are the first wavelength assessment values corresponding to the wavelengths λp(N), with the wavelengths λp(N) and the evaluation results Dok(N) associated with each other, as shown in FIG. 14. As described above, in the case where the reference wavelength λa is used in the second preprocessing, the maximum fluence immediately before the processing is performed is used, as described above. In a case where the reference wavelength λa differs from the optimum wavelength λopt, it is believed that the optimum wavelength λopt provides a faster processing speed PS than the reference wavelength λa. Therefore, in the second preprocessing, use of the reference wavelength λa may result in "unsuccessful processing," but use of a wavelength different from the reference wavelength λa may result in "successful processing" in some cases.

For example, in a case where the reference wavelength λa is λp(10), the wavelength search fluence FLth is used in the second preprocessing, and the first wavelength assessment value of λp(10) is "unsuccessful processing," as shown in FIG. 14. The reason for this is that the wavelength search fluence FLth is the fluence FL immediately before the processing is performed on the workpiece 41. On the other hand, the first assessment values are each "successful processing" from λp(12) to λp(15), which are longer than λp(10). Here, λp(12) is a minimum λokmin of the wavelengths corresponding to "successful processing," and λp(15) is a maximum λokmax of the wavelengths corresponding to "successful processing." The optimum wavelength λopt is determined from the wavelengths that fall within the range from the minimum λokmin to the maximum λokmax.

Figure 15:
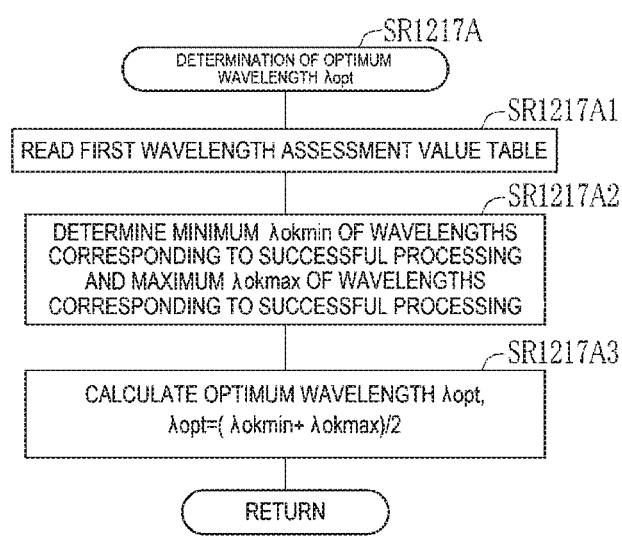
FIG. 15 is a flowchart showing the procedure of processes carried out to determine an optimum wavelength.

In SR1217A in FIG. 13, the laser processing controller 32A determines the optimum wavelength λopt based on the first wavelength assessment value table 69. In the present example, the laser processing controller 32A corresponds to an optimum wavelength determination section that assesses the processed state on a wavelength basis to determine the optimum wavelength λopt used in the final processing. FIG. 15 is a flowchart of SR1217A as the process of determining the optimum wavelength λopt.

In SR1217A1, the laser processing controller 32A reads the first wavelength assessment value table 69, in which the first wavelength assessment values are recorded when the second preprocessing is performed. In SR1217A2, the laser processing controller 32A reads, from the first wavelength assessment value table 69, the wavelengths λp(N) at each of which the evaluation result Dok(N), which is the first wavelength assessment value, is "successful processing." The laser processing controller 32A then determines the minimum λokmin of the wavelengths corresponding to "successful processing" and the maximum λokmax of the wavelengths corresponding to "successful processing" from the wavelengths λp(N) corresponding to "successful processing." In SR1217A3, the laser processing controller 32A calculates λopt=(λokmin+λokmax)/2 to determine the optimum wavelength λopt. That is, the median between the minimum λokmin and the maximum λokmax is determined as the optimum wavelength λopt. The final laser processing is performed by using the optimum wavelength λopt, as shown in S1030A in FIG. 7.

3.3 Effects

The laser processing system 2A uses the optimum wavelength λopt as the wavelength of the pulsed laser light in the laser processing. The laser processing controller 32A performs the wavelength search preprocessing by changing the wavelength of the pulsed laser light to a plurality of wavelengths over the predetermined wavelength range containing the reference wavelength λ and assesses the processed states achieved by the preprocessing to determine the optimum wavelength λopt. As described above, the preprocessing is actually performed to determine the optimum wavelength λopt in the present example. Therefore, even in the case where the reference wavelength λa, which is the theoretical optimum wavelength, differs from the actual optimum wavelength λopt due, for example, to impurities in the material of the workpiece 41 to be processed, the actual optimum wavelength λopt can be accurately determined. The laser processing is then performed by using the optimum wavelength λopt, whereby the workpiece 41 efficiently absorbs the pulsed laser light. The processing speed PS can therefore be improved.

In the present example, the observation apparatus 66, which is accommodated in the laser processing apparatus 4A, is used to observe the processed state of the workpiece 41 on the table 33. The processed state can therefore be measured and assessed in a shorter period than in the case where the observation apparatus 66 is provided separately from the laser processing apparatus 4. The optimum wavelength λopt can therefore be searched for in a relatively short period.

The workpiece 41 is preferably made of any of the crystal materials shown in the first wavelength selection table 56 in FIG. 5. The workpiece 41 is not necessarily made of a crystal material and may instead be made of a glass material, an organic material, or any other material that absorbs photons at an absorption wavelength known in advance. In the case of such a material, the optimum wavelength λopt is searched for by using the absorption wavelength known in advance as the reference wavelength λa.

3.4 Variation

In the example described above, the reference wavelength λa is read from the first wavelength selection table 56, and the predetermined wavelength range over which the wavelength of the pulsed laser light is changed based on the reference wavelength λa is determined through calculation, as shown in SR1205 in FIG. 12 and SR1215 in FIG. 13. The example is not necessarily employed, and the first wavelength selection table 56 may record data on the predetermined wavelength range over which the wavelength of the pulsed laser light is changed and which contains the reference wavelength λa. In this case, the laser processing controller 32A acquires data on the wavelength range corresponding to the material name MN from the first wavelength selection table 56. No calculation of determining the predetermined wavelength range is therefore required.

In the example described above, the laser processing controller 32A determines the reference wavelength λa from the first wavelength selection table 56 based on the inputted material name MN, and the laser processing controller 32A corresponds to a reference wavelength acquisition section. The reference wavelength acquisition section may directly accept input of the reference wavelength λa according to the workpiece 41 in place of the material name MN. The input of the reference wavelength λa may be the manual input or the input from an external apparatus described above. In the case where the reference wavelength λa is directly inputted, no first wavelength selection table 56 may be used.

Of course, use of a wavelength selection table that records the correspondence between the material name MN and the reference wavelength λa, such as the first wavelength selection table 56, allows identification of the reference wavelength λa in accordance only with input of the material name MN, allowing simple operation. It is therefore preferable to use a wavelength selection table, such as the first wavelength selection table 56.

The material name MN is material identification information for identifying the type of material. The material identification information can instead, for example, be code information for identifying the type of material in place of the material name MN.

4. Laser Processing System According to Second Embodiment

4.1 Configuration

Figure 16:
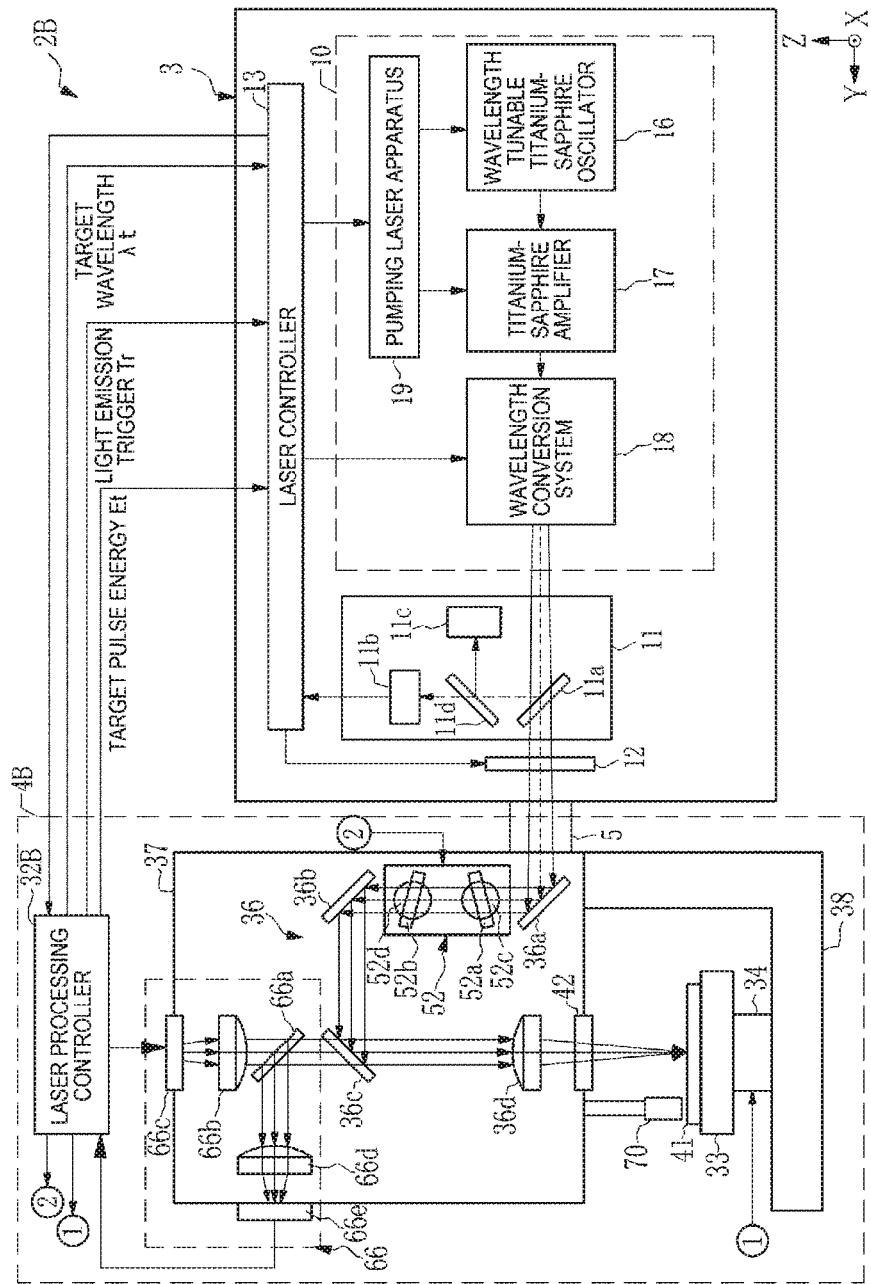
FIG. 16 schematically shows the configuration of a laser processing system according to a second embodiment.
Figure 17:
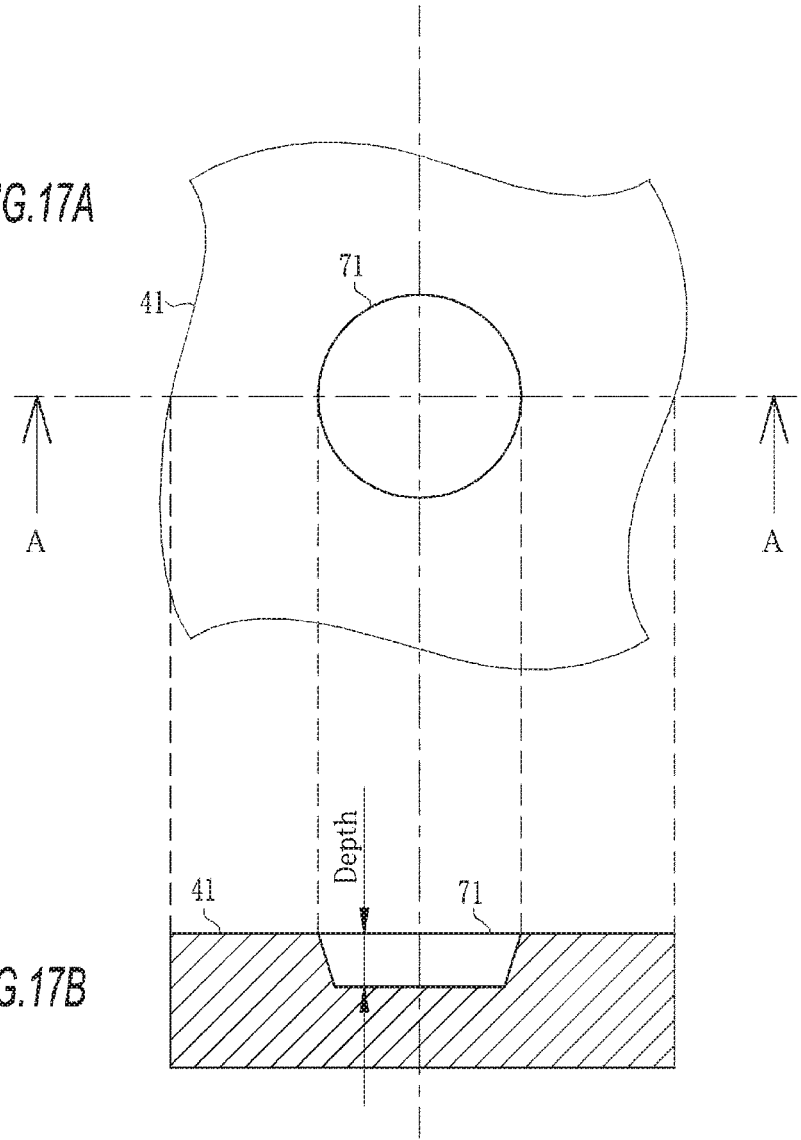
FIGS. 17A and 17B describe a processed depth.
Figure 18:
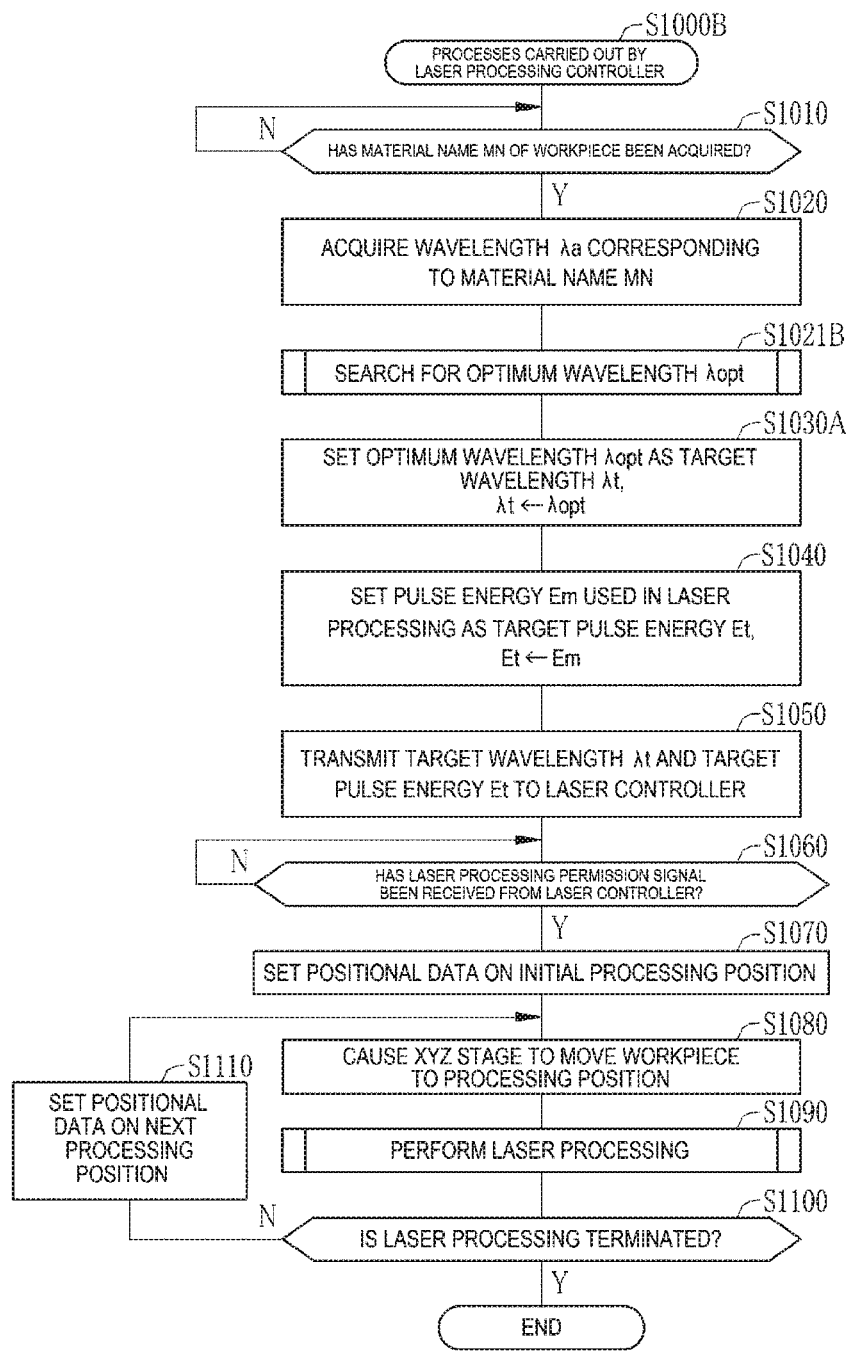
FIG. 18 is a flowchart showing the procedure of processes carried out by a laser processing controller in the second embodiment.

FIGS. 16 to 22 show a laser processing system 2B according to a second embodiment. The laser processing system 2B according to the second embodiment includes a laser apparatus 3 and a laser processing apparatus 4B, as shown in FIG. 16. The laser apparatus 3 in the second embodiment is the same as the laser apparatus 3 in the first embodiment. The laser processing apparatus 4B includes a processed depth measurer 70 in addition to the configuration of the laser processing apparatus 4A in the first embodiment. A laser processing controller 32B has an optimum wavelength search function based on a scheme different from that in the first embodiment. The other configurations of the laser processing system 2B are the same as those of the laser processing system 2A according to the first embodiment, and the following description will be primarily made of the differences from the first embodiment.

The processed depth measurer 70 is attached, for example, to the enclosure 37 and disposed in a position where the surface of the workpiece 41 on the table 33 can be measured. The processed depth measurer 70 is an aspect of the processed state measurer, which measures the processed state of the surface of the workpiece 41, and measures the processed depth Depth as the processed state. The processed depth measurer 70 is, for example, a confocal laser microscope.

In FIGS. 17A and 17B, reference character 71 denotes a hole 71 formed in the surface of the workpiece 41 by the laser processing. FIG. 17A is a plan view of the workpiece 41, and FIG. 17B is a cross-sectional view showing the cross section taken along the line A-A in FIG. 17A. The processed depth measurer 70 measures the processed depth Depth of the hole 71 shown in FIG. 17B.

The laser processing apparatus 4B is further provided with the observation apparatus 66, as the laser processing apparatus 4A in the first embodiment is, in addition to the processed depth measurer 70, as shown in FIG. 16. In the laser processing apparatus 4B, the processed depth measurer 70 solely functions as the processed state measurer, which measures the processed state achieved by the preprocessing, and the observation apparatus 66 is not used to measure the processed state, as will be described later. The observation apparatus 66 is, however, effective in positioning the workpiece 41 and is therefore provided also in the laser processing apparatus 4B.

4.2 Operation

The operation of the laser processing system 2B will be described with reference to FIGS. 18 to 21. Processes carried out by the laser processing controller 32B in the second embodiment differ from the processes in S1000A in the first embodiment shown in FIG. 7 in terms of the scheme for searching for the optimum wavelength λopt, as shown in S1000B of FIG. 18. In the second embodiment, S1021A is changed to S1021B. The other steps are the same as those in the first embodiment shown in FIG. 7.

Figure 19:
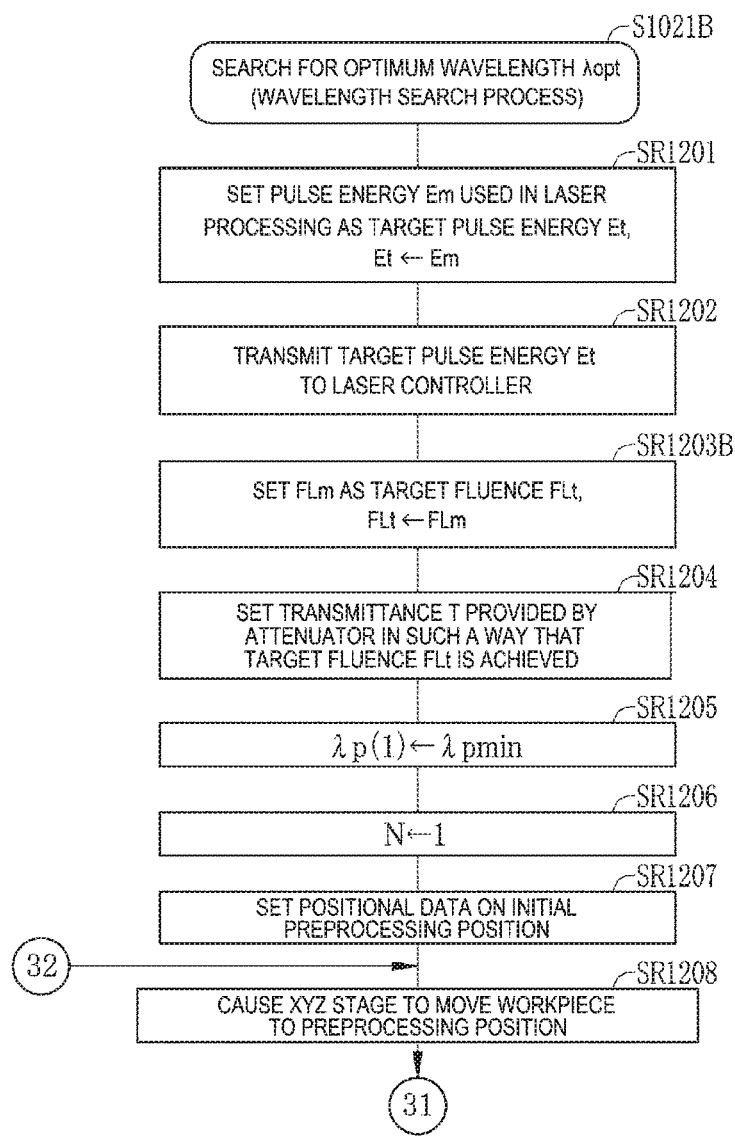
FIG. 19 is the first half of a flowchart showing the procedure of processes of searching for an optimum wavelength in the second embodiment.
Figure 20:
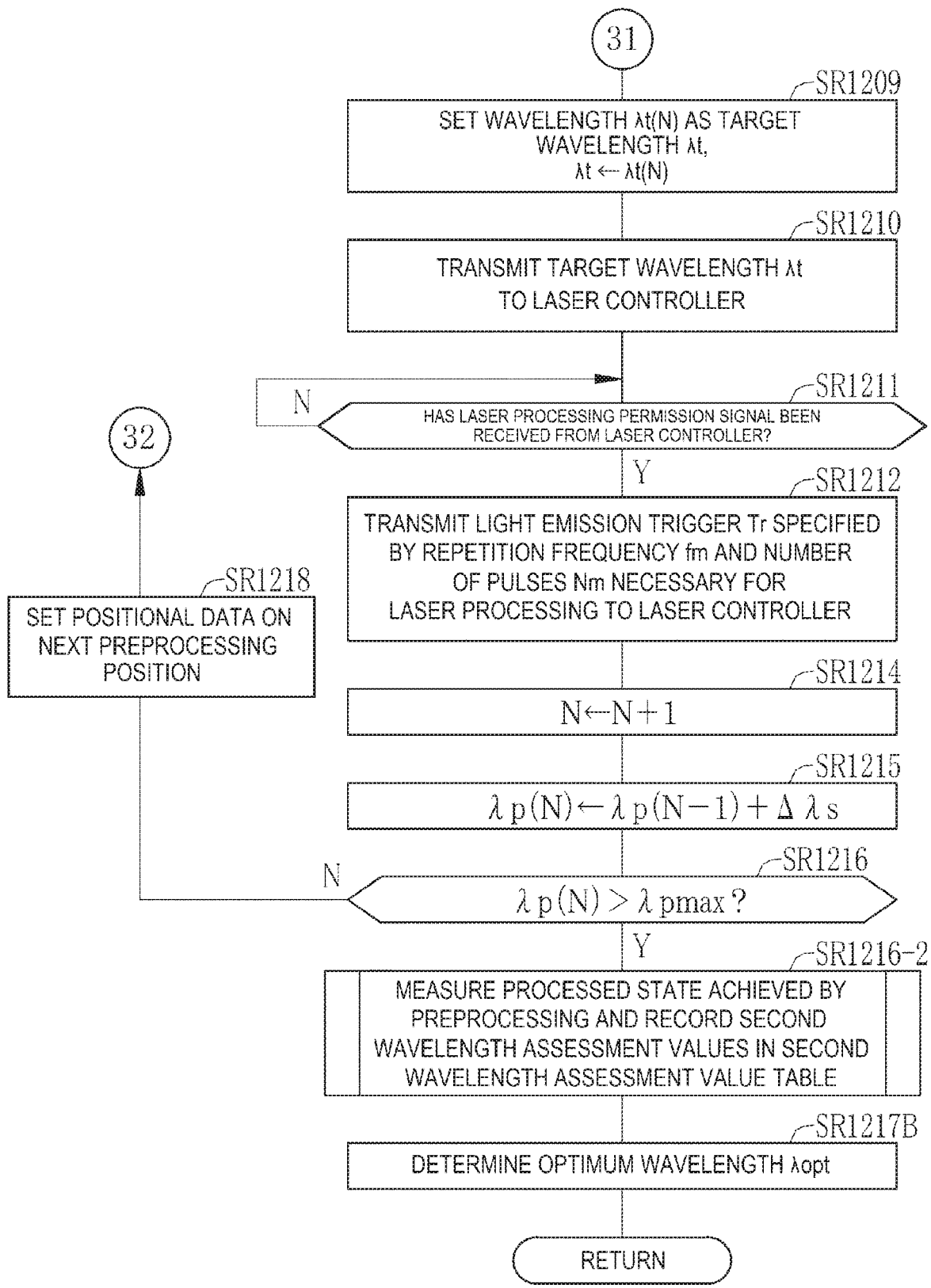
FIG. 20 is the second half of the flowchart showing the procedure of the processes of searching for the optimum wavelength in the second embodiment.

The search for the optimum wavelength λopt in S1021B in the second embodiment uses no wavelength search fluence FLth, unlike in the first embodiment, as shown in FIGS. 19 and 20. Therefore, S1021B in the second embodiment has no process of determining the wavelength search fluence FLth, unlike in the first embodiment. S1021B in the second embodiment is a wavelength search process based on a scheme in which the fluence FLm used in the final laser processing is used to perform wavelength search preprocessing.

S1021B in the second embodiment shown in FIGS. 19 and 20 is similar to SR120 in FIGS. 12 and 13 in the first embodiment, and the same steps have the same reference characters and will not be described. First, S1021B in the second embodiment shown in FIG. 19 differs from SR1203 in the first embodiment shown in FIG. 12 in that the fluence FLm used in the laser processing is set as the target fluence FLt in SR1203B.

In S1021B in the second embodiment shown in FIGS. 19 and 20, steps SR1204 to SR1212, steps SR1214 to SR1216, and step SR1218 are the same as those in the first embodiment shown in FIGS. 12 and 13. In the first embodiment, SR1213, which is the step of measuring the processed state achieved by the preprocessing and recording the first wavelength assessment value, is inserted between SR1212 and SR1214 as shown in of FIG. 13. Therefore, in the first embodiment, the processed state achieved by the preprocessing is measured whenever the wavelength is changed.

In contrast, in the second embodiment, no step of measuring the processed state achieved by the preprocessing and recording an assessment value is inserted between SR1212 and SR1214, as shown in FIG. 20. Instead, SR1216-2, which is the step of measuring the processed state achieved by the preprocessing and recording a second wavelength assessment value in a second wavelength assessment value table, is placed after SR1216. Therefore, in the second embodiment, after the preprocessing using a plurality of wavelengths is performed, the processed states in the plurality of preprocessing positions are collectively measured.

In SR1216-2 in the second embodiment, the laser processing controller 32B measures the processed states at the plurality of wavelengths and records the second wavelength assessment value in each of the preprocessing positions in a second wavelength assessment value table 72 shown in FIG. 22. Thereafter, in SR1217B, the laser processing controller 32B refers to the second wavelength assessment value table 72 to determine the optimum wavelength λopt.

Figure 21:
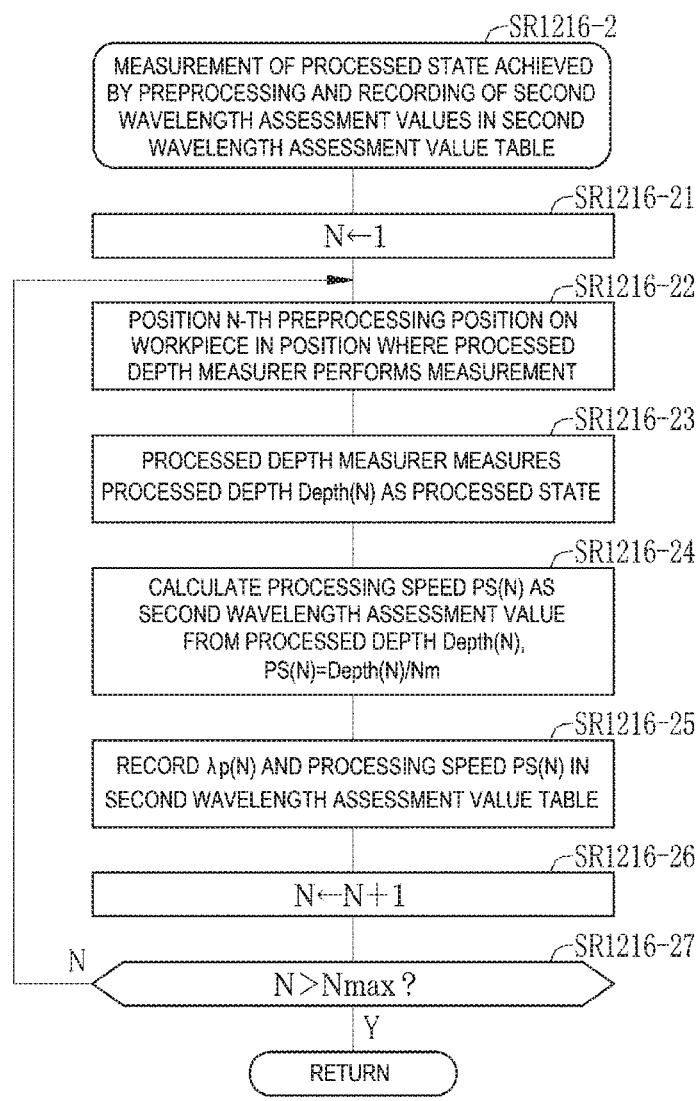
FIG. 21 is a flowchart showing the procedure of processes of measuring a processed state and recording a second wavelength assessment value.

In FIG. 21, which shows the procedure of SR1216-2, the laser processing controller 32B first sets the number N at "1" to initialize the processed depth Depth(N) in SR1216-21. In SR1216-22, the laser processing controller 32B controls the XYZ stage 34 to position the N-th preprocessing position on the workpiece 41 in the position where the processed depth measurer 70 performs the measurement. In a case where N=1, the first processing position is positioned in the measurement position. In SR1216-23, the processed depth measurer 70 measures the processed depth Depth(N) as the processed state. In SR1216-24, the processing speed PS(N) is calculated as the second wavelength assessment value from the processed depth Depth(N). The processing speed PS(N) is the quotient of the division of the processed depth Depth by the number of pulses Nm and is calculated by PS(N)=Depth(N)/Nm, as shown in Expression (1) described above.

In SR1216-25, the laser processing controller 32B records the wavelength λp(N) used in the preprocessing and the processing speed PS(N) in the second wavelength assessment value table 72 with the wavelength λp(N) and the processing speed PS(N) associated with each other, as shown in FIG. 22. In SR1216-26, the laser processing controller 32B increments the number N by "1". In a case where the number N is smaller than or equal to a maximum Nmax (N in SR1216-27), the laser processing controller 32B determines that there is a next preprocessing position. The maximum Nmax is the total number of preprocessing positions to be assessed in terms of processed state. The laser processing controller 32B, when it determines that there is a next preprocessing position, returns to SR1216-22, carries out the processes from SR1216-22 to SR1216-25 again on the next preprocessing position, and records the second wavelength assessment value in the next preprocessing position.

The laser processing controller 32B repeats the processes from SR1216-22 to SR1216-26 until the number N exceeds the maximum Nmax (Y in SR1216-27), that is, the processed states in all preprocessing positions are assessed.

In SR1217B in FIG. 20, the laser processing controller 32B refers to the second wavelength assessment value table 72 to determine the wavelength λp(N) at which the processing speed PS(N) is maximized as the optimum wavelength λopt.

4.3 Effects

As described above, in the second embodiment, the laser processing controller 32B sets the fluence FLm used in the final processing as the target fluence FLt and performs the wavelength search preprocessing. The laser processing controller 32B, which functions as the optimum wavelength determination section, determines the processing speed PS from the processed depths Depth(N) achieved by the preprocessing performed at a plurality of wavelengths and determines a wavelength at which the processing speed PS is maximized as the optimum wavelength λopt. Since the preprocessing is actually performed to determine the optimum wavelength λopt, an actual optimum wavelength λopt can be accurately determined, as in the first embodiment. The processing speed PS can therefore be improved.

Further, since the processed depth measurer 70 incorporated in the laser processing apparatus 4B is used to allow observation of the processed state of the workpiece 41 on the table 33, the processed state can be measured and assessed in a short period, as in the first embodiment. The optimum wavelength λopt can therefore be searched for in a relatively short period. Moreover, since the processed depth measurer 70 is used as the processed state measurer, the processing speed PS derived from the processed depth Depth can be used as the assessment value. High-precision assessment can therefore be made as compared with a case where the observation apparatus 66 incapable of measuring the processed depth Depth is used. The optimum wavelength λopt can thus be precisely searched for.

Figure 23:
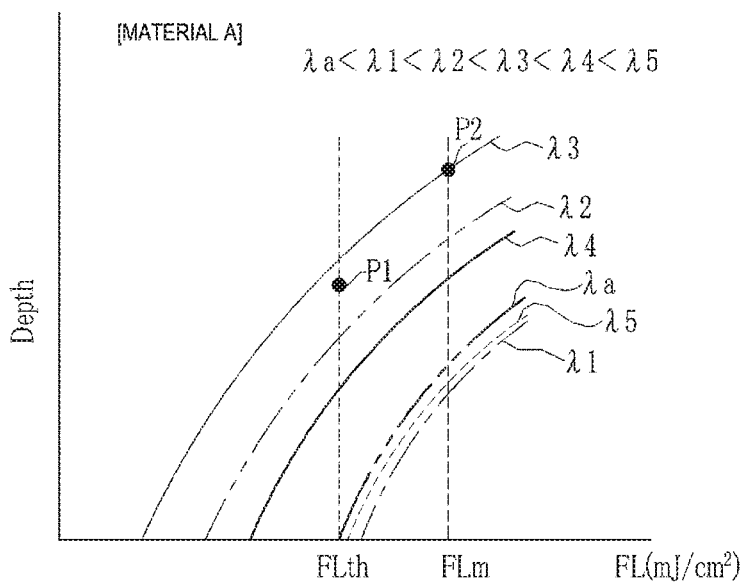
FIG. 23 shows characteristics of a material A.
Figure 24:
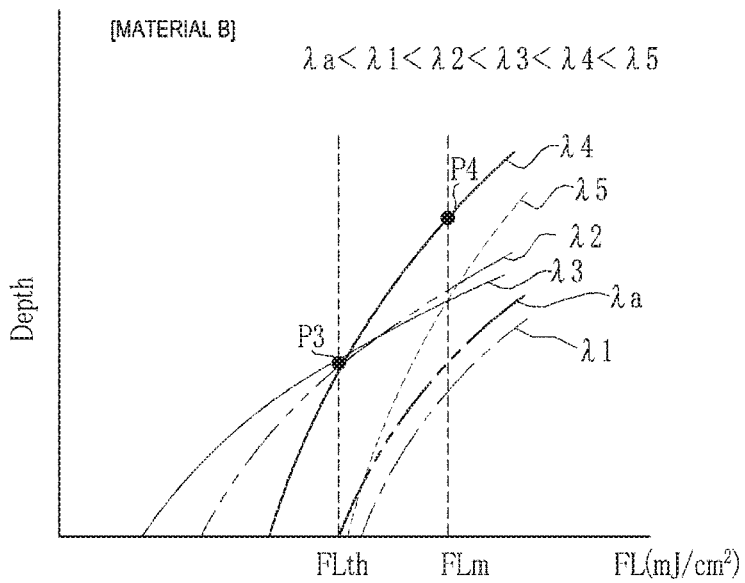
FIG. 24 shows characteristics of a material B.
Figure 25:
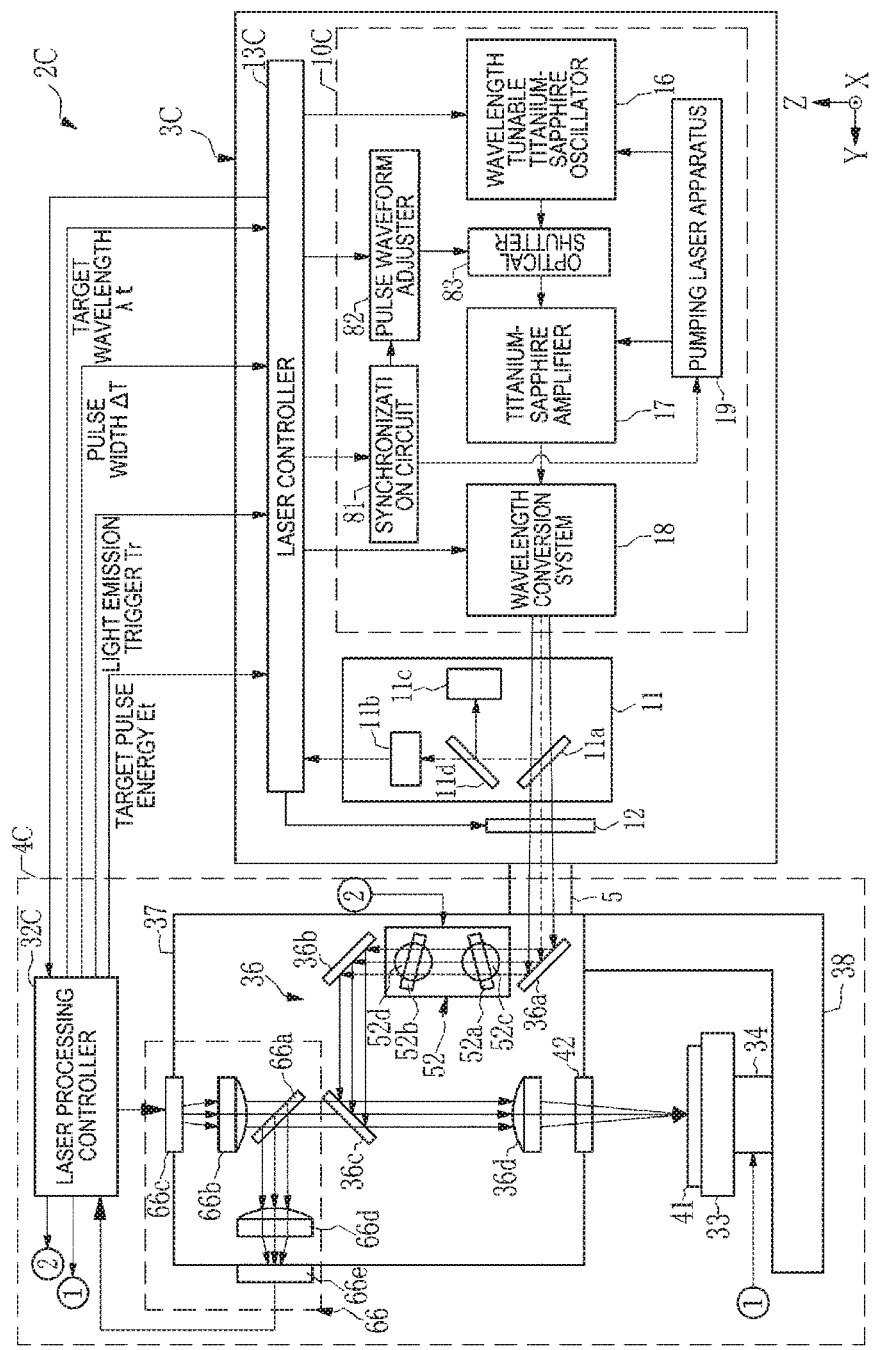
FIG. 25 schematically shows the configuration of a laser processing system according to a third embodiment.

Further, the second embodiment provides the following effects, unlike the first embodiment. FIGS. 23 and 24 are graphs showing the wavelength dependence of the pulsed laser light in the relationship between the fluence FL and the processed depth Depth in a case where the workpiece 41 is made of a material A or B. In FIGS. 23 and 24, the processed depth Depth is a value achieved when the pulsed laser light is radiated by the number of pulses Nm necessary for the processing. The graphs in FIGS. 23 and 24 are examples not only in a case where the materials A and B are processed with pulsed laser light having each of five wavelengths that satisfy λa<λ1<λ2<λ3<λ4<λ5 but in a case where the optimum wavelength λopt is longer than λa, which is the reference wavelength In general, in a case where the pulsed laser light has a fixed wavelength, the greater the value of fluence FL, the greater the value of the processed depth Depth, irrespective of the type of material, as shown in FIGS. 23 and 24. The fluence FLth is defined as the maximum of the fluences FL immediately before the workpiece 41 is processed by using the wavelength λa, as described above. Therefore, the processing performed by using the fluence FLth and the wavelength λa results in "unsuccessful processing" and hence a processed depth Depth of "0" irrespective of the type of material, as shown in FIGS. 23 and 24.

The processing performed on the material A in FIG. 23 by using the fluence FLth results in "unsuccessful processing" and hence the processed depth Depth of "0" also at λ1 and λ5 in addition to the wavelength λa. That is, in the case of the material A in FIG. 23, the fluence FLth does not reach the fluence FL equal to the processing threshold that achieves "successful processing" also at λ1 and λ5 in addition to the wavelength λa. On the other hand, at the wavelengths λ2, λ3, and λ4, the fluence FLth reaches the fluence FL equal to the processing threshold, and the processed depth Depth exceeds "0". That is, "successful processing" is achieved at the wavelengths λ2, λ3, and λ4.

Therefore, in the case of the material A in FIG. 23 and in the scheme in the first embodiment, in which the wavelength search fluence FLth is used to search for the optimum wavelength λopt, the optimum wavelength λopt is determined to be a wavelength that falls within the range from the wavelengths λ2 to λ4, at which "successful processing" is achieved, and allows the curve representing the relationship between the fluence FL and the processed depth Depth to pass through a point P1. The point P1 is an intermediate value between the wavelength λ4, which is the maximum λokmax of the "successful processing" wavelengths, and the wavelength λ2, which the minimum λokmin of the "successful processing" wavelengths. The intermediate value is close to the wavelength λ3.

Further, in the case of the material A in FIG. 23 and in the scheme in the second embodiment, in which the fluence FLm used in the laser processing is used and the processing speed PS is determined to search for the optimum wavelength λopt, the processed depth Depth achieved at the wavelength λ3, which allows the curve to pass through a point P2, is maximized, and the processing speed PS is also maximized. In the scheme in the second embodiment, the wavelength λ3 is therefore determined as the optimum wavelength λopt. As described above, in the case where the material A is processed, the optimum wavelength λopt determined in the first embodiment roughly coincides with the optimum wavelength λopt determined in the second embodiment.

The processing performed on the material B in FIG. 24 by using the fluence FLth results in "unsuccessful processing" and hence the processed depth Depth of "0" at the wavelengths λa, λ1, and λ5, as in the case of the material A in FIG. 23. That is, also in the case of the material B in FIG. 24, the fluence FLth does not reach the fluence FL equal to the processing threshold that achieves "successful processing" at the wavelengths λa, λ1, and λ5, as in the case of the material A in FIG. 23. On the other hand, at the wavelengths λ2, λ3, and λ4, the fluence FLth reaches the fluence FL equal to the processing threshold, and the processed depth Depth exceeds "0". That is, "successful processing" is achieved at the wavelengths λ2, λ3, and λ4.

Therefore, in the case of the material B in FIG. 24 and in the scheme in the first embodiment, in which the wavelength search fluence FLth is used to search for the optimum wavelength λopt, the optimum wavelength λopt is determined to be a wavelength that falls within the range from the wavelengths λ2 to λ4, at which "successful processing" is achieved, and allows the curve representing the relationship between the fluence FL and the processed depth Depth to pass through a point P3. The point P3 is an intermediate value between the wavelength λ4, which is the maximum λokmax of the "successful processing" wavelengths, and the wavelength λ2, which the minimum λokmin of the "successful processing" wavelengths. The intermediate value is close to the wavelength λ3.

However, in the case of the material B in FIG. 24 and in the scheme in the second embodiment, in which the fluence FLm used in the laser processing is used and the processing speed PS is determined to search for the optimum wavelength λopt, the processed depth Depth achieved at the wavelength λ4, which allows the curve to pass through a point P4, is maximized, and the processing speed PS is also maximized. In the scheme in the second embodiment, the wavelength λ4 is therefore determined as the optimum wavelength λopt. As described above, in the processing of the material B having a wavelength dependency of the processed depth Depth that differs between the fluence FLth and the fluence FLm, unlike the material A, the optimum wavelengths λopt determined in the first and second embodiments greatly differ from each other in some cases.

As the optimum wavelength λopt, it is appropriate to select a wavelength at which the processing speed PS is maximized by using the fluence FLm used in the laser processing. In the case of the material A having the characteristics in FIG. 23, it is appropriate to select the wavelength λ3, whereas in the case of the material B having the characteristics in FIG. 24, it is appropriate to select the wavelength λ4. Unlike the scheme in the first embodiment, the scheme in the second embodiment always allows determination of an appropriate optimum wavelength λopt irrespective of the difference in characteristics between the materials A and B, as shown in FIGS. 23 and 24. The scheme in the second embodiment is therefore preferable as compared with the scheme in the first embodiment.

In the example described above, in SR1216-2 shown in FIG. 20, after the preprocessing using a plurality of wavelengths is performed, the processed states achieved at the wavelengths are collectively measured and assessed. Therefore, the measurement and assessment of the processed state can be efficiently performed as compared with the case where the measurement and assessment are performed whenever the preprocessing is performed at one wavelength, as in SR1213 in the first embodiment shown in FIG. 13. Of course, also in the second embodiment, the measurement and assessment may be performed whenever the preprocessing is performed at one wavelength, as in the first embodiment.

As the processed depth measurer 70, a laser displacement gauge, an atomic force microscope (AFM), and other instruments can be used in place of a laser microscope.

5. Laser Processing System According to Third Embodiment

5.1 Configuration

A laser processing system 2C shown in FIGS. 25 to 29 according to a third embodiment includes a laser apparatus 3C and a laser processing apparatus 4C. The laser apparatus 3C in the third embodiment includes a solid-state laser apparatus 10C in place of the solid-state laser apparatus 10 of the laser apparatus 3. Further, the laser controller 13 is changed to a laser controller 13C. The solid-state laser apparatus 10C includes a synchronization circuit 81, a pulse waveform adjuster 82, and an optical shutter 83 in addition to the configuration of the solid-state laser apparatus 10 and therefore has a pulse width variable function of changing a pulse width ΔT of the pulsed laser light. The other configurations of the laser apparatus 3C are the same as those of the laser apparatus 3. In the following description of the laser apparatus 3C, the differences from the laser apparatus 3 will be primarily described.

The synchronization circuit 81 is configured to transmit a first trigger to the pumping laser apparatus 19 in synchronization with the timing at which the light emission trigger Tr or the internal light emission trigger that is not shown is inputted to the synchronization circuit 81 and further transmit a second trigger to the pulse waveform adjuster 82 after a delay with respect to the first trigger. The optical shutter 83 is disposed in the optical path between the wavelength tunable titanium-sapphire oscillator 16 and the titanium-sapphire amplifier 17. The optical shutter 83 is a high-speed optical shutter and includes an EO Pockels cell, a polarizer, and a power source that applies high voltage to the EO Pockels cell. When a pulse signal that is rectangular wave voltage is applied to the power source, the optical shutter 83 shapes the waveform of light incident thereon into an optical pulse corresponding to the waveform of the voltage. The pulse waveform adjuster 82 receives data on the pulse width ΔT transmitted from a laser processing controller 32C via the laser controller 13C. The pulse waveform adjuster 82 then drives the optical shutter 83 based on the received pulse width ΔT. The pulse waveform adjuster 82 inputs a pulse signal having the received pulse width ΔT to the power source of the optical shutter 83 to cause the optical shutter 83 to produce pulsed laser light having a pulse waveform corresponding to the pulse width ΔT.

When the first trigger is inputted from the synchronization circuit 81 to the pumping laser apparatus 19, the pumping laser apparatus 19 outputs excitation pulsed laser light to the titanium-sapphire oscillator 16. In the titanium-sapphire oscillator 16, when the excitation pulsed laser light is inputted thereto, the titanium-sapphire crystal in the titanium-sapphire oscillator 16 is excited, and laser oscillation occurs after a delay with respect to the timing at which the excitation pulsed laser light is inputted. The synchronization circuit 81 is so set as to output the second trigger to the pulse waveform adjuster 82 after a delay of a predetermined period with respect to the first trigger in such a way that the pulsed laser light outputted from the titanium-sapphire oscillator 16 is optically shaped by the optical shutter 83 into pulsed laser light having a desired pulse waveform. The optical shutter 83 thus operates in accordance with the timing at which the titanium-sapphire oscillator 16 performs laser oscillation to output the pulsed laser light.

The laser processing apparatus 4C includes the laser processing controller 32C in place of the laser processing controller 32A of the laser processing apparatus 4A. The other configurations of the laser processing apparatus 4C are the same as those of the laser processing apparatus 4A. The laser processing controller 32C functions as the reference wavelength acquisition section, as the laser processing controller 32A does. The laser processing controller 32C refers to a second wavelength selection table 84 shown in FIG. 26 to acquire the reference wavelength λa according to the material of the workpiece 41. The second wavelength selection table 84 is stored, for example, in an internal memory of the laser processing controller 32C.

The second wavelength selection table 84 is a table that records a two-photon absorption wavelength that is a wavelength at which two photons are absorbed in addition to the one-photon absorption wavelength on a material basis, unlike the first wavelength selection table 56 shown in FIG. 5. The two-photon absorption is a process in which a material simultaneously absorbs two photons and the two photons excite one electron. In the two-photon absorption, the energy per photon is half of the energy per photon in the one-photon absorption. The frequency v of the photon is therefore halved, whereby the two-photon absorption wavelength λ2hv is twice the one-photon absorption wavelength λ1hv.

The laser processing controller 32C refers to the second wavelength selection table 84 to acquire the two-photon absorption wavelength λ2hv in addition to the one-photon absorption wavelength λ1hv as the reference wavelength λa according to the material of the workpiece 41. In a case where the one-photon absorption wavelength λ1hv is greater than or equal to a predetermined value, the laser processing controller 32C functions as a wavelength selection section that selects the two-photon absorption wavelength λ2hv as the reference wavelength λa used in the preprocessing. Further, in the case where the two-photon absorption wavelength λ2hv is selected, the laser processing controller 32C functions as a pulse width setting section that sets a second pulse width ΔT2hv, which is shorter than a first pulse width ΔT1hv in a case where the one-photon absorption wavelength λ1hv is selected, as the pulse width 4T.

5.2 Operation

Figure 27:
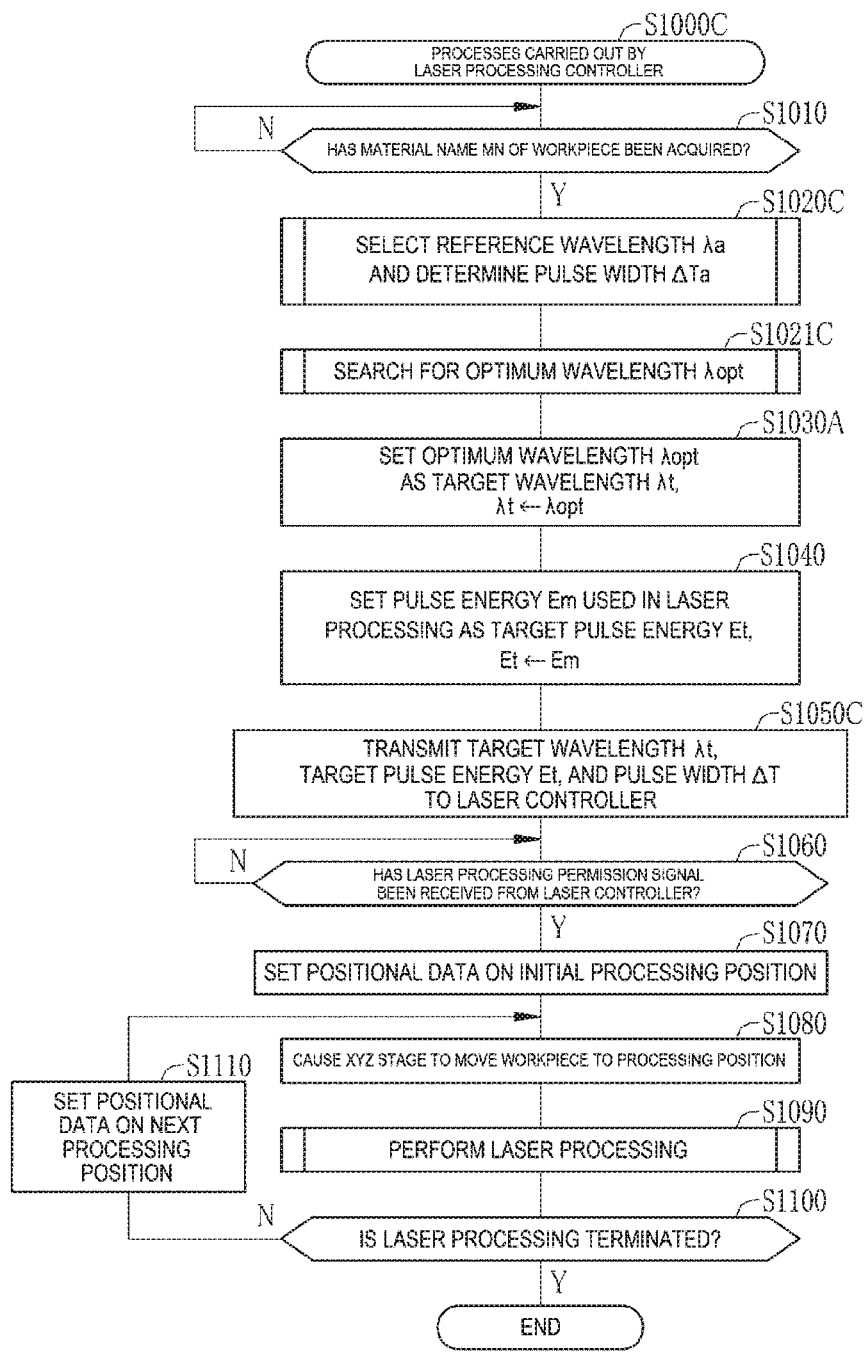
FIG. 27 is a flowchart showing the procedure of processes carried out by a laser processing controller in the third embodiment.

The flowchart of S1000C in the third embodiment shown in FIG. 27 shows the procedure of processes carried out by the laser processing controller 32C in the third embodiment. S1000C in the third embodiment is a variation of S1000A in the first embodiment shown in FIG. 7. S1000C in the third embodiment differs from S1000A in the first embodiment in that S1020, S1021A, and S1050 are changed to S1020C, S1021C, and S1050C, respectively, and the other steps in the third embodiment are the same as those in the first embodiment. The differences from the first embodiment will be primarily described below.

The laser processing controller 32C, when it acquires the material name MN (Y in S1010), selects the reference wavelength λa used in the preprocessing and determines a pulse width ΔTa in S1020C. In S1021C, the laser processing controller 32C performs the preprocessing to search for the optimum wavelength λopt in the same procedure as the procedure of the wavelength search process in the first embodiment shown in FIGS. 12 and 13. In S1021C, the laser processing controller 32C sets the selected reference wavelength λa as the target wavelength λt used in the preprocessing, sets the determined pulse width ΔTa as the pulse width ΔT used in the preprocessing, and transmits the set data to the laser controller 13C. The reference wavelength λa and the pulse width ΔTa are then used to search for the optimum wavelength λopt. In the search for the optimum wavelength λopt, the wavelength search fluence FLth is determined, and the wavelength search fluence FLth is used to determine the optimum wavelength λopt, as in the first embodiment.

In S1030A, the laser processing controller 32C sets the determined optimum wavelength λopt as the target wavelength λt and performs the final laser processing. In S1050C, the laser processing controller 32C sets the pulse width ΔTa determined in S1020C as the pulse width ΔT and transmits the pulse width ΔT to the laser controller 13C. The pulse width ΔTa is thus used also as the pulse width ΔT in the final processing.

Figure 28:
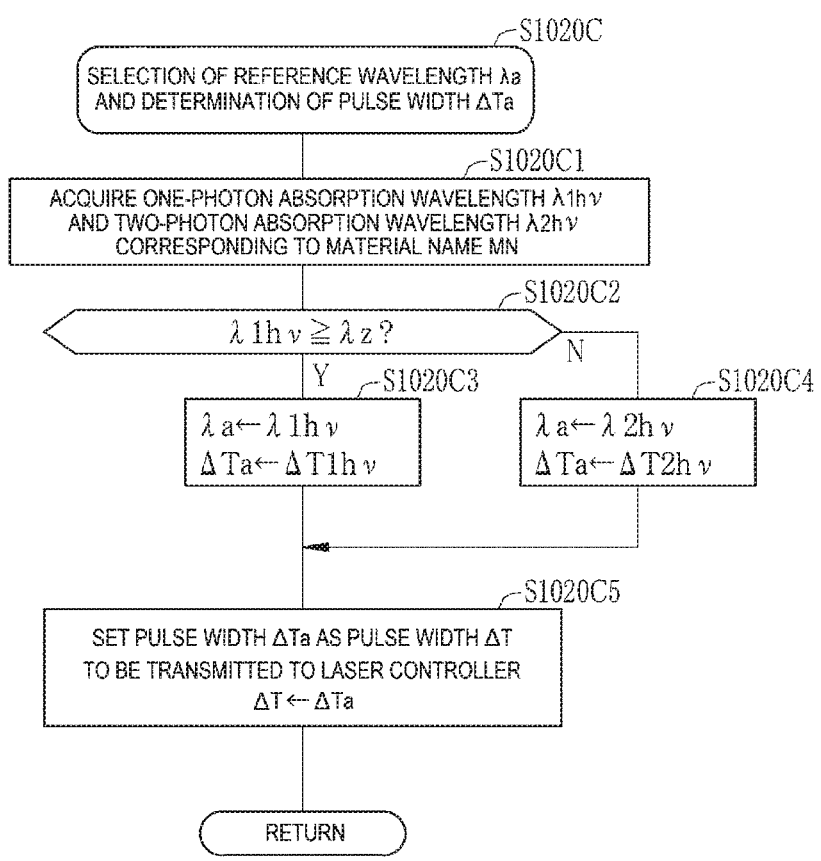
FIG. 28 is a flowchart showing the procedure of selection of a reference wavelength λa and determination of a pulse width ΔTa.

FIG. 28 shows the procedure of the processes in S1020C in FIG. 27. The laser processing controller 32C first refers to the second wavelength selection table 84 to acquire the one-photon absorption wavelength λ1hv and the two-photon absorption wavelength λ2hv as the reference wavelength λa corresponding to the material name in S1021C1. Thereafter, in S1020C2, the laser processing controller 32C evaluates whether or not the one-photon absorption wavelength λ1hv is greater than or equal to a predetermined value λz.

In a case where the one-photon absorption wavelength λ1hv is greater than or equal to the predetermined value λz (Y in S1020C2), the laser processing controller 32C selects the one-photon absorption wavelength λ1hv as the reference wavelength λa in S1020C3. Further, the laser processing controller 32C determines the first pulse width ΔT1hv corresponding to the one-photon absorption wavelength λ1hv as the pulse width ΔTa in S1020C3.

On the other hand, in a case where the one-photon absorption wavelength λ1hv is smaller than the predetermined value λz (N in S1020C2), the laser processing controller 32C selects the two-photon absorption wavelength $\lambda 2hv$ as the reference wavelength $\lambda a$ in S1020C4. Further, the laser processing controller 32C determines the second pulse width $\Delta T2hv$ corresponding to the two-photon absorption wavelength $\lambda 2hv$ as the pulse width $\Delta Ta$ in S1020C4. In S102005, the laser processing controller 32C sets the pulse width $\Delta Ta$ as the pulse width $\Delta T$ to be transmitted to the laser controller 13C.

The predetermined value $\lambda z$ is, for example, 220 nm. The wavelength of 220 nm is located between the one-photon absorption wavelengths $\lambda 1hv$ for diamond and $SiO_2$ in the second wavelength selection table 84. The laser processing controller 32C therefore selects the one-photon absorption wavelength $\lambda 1hv$ as the reference wavelength $\lambda a$ in a case where the material of the workpiece 41 is diamond, whereas selecting the two-photon absorption wavelength $\lambda 2hv$ as the reference wavelength $\lambda a$ in a case where the material of the workpiece 41 is $SiO_2$. In the case where the predetermined value $\lambda z$ is 220 nm, the hatched absorption wavelengths are selected in accordance with the material as the candidates of the reference wavelength $\lambda a$ in the second wavelength selection table 84.

The second pulse width $\Delta T2hv$ is shorter than the first pulse width $\Delta T1hv$. For example, the first pulse width $\Delta T1hv$ is so set as to fall within the range 1 ns $\leq \Delta T1hv \leq 50$ ns, and the second pulse width $\Delta T2hv$ is so set as to fall within the range 0.01 ns $\leq \Delta T2hv \leq 1$ ns.

Figure 29:
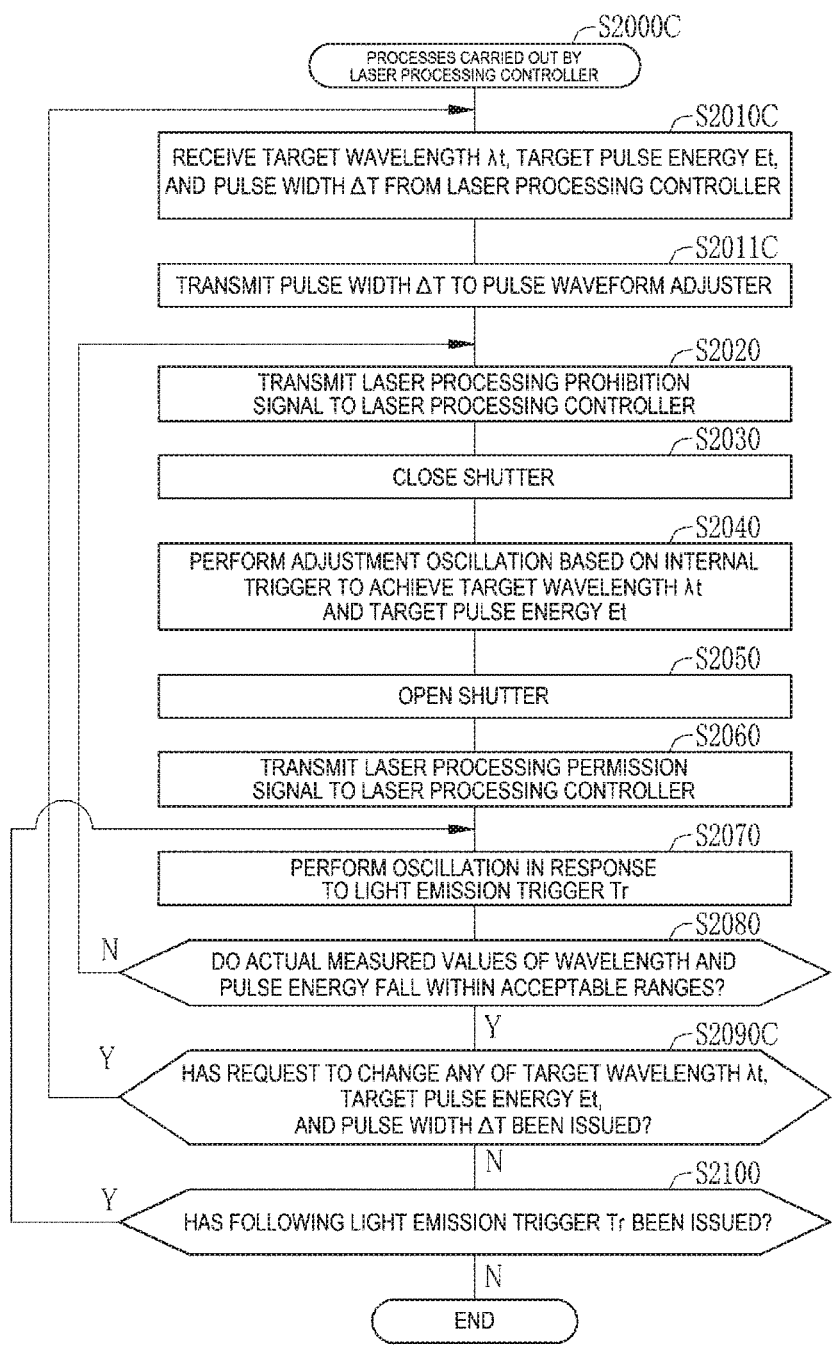
FIG. 29 is a flowchart showing the procedure of processes carried out by a laser controller in the third embodiment.
Figure 30:
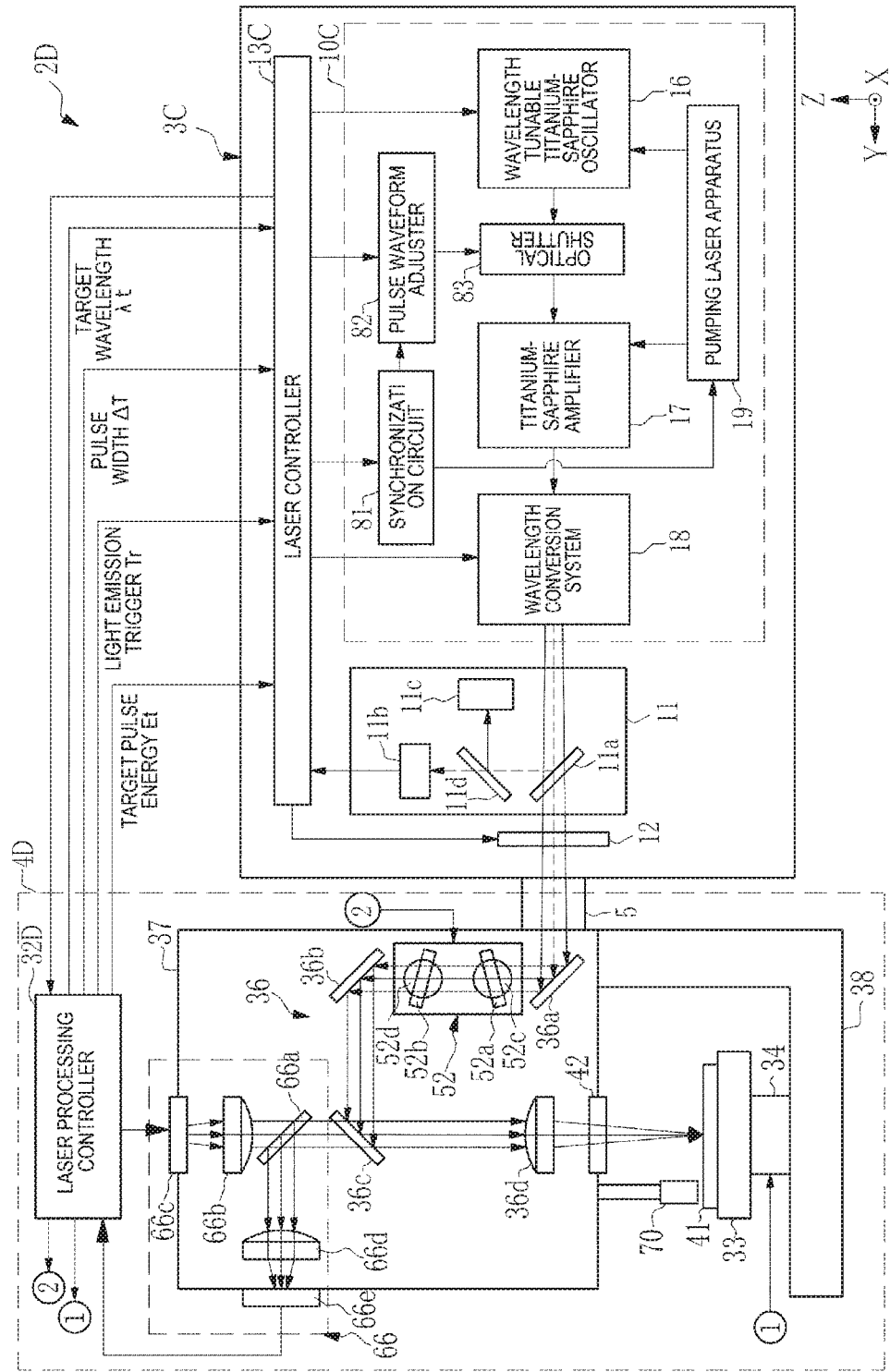
FIG. 30 schematically shows the configuration of a laser processing system according to a fourth embodiment.

S2000C shown in FIG. 29 is the flowchart showing the procedure of processes carried out by the laser controller 13C in the third embodiment. The procedure of the processes in S2000C is similar to the procedure of the processes in S2000 in Comparative Example shown in FIG. 4. S2000C differs from S2000 in that steps S2010 and S2090 shown in FIG. 4 are changed to S2010C and S2090C, respectively, and S2011C is added in association with the transmission of the pulse width $\Delta T$ from the laser processing controller 32C. The laser processing controller 32C receives the pulse width $\Delta T$ in addition to the target wavelength $\lambda$ and the target pulse energy Et in S2010C. In S2011C, the received pulse width $\Delta T$ is transmitted to the pulse waveform adjuster 82. In S2090C, the laser processing controller 32C waits for a request to change the pulse width $\Delta T$ in addition to the target wavelength $\lambda$ and the target pulse energy Et.

5.3 Effects

In the third embodiment, in the case where the one-photon absorption wavelength $\lambda 1hv$ is smaller than the predetermined value $\lambda z$, the laser processing controller 32C selects the two-photon absorption wavelength $\lambda 2hv$ as the reference wavelength $\lambda a$. In a case where the bandgap of the material of the workpiece 41 is relatively small and the one-photon absorption wavelength $\lambda 1hv$ is long, the pulsed laser light outputted from the solid-state laser apparatus 10 can be the second harmonic light (325 to 550 nm) or the third harmonic light (217 to 367 nm). The second or third harmonic light, which is produced at relatively high wavelength conversion efficiency, can ensure high pulse energy. High pulse energy allows efficient photon absorption, whereby the processing speed PS is improved.

In contrast, in a case where the bandgap of the material of the workpiece 41 is relatively large and the one-photon absorption wavelength $\lambda 1hv$ is short, the fourth harmonic light (162 to 275 nm) is used as the pulsed laser light outputted from the solid-state laser apparatus 10. The fourth harmonic light is produced at wavelength conversion efficiency lower than the efficiency at which the second or third harmonic light is produced, resulting in a decrease in the pulse energy. Low pulse energy does not allow efficient photon absorption, whereby the processing speed PS decreases.

Therefore, in the case where the one-photon absorption wavelength $\lambda 1hv$ is short, selection of the two-photon absorption wavelength $\lambda 2hv$ as the reference wavelength $\lambda a$ in place of the one-photon absorption wavelength $\lambda 1hv$ allows use of the second or third harmonic light. The wavelength conversion efficiency is thus improved, whereby the processing speed PS can also be improved. It is, however, noted that the two-photon absorption requires simultaneous absorption of two photons, and that the absorption efficiency is therefore lower than in the one-photon absorption. Therefore, in the case where the two-photon absorption wavelength $\lambda 2hv$ is selected, the laser processing controller 32C determines the second pulse width $\Delta T2hv$, which is shorter than the first pulse width $\Delta T1hv$, as the pulse width $\Delta Ta$. Improvement in the absorption efficiency in the two-photon absorption is thus expected. Further, in the case where the two-photon absorption wavelength $\lambda 2hv$ is selected to improve the absorption efficiency in the two-photon absorption, the peak power of the pulsed laser light is preferably increased as compared with the case where the one-photon absorption wavelength $\lambda 1hv$ is selected.

5.4 Variation

The above example has been described with reference to the case where the search for the optimum wavelength $\lambda$opt in S1021C shown in FIG. 27 is performed by using the scheme in the first embodiment, in which the wavelength search fluence FLth is used. The search may instead be performed by using the scheme in the second embodiment, in which no wavelength search fluence FLth is used. In this case, the laser processing apparatus 4C is provided with the processed depth measurer 70, as the laser processing apparatus 4B in the second embodiment is.

6. Laser Processing System According to Fourth Embodiment 6.1 Configuration

A laser processing system 2D shown in FIGS. 30 to 36 according to a fourth embodiment includes the laser apparatus 3C and a laser processing apparatus 4D. The laser processing system 2D differs from the laser processing system 2C according to the third embodiment shown in FIG. 25 in that the laser processing apparatus 4C is replaced with the laser processing apparatus 4D. The other points of the laser processing system 2D according to the fourth embodiment are the same as those of the laser processing system 2C according to the third embodiment.

The laser processing apparatus 4D includes the processed depth measurer 70. Further, the laser processing apparatus 4D includes a laser processing controller 32D in place of the laser processing controller 32C of the laser processing apparatus 4C. The laser processing controller 32D also functions as the wavelength selection section, which selects the two-photon absorption wavelength $\lambda 2hv$ as the reference wavelength Xa in the case where the one-photon absorption wavelength $\lambda 1hv$ is smaller than the predetermined value $\lambda z$, as the laser processing controller 32C does. The second wavelength selection table 84 is used also in the fourth embodiment. The second wavelength selection table 84 is stored, for example, in an internal memory of the laser processing controller 32D, as in the laser processing controller 32C.

Further, the laser processing controller 32D functions as the pulse width setting section, as the laser processing controller 32C does. That is, the laser processing controller 32D sets the first pulse width $\Delta T1hv$ as the pulse width $\Delta Ta$ in the case where the one-photon absorption wavelength $\lambda 1hv$ is selected and sets the second pulse width $\Delta T2hv$ as the pulse width $\Delta Ta$ in the case where the two-photon absorption wavelength $\lambda 2hv$ is selected. In addition, the laser processing controller 32D functions as an optimum pulse width determination section that determines an optimum pulse width $\Delta Topt$ used in the final processing out of pulse widths within a predetermined range containing the pulse width $\Delta Ta$ by using the set pulse width $\Delta T$ as a reference pulse width.

6.2 Operation

Figure 31:
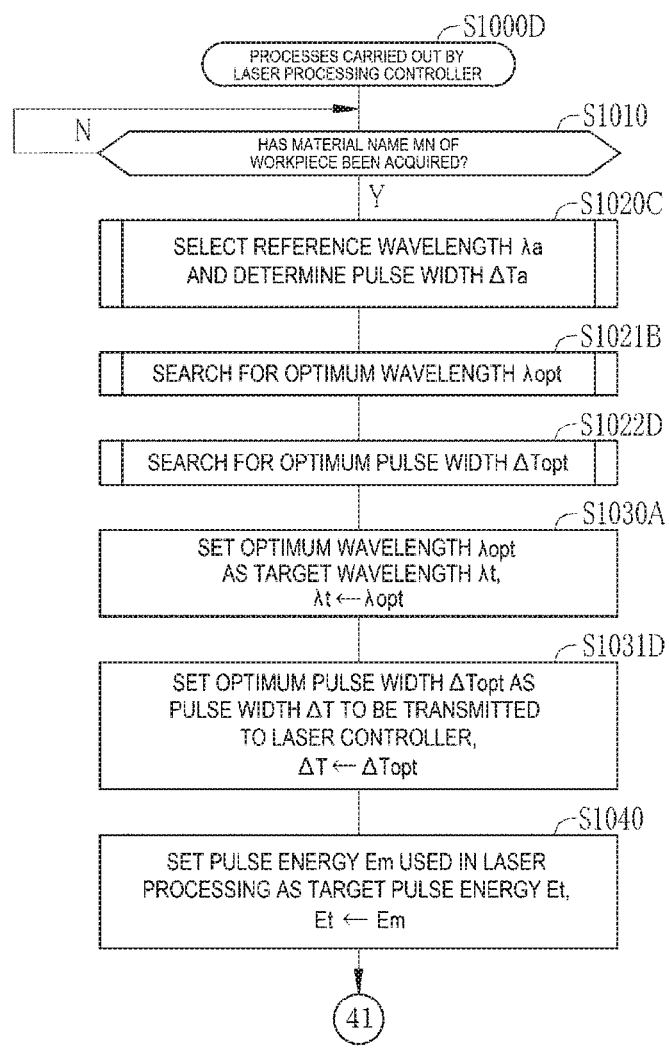
FIG. 31 is the first half of a flowchart showing the procedure of processes carried out by a laser processing controller in the fourth embodiment.
Figure 32:
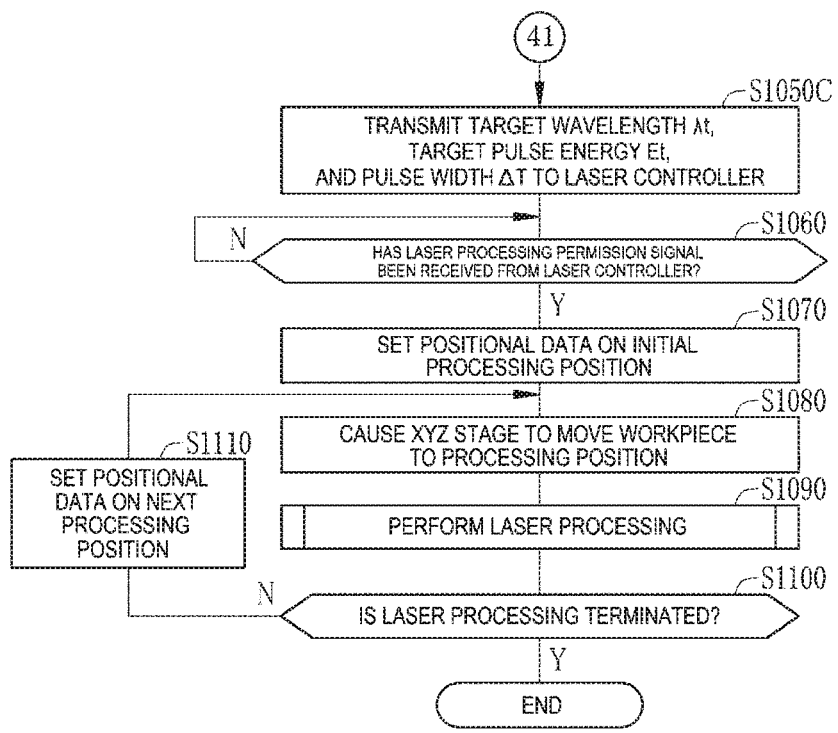
FIG. 32 is the second half of the flowchart showing the procedure of the processes carried out by the laser processing controller in the fourth embodiment.

The flowchart of S1000D in the fourth embodiment shown in FIGS. 31 and 32 shows the procedure of processes carried out by the laser processing controller 32D in the fourth embodiment. The same steps as step S1000B shown in FIG. 18 and S1000C in the third embodiment shown in FIG. 27 will not be described, and the differences therefrom will be primarily described below.

In S1000D in the fourth embodiment, the laser processing controller 32D selects the reference wavelength $\lambda a$ and determines the pulse width $\Delta Ta$ in S1020C, as shown in FIG. 31, as in S1000C in the third embodiment shown in FIG. 27. The laser processing controller 32D searches for the optimum wavelength $\lambda opt$ in S1021B, as in S1000B in the second embodiment shown in FIG. 18.

In addition, the laser processing controller 32D determines in S1022D, by using the pulse width $\Delta Ta$ determined in S1020C as the reference pulse width, the optimum pulse width $\Delta Topt$ used in the final processing out of the pulse widths within the predetermined range containing the reference pulse width.

The laser processing controller 32D sets in S1031D the optimum pulse width $\Delta Topt$ as the pulse width $\Delta T$ to be transmitted to the laser controller 13C. Thereafter, in S1050C shown in FIG. 32, the laser processing controller 32D transmits the pulse width $\Delta T$ set at the optimum pulse width $\Delta Topt$ in addition to the target wavelength $\lambda t$ set at the optimum1 wavelength $\lambda opt$ to the laser controller 13C. As a result, in S1090 in FIG. 32, the laser processing is performed with the pulsed laser light having the optimum wavelength $\lambda opt$ and the optimum pulse width $\Delta Topt$.

Figure 33:
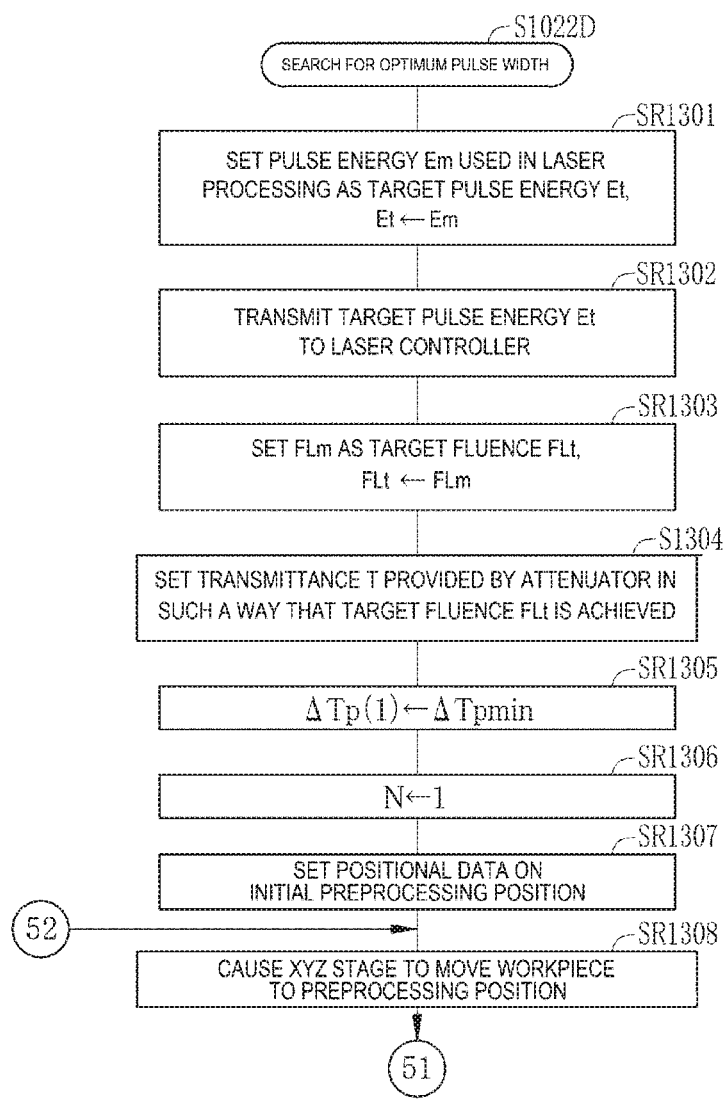
FIG. 33 is the first half of a flowchart showing the procedure of search for an optimum pulse width.
Figure 34:
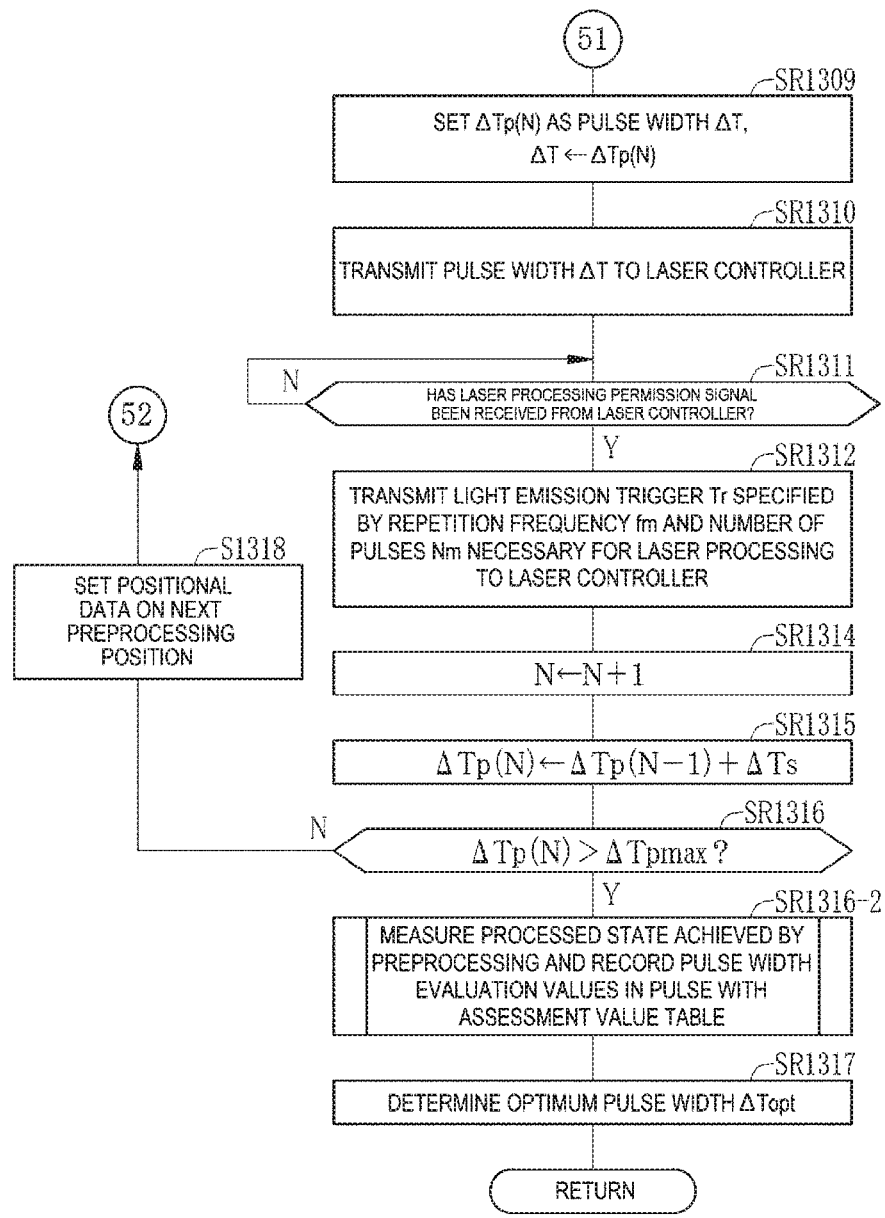
FIG. 34 is the second half of the flowchart showing the procedure of search for the optimum pulse width.

FIGS. 33 and 34 show the procedure of processes of searching for the optimum pulse width $\Delta Topt$ in S1022D. In the search for the optimum pulse width $\Delta Topt$ in S1022D in FIG. 33, the laser processing controller 32D uses the fluence FLm used in the final laser processing to perform pulse width search preprocessing, as in S1021B in the second embodiment shown in FIGS. 19 and 20.

S1022D shown in FIG. 31 in the fourth embodiment is similar in terms of overall process flow to S1021B in the second embodiment shown in FIGS. 19 and 20, although the optimum pulse width $\Delta Topt$ is determined in S1022D whereas the optimum wavelength $\Delta opt$ is determined in S1021B.

The laser processing controller 32D first sets in SR1301 the pulse energy Em used in the laser processing as the target pulse energy Et and transmits in SR1302 the target pulse energy Et to the laser controller 13C, as shown in FIG. 33. In SR1303, the laser processing controller 32D sets the fluence FLm used in the laser processing as the target fluence FLt. The laser processing controller 32A sets in SR1304 the transmittance T provided by the attenuator 52 in such a way that the target fluence FLt is achieved.

In SR1305, the laser processing controller 32D initializes the value of $\Delta Tp(N)$ used in the pulse width search preprocessing. Specifically, in SR1305, the laser processing controller 32D sets a minimum pulse width $\Delta Tpmin$, which is an initial value, as a first pulse width $\Delta T(1)$ used in the pulse width search preprocessing. Thereafter, in SR1306, the laser processing controller 32D sets the number N of the pulse width $\Delta Tp(N)$ to be used at "1" and selects $\Delta Tp(1)$.

The minimum pulse width $\Delta Tpmin$ is the lower limit of the pulse width range used in the pulse width search preprocessing. The pulse width range used in the pulse width search preprocessing is a predetermined range containing the pulse width $\Delta Ta$ set as the reference pulse width. The minimum pulse width $\Delta Tpmin$ is determined as follows: pulse width $\Delta Ta-\Delta TL$. $\Delta TL$ is the difference between the pulse width $\Delta Ta$ and the minimum pulse width $\Delta Tpmin$.

The laser processing controller 32D sets positional data on an initial preprocessing position in SR1307. The laser processing controller 32D causes the XYZ stage 34 to move the workpiece 41 to the initial preprocessing position based on the set positional data in SR1308.

In SR1309, the laser processing controller 32D sets $\Delta Tp(N)$ as the pulse width $\Delta T$, as shown in FIG. 34. In the case where the number N of $\Delta Tp(N)$ has been set at "1", the minimum pulse width $\Delta Tpmin$, which is the first pulse width $\Delta Tp(1)$, is set as the pulse width $\Delta T$. The laser processing controller 32D then transmits the pulse width $\Delta T$ to the laser controller 13C in SR1310.

The laser processing controller 32D waits for the laser processing permission signal from the laser controller 13 in SR1311. The laser processing controller 32D, when it receives the laser processing permission signal (Y in SR1311), transmits in SR1312 the light emission trigger Tr specified by the repetition frequency fm and the number of pulses Nm necessary for the laser processing to the laser controller 13. The laser apparatus 3 then outputs the pulsed laser light to perform the pulse width search preprocessing in the preprocessing position on the workpiece 41.

When the pulse width search preprocessing is completed for one pulse width $\Delta Tp(N)$, the laser processing controller 32D increments the number N by 1 in SR1314. In SR1315, the laser processing controller 32D sets the value of the pulse width $\Delta Tp(N-1)$ to which $\Delta Ts$ is added as the value of the pulse width $\Delta Tp(N)$. For example, when the preprocessing using $\Delta Tp(1)$ is completed, the N is incremented by 1. When the preprocessing performed on the initial preprocessing position is completed, N=1, so that N is incremented by 1, resulting in N=2. Since N=2, N−1=2−1=1 in SR1315. The value obtained by adding $\Delta Ts$ to the value of $\Delta Tp(1)$ is set as the value of the pulse width $\Delta Tp(2)$. Since the value of $\Delta Tp(1)$ is the minimum pulse width $\Delta Tpmin$, which is the initial value, $\Delta Tp(2)=\Delta Tpmin+\Delta Ts$.

In a case where the value of $\Delta Tp(N)$ set in SR1315 is smaller than or equal to a maximum pulse width $\Delta Tpmax$ (N in SR1316), the laser processing controller 32D sets positional data on a next preprocessing position (SR1318). The maximum pulse width $\Delta Tpmax$ is the upper limit of the pulse width range used in the pulse width search preprocessing. The maximum pulse width $\Delta Tpmax$ is determined as "pulse width $\Delta Ta+\Delta TU$". $\Delta TU$ is the difference between the pulse width $\Delta Ta$ and the maximum pulse width $\Delta Tpmax$.

In SR1316-2, the laser processing controller 32D measures the processed states at the plurality of pulse widths and records the pulse width assessment value in each of the preprocessing positions in a pulse width assessment table 86 shown in FIG. 36. Thereafter, in SR1317, the laser processing controller 32D refers to the pulse width assessment value table 86 to determine the optimum pulse width ΔTopt.

Figure 35:
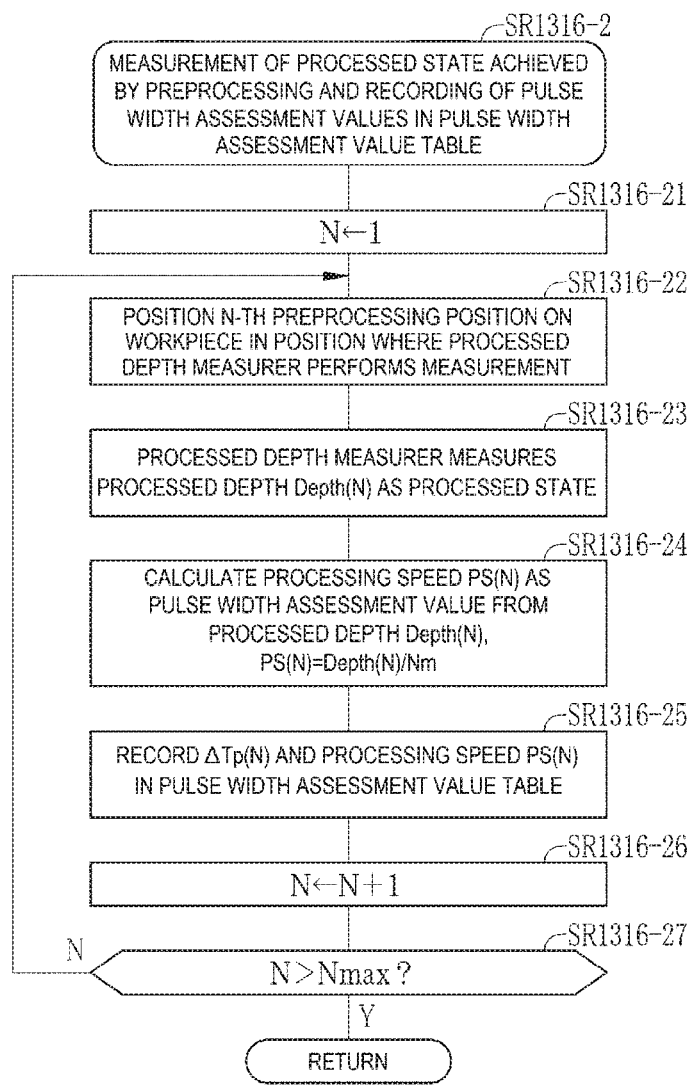
FIG. 35 is a flowchart showing the procedure of measurement of the processed state and recording of a pulse width assessment value.

FIG. 35 is a flowchart showing the procedure of processes in SR1316-2. The procedure in SR1316-2 is roughly the same as the procedure of the processes in SR1216-2 in the second embodiment shown in FIG. 21. The laser processing controller 32D first sets the number N at "1" to initialize the processed depth Depth(N) in SR1316-21, as shown in FIG. 35. In SR1316-22, the laser processing controller 32D positions the N-th preprocessing position on the workpiece 41 in the position where the processed depth measurer 70 performs the measurement. In a case where N=1, the first processing position is positioned in the measurement position. In SR1316-23, the processed depth measurer 70 measures the processed depth Depth(N) as the processed state. In SR1316-24, the processing speed PS(N) is calculated as the pulse width assessment value from the processed depth Depth(N). The processing speed PS(N) is calculated by PS(N)=Depth(N)/Nm, as shown in Expression (1) described above.

In SR1316-25, the laser processing controller 32D records the pulse width ΔTp(N) used in the pulse width preprocessing and the processing speed PS(N) in the pulse width assessment value table 86 with the pulse width ΔTp(N) and the processing speed PS(N) associated with each other, as shown in FIG. 36. In SR1316-26, the laser processing controller 32D increments the number N by "1". In a case where the number N is smaller than or equal to the maximum Nmax (N in SR1316-27), the laser processing controller 32D determines that there is a next preprocessing position. The maximum Nmax is the total number of preprocessing positions to be assessed in terms of processed state. The laser processing controller 32D, when it determines that there is a next preprocessing position, returns to SR1316-22, carries out the processes from SR1316-22 to SR1316-25 again on the next preprocessing position, and records the pulse width assessment value in the next preprocessing position.

The laser processing controller 32D repeats the processes from SR1316-22 to SR1316-26 until the number N exceeds the maximum Nmax (Y in SR1316-27), that is, the processed states in all preprocessing positions are assessed.

In SR1317 in FIG. 34, the laser processing controller 32D refers to the pulse width assessment value table 86 to determine the pulse width ΔTp(N) at which the processing speed PS(N) is maximized as the optimum pulse width ΔTopt.

6.3 Effects

In the fourth embodiment, the laser processing controller 32D changes the pulse width of the pulsed laser light and performs the pulse width search preprocessing at a plurality of pulse widths and measures the processed state on a pulse width basis, assesses the process state on a pulse width basis, and determines the optimum pulse width ΔTopt. Therefore, the laser processing can be performed at the optimum pulse width ΔTopt in addition to the optimum wavelength λopt, whereby further improvement in the photon absorption efficiency and improvement in processing speed PS can be expected. In particular, the present example is effective because the absorption efficiency in the two-photon absorption is lower than that in the one-photon absorption.

7. Specific Example of Wavelength Tunable Laser Apparatus 7.1 Configuration

Figure 37:
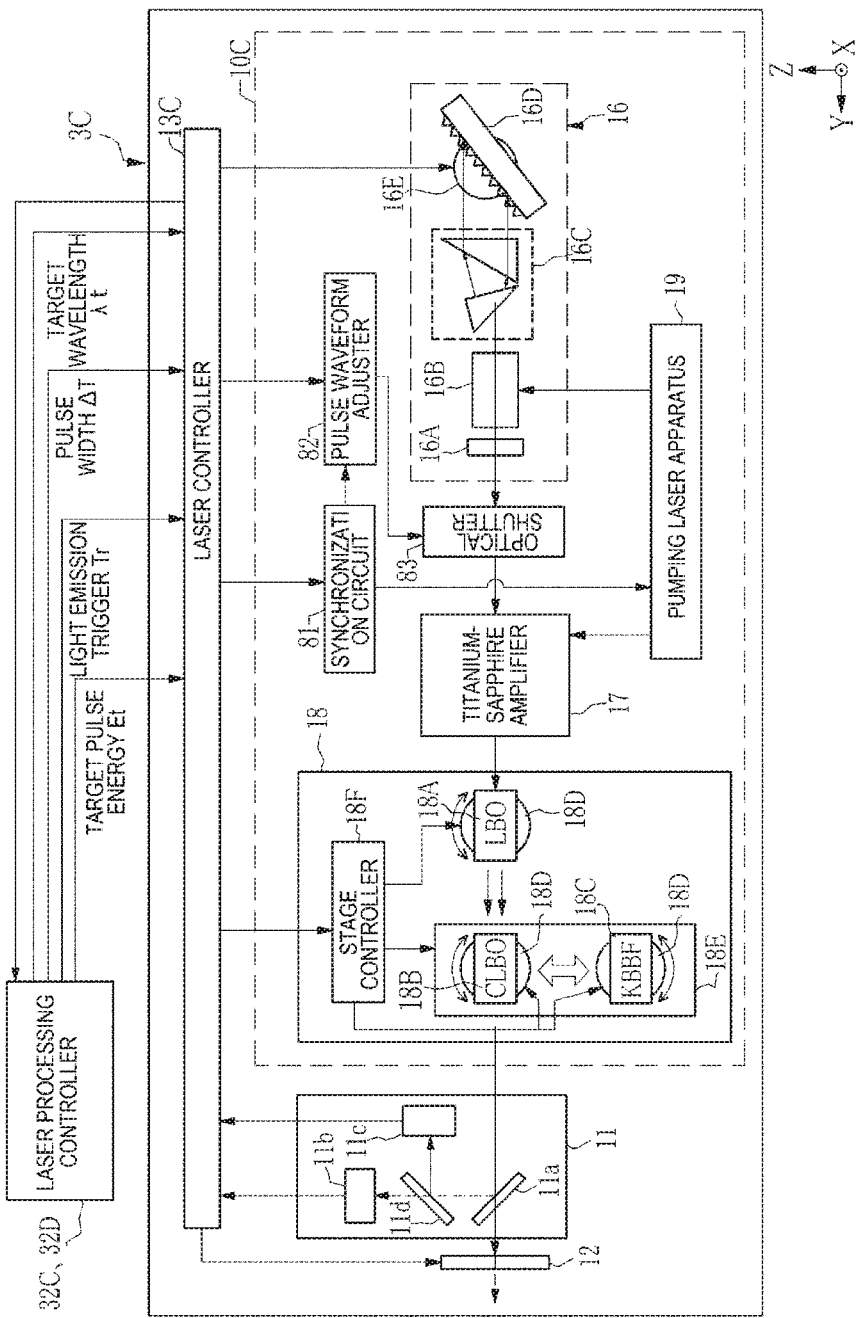
FIG. 37 is a descriptive diagram showing a specific example of a wavelength tunable laser apparatus.

FIG. 37 shows a specific example of the laser apparatus 3C, which is the wavelength tunable laser apparatus used in the third and fourth embodiments. The laser apparatus 3C includes the solid-state laser apparatus 10C, the monitor module 11, and the laser controller 13C, as described above.

In the solid-state laser apparatus 10C, the wavelength tunable titanium-sapphire oscillator 16 includes an output coupling mirror 16A, a titanium-sapphire crystal 16B, a beam expander 16C, a grating 16D, and a rotary stage 16E.

The output coupling mirror 16A and the grating 16D form an optical resonator. The output coupling mirror 16A is coated with a film that partially reflects light that belongs to the wavelength range from about 650 to 1100 nm. The titanium-sapphire crystal 16B and the beam expander 16C are disposed in the optical path of the optical resonator.

The beam expander 16C includes a prism and is so disposed as to increase the beam width of the light having exited out of the titanium-sapphire crystal 16B and causes the expanded light to be incident on the grating 16D. Further, the beam expander 16C reduces the beam width of the light reflected off the grating 16D and causes the reflected light to return to the titanium-sapphire crystal 16B and the output coupling mirror 16A.

The grating 16D is so configured that the substance of the surface thereof is made of a high-reflectance material and a large number of grooves are formed in the surface at predetermined intervals. The grating 16D is a dispersive optical element. The grooves each have, for example, a right-angled triangular cross-sectional shape. The light incident from the beam expander 16C on the grating 16D is reflected off the grooves and diffracted in the direction according to the wavelength of the light. The grating 16D is so disposed in a Littrow arrangement that the angle of incidence of the light incident from the beam expander 16C on the grating 16D coincides with the angle of diffraction of the diffracted light having a desired wavelength. The light having a wavelength close to the desired wavelength therefore returns to the titanium-sapphire crystal 16B and the output coupling mirror 16A via the beam expander 16C.

The rotary stage 16E supports the grating 16D and rotates around the axis X to change the angle of incidence of the light incident on the grating 16D. Rotating the grating 16D allows selection of the wavelength of the light that returns from the grating 16D to the output coupling mirror 16A via the beam expander 16C.

The optical shutter 83 is disposed in the optical path between the wavelength tunable titanium-sapphire oscillator 16 and the titanium-sapphire amplifier 17. The optical shutter 83 includes the EO Pockels cell, the polarizer, and the power source that applies high voltage to the EO Pockels cell, as described above. The titanium-sapphire amplifier 17 includes a titanium-sapphire crystal and a plurality of mirrors that are not shown. The pulsed laser light so shaped by the optical shutter 83 as to have a pulse waveform enters the titanium-sapphire amplifier 17. In the titanium-sapphire amplifier 17, the plurality of mirrors that are not shown are so disposed as to cause the pulsed laser light to pass through the titanium-sapphire crystal multiple times.

The wavelength conversion system 18 includes three nonlinear crystals, an LBO ($LiB_3O_5$) crystal 18A, a CLBO ($CsLiB_6O_{10}$) crystal 18B, and KBBF ($KBe_2BO_3F_2$) crystal 18C, a plurality of rotary stages 18D, a uniaxial stage 18E, and a stage controller 18F. The rotary stages 18D support the LBO crystal 18A, the CLBO crystal 18B, and the KBBF crystal 18C. The rotary stages 18D rotate around the axis X to rotate the crystals 18A, 18B, and 18C.

The uniaxial stage 18E supports the CLBO crystal 18B and the KBBF crystal 18C with the rotary stages 18D and moves the CLBO crystal 18B and the KBBF crystal 18C in the Z-axis direction. The uniaxial stage 18E is movable between an insertion position where the CLBO crystal 18B or the KBBF crystal 18C is inserted into the output optical path of the LBO crystal 18A and a retraction position where the two nonlinear crystals are retracted from the output optical path. The stage controller 18F controls the rotation of the rotary stages 18D and the movement of the uniaxial stage 18E.

The pumping laser apparatus 19 outputs second harmonic light from a YLF laser that forms the excitation pulsed laser light. A beam splitter that is not shown is disposed in the output optical path of the pumping laser apparatus 19. The beam splitter splits the excitation pulsed laser light and causes one split excitation pulsed laser light to enter the wavelength tunable titanium-sapphire oscillator 16 and the other split excitation pulsed laser light to enter the titanium-sapphire amplifier 17.

7.2 Operation

The laser controller 13C receives data on the target wavelength $\lambda t$, the target pulse energy Et, the pulse width $\Delta T$, and the light emission trigger Tr from the laser processing controller 32C. The laser controller 13C closes the shutter 12 and transmits the laser processing prohibition signal to the laser processing controller 32C. The laser controller 13C transmits the data on the pulse width $\Delta T$ to the pulse waveform adjuster 82.

The laser controller 13C transmits the data on the target wavelength $\lambda t$ to the stage controller 18F. The stage controller 18F selects the CLBO crystal 18B or the KBBF crystal 18C to be used based on the target wavelength $\lambda t$ and controls the uniaxial stage 18E to insert the crystal to be used into the output optical path of the LBO crystal 18A. Further, the stage controller 18F determines the angle of incidence of the light incident on the LBO crystal 18A and the angle of incidence of the light incident on the nonlinear crystal to be used out of the CLBO crystal 18B and the KBBF crystal 18C based on the target wavelength $\lambda t$ and controls the rotary stages 18D in such a way that the determined angles of incidence are achieved.

The stage controller 18F selects the nonlinear crystal to be used in accordance with the wavelength range to which the target wavelength $\lambda t$ belongs, for example, as follows: First, in a case where a target wavelength $\lambda t$ within the wavelength range of the second harmonic light (325 to 550 nm) is selected, only the LBO crystal 18A is used. In this case, the stage controller 18F moves the uniaxial stage 18E to the retracted position to retract both the CLBO crystal 18B and the KBBF crystal 18C from the output optical path of the LBO crystal 18A.

Second, in a case where a target wavelength $\lambda t$ within the wavelength range of the third harmonic light (217 to 367 nm) is selected, the LBO crystal 18A and the CLBO crystal 18B are used. In this case, the stage controller 18F moves the uniaxial stage 18E to the insertion position where the CLBO crystal 18B is inserted. Third, in a case where a target wavelength $\lambda t$ within the wavelength range of the fourth harmonic light (162 to 275 nm) is selected, the KBBF crystal 18C is used. The stage controller 18F moves the uniaxial stage 18E to the insertion position where the KBBF crystal 18C is inserted.

The laser controller 13C transmits an initial value of the pulse energy to the pumping laser apparatus 19. In the description, any of the first harmonic light to the third harmonic light is referred to as an m-th harmonic light. In a case where the wavelength of the m-th harmonic light is selected as the target wavelength $\lambda t$, the laser controller 13C controls the rotary stage 16E in such a way that the wavelength tunable titanium-sapphire oscillator 16 performs laser oscillation at a wavelength close to the target wavelength $\lambda t$ multiplied by m to adjust the angle of incidence of the light incident on the grating 16D.

The laser controller 13C transmits the internal light emission trigger that is not shown to the synchronization circuit 81. The synchronization circuit 81 outputs the first trigger to the pumping laser apparatus 19 in synchronization with the internal light emission trigger and outputs the second trigger after the delay of the predetermined period with respect to the first trigger to the pulse waveform adjuster 82. The excitation pulsed laser light from the pumping laser apparatus 19 enters the titanium-sapphire crystals of the wavelength tunable titanium-sapphire oscillator 16 and the titanium-sapphire amplifier 17. The titanium-sapphire crystals are thus excited.

Since the angle of incidence of the light incident on the grating 16D has been set at the angle corresponding to the target wavelength $\lambda t$ multiplied by m, the wavelength tunable titanium-sapphire oscillator 16 outputs pulsed laser light having a wavelength multiplied by about $\lambda t \cdot m$. The pulses of the pulsed laser light are so shaped by the optical shutter 83 that the pulses each have the pulse width $\Delta T$. The pulsed laser light having undergone the pulse shaping is so amplified by the titanium-sapphire amplifier 17 that the pulsed laser light passes through the titanium-sapphire crystal multiple times. The amplified pulsed laser light is converted by the wavelength conversion system 18 into pulsed laser light that is the m-th harmonic light, and the wavelength conversion system 18 outputs the converted pulsed laser light.

The laser controller 13C detects an actual measured value E of the pulse energy of the pulsed laser light having undergone the wavelength conversion with the optical sensor 11b of the monitor module 11. The laser controller 13C controls the pulse energy of the excitation pulsed laser light outputted from the pumping laser apparatus 19 in such a way that the difference $\Delta E$ between the actual measured value E and the target pulse energy Et or $\Delta E = E - Et$ approaches "0".

Further, the laser controller 13C detects an actual measured value $\lambda$ of the wavelength of the pulsed laser light having undergone the wavelength conversion with the wavelength monitor 11c of the monitor module 11. The laser controller 13C controls the angle of incidence of the light incident on the grating 16D of the wavelength tunable titanium-sapphire oscillator 16 via the rotary stage 16E in such a way that the difference $\Delta X$ between the actual measured value $\lambda$ and the target wavelength $\lambda t$, that is, $\Delta X = \lambda - \lambda t$, approaches "0". Further, when $\Delta E$ and $\Delta \lambda$ each falls within an acceptable range, the laser controller 13C stops issuing the internal light emission trigger and opens the shutter 12.

The laser controller 13C transmits the laser processing permission signal to the laser processing controller 32C. The laser controller 13C inputs the light emission trigger Tr from the laser processing controller 32C to the synchronization circuit 81. As a result, the pulsed laser light having the pulse width $\Delta T$, the target wavelength $\lambda t$, and the target pulse energy Et enters the laser processing apparatus 4C.

7.3 Variation

Consider a case where the synchronization circuit 81, the pulse waveform adjuster 82, and the optical shutter 83 are removed from the laser apparatus 3C shown in FIG. 37. The resultant laser apparatus can be used as the laser apparatus 3 in each of Comparative Example shown in FIG. 1, the first embodiment shown in FIG. 6, and the second embodiment shown in FIG. 16. In this case, since the laser apparatus outputs pulsed laser light having a pulse width ranging from 1 nanosecond to several tens of nanoseconds, there is almost no proportion of the two-photon absorption.

The laser apparatus 3C, which is a wavelength tunable laser apparatus, includes the wavelength tunable titanium-sapphire oscillator 16, the titanium-sapphire amplifier 17, and the wavelength conversion system 18 by way of example, as shown in FIG. 37, but not necessarily. The laser apparatus only needs to be capable of wavelength conversion over a range from about 200 to 500 nm or part of the range. Other examples of the wavelength tunable laser apparatus may include the short-pulse wavelength tunable Raman laser apparatus described in JP-A-2002-273581 and a wavelength tunable laser apparatus using an optical parametric oscillator (OPO).

8. Variation of Laser Processing Apparatus

8.1 Configuration

The laser processing apparatus according to each of the above embodiments has been described with reference to the case where the laser processing apparatus includes an optical system that functions as the light collection optical system. Instead, the laser processing apparatus may include an optical system 93, which functions as a transfer optical system capable of transferring an image onto the workpiece 41, such as a laser processing apparatus 4E shown in FIG. 38. The optical system 93 includes a beam homogenizer 91, a variable slit 92, and a transfer lens 94. The transfer lens 94 is a chromatic aberration correction lens that is formed of the combination of a plurality of lenses made of different glass materials and is capable of chromatic aberration correction over the wavelength tunable range of the wavelength tunable laser apparatus. A combined lens formed of a synthetic quartz lens and a $CaF_2$ crystal lens is, for example, used as the plurality of lenses.

The beam homogenizer 91 and the variable slit 92 are disposed in the optical path between the high-reflectance mirrors 36b and 36c. The beam homogenizer 91 includes a fly-eye lens 91a and a condenser lens 91b. The beam homogenizer 91 is so disposed as to homogenize the optical intensity distribution of the pulsed laser light reflected off the high-reflectance mirror 36b to perform Keller illumination on the variable slit 92. The variable slit 92 has a light transmissive slit and can change the size of the slit. The variable slit 92 can adjust the size of the slit in accordance with the dimension to which the workpiece 41 is processed. The size of the slit of the variable slit 92 is controlled by the laser processing controller 32A.

The laser processing apparatus 4E includes an observation apparatus 96 in place of the observation apparatus 66. The observation apparatus 96 is so configured that the collimator lens 66b and the image forming lens 66d are removed from the configuration of the observation apparatus 66. The image sensor 66e is disposed in the position where an image of the processed surface is formed by the transfer lens 94.

8.2 Operation

The pulsed laser light reflected off the high-reflectance mirror 36b is spatially homogenized by the beam homogenizer 91 in terms of optical intensity and is incident on the variable slit 92. When the pulsed laser light passes through the slit of the variable slit 92, image light according to the shape of the slit is formed. The image light enters the transfer lens 94 via the high-reflectance mirror 36c. The transfer lens 94 forms a slit image according to the shape of the slit of the variable slit 92 via a window 42A on the surface of the workpiece 41 to transfer the slit image. The shape of the processed surface of the workpiece 41 can thus be the shape according to the slit of the variable slit 92.

The transfer lens 94 illuminates the processed surface of the workpiece 41 with the illumination light outputted from the illumination light source 66c via the half-silvered mirror 66a and the high-reflectance mirror 36c. The light with which the processed surface is illuminated is reflected off the processed surface, and the transfer lens 94 focuses the reflected light onto the image sensor 66e via the high-reflectance mirror 36c and the half-silvered mirror 66a. As a result, the processed state of the processed surface of the workpiece 41 can be measured with the image sensor 66e.

In the present example, a mask having a plurality of holes each having a desired shape may, for example, be placed in place of the variable slit 92. In this case, a plurality of holes can be simultaneously formed in the surface of the workpiece 41.

9. Reflective Optical System

The above embodiments have been described with reference to the case where the optical systems that function as the light collection optical system and the transfer optical system are each formed of a lens, such as the light collection lens 36d and the transfer lens 94. The optical systems do not each necessarily use a lens and may instead each be a reflective optical system.

9.1 Reflective Light Collection Optical System

Figure 39:
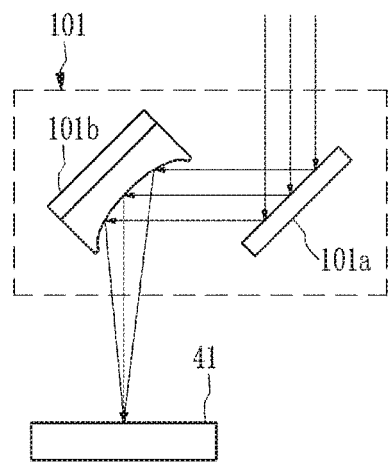
FIG. 39 describes a reflective light collection optical system.

A reflective light collection optical system 101 shown in FIG. 39 can be used in place of the light collection lens 36d. The light collection optical system 101 includes a flat mirror 101a and a concave mirror 101b, which has an off-axis paraboloid. The light collection optical system 101 collects light based on reflection performed by the flat mirror 101a and the concave mirror 101b. The flat mirror 101a and the concave mirror 101b each have a reflection surface on which a high-reflectance coating that reflects light that belongs to the wavelength tunable range of the wavelength tunable laser apparatus is provided. The high-reflectance coating is, for example, an $MgF_2$ coating on an Al film or a coating formed of a dielectric multilayer film having high reflectance to some extent over the wavelength tunable range of the wavelength tunable laser apparatus.

The light collection optical system 101, which is a reflective optical system using no lens, is not affected by the chromatic aberrations even when the wavelength of the pulsed laser light outputted from the wavelength tunable laser apparatus 3 changes. Further, the light collection optical system 101 produces only a small amount of optical loss, such as Fresnel loss, and therefore provides excellent light collection efficiency. In the case where the observation apparatus 66 is used, visible illumination light enters the light collection optical system 101, but the illumination light is also not affected by the chromatic aberrations and excellent light collection efficiency is also provided, as in the case of the pulsed laser light. In the case where the wavelength is changed, as in a wavelength tunable laser apparatus, the effects of the chromatic aberrations are not negligible in some cases. The reflective light collection optical system 101 is therefore particularly effective when used in a wavelength tunable laser apparatus.

9.2 Reflective Transfer Optical System

Figure 38:
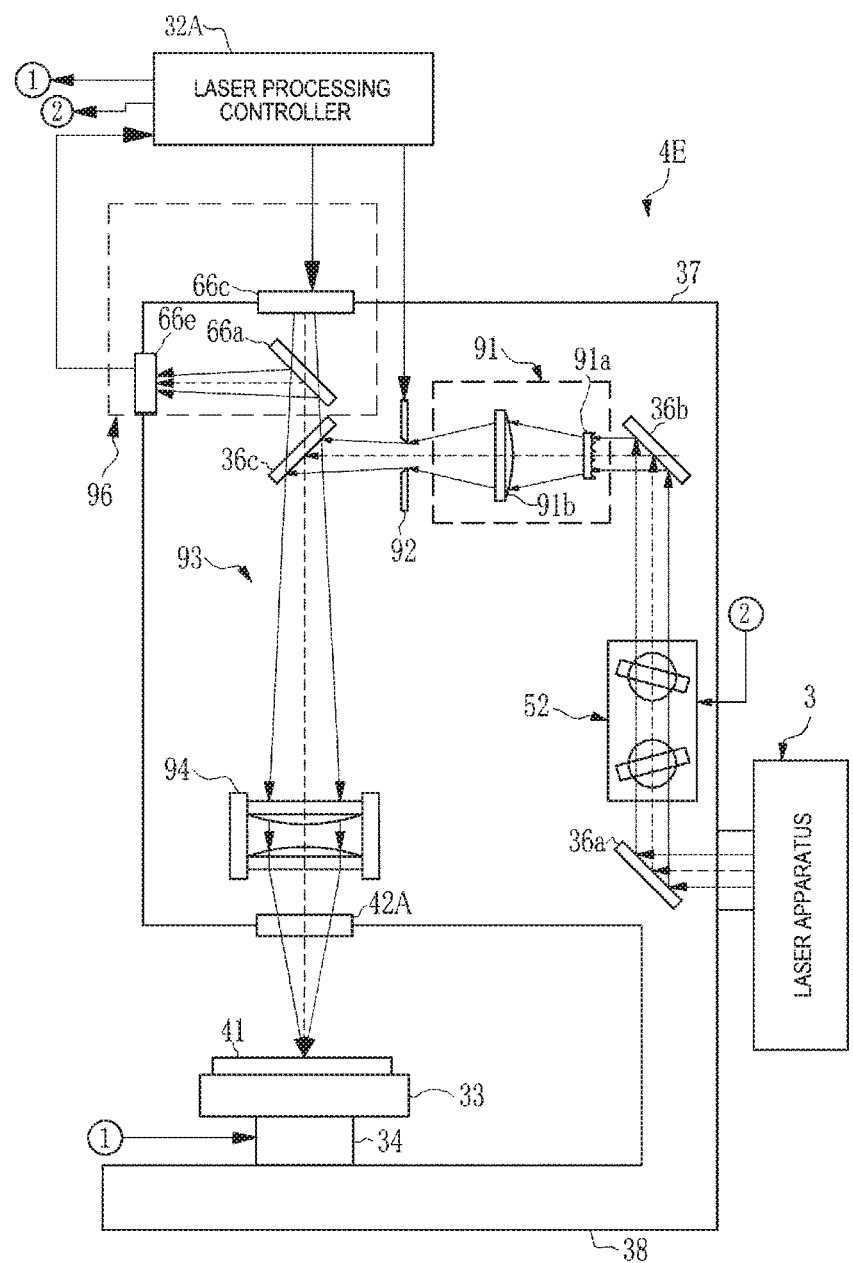
FIG. 38 describes a laser processing apparatus including a transfer optical system.
Figure 40:
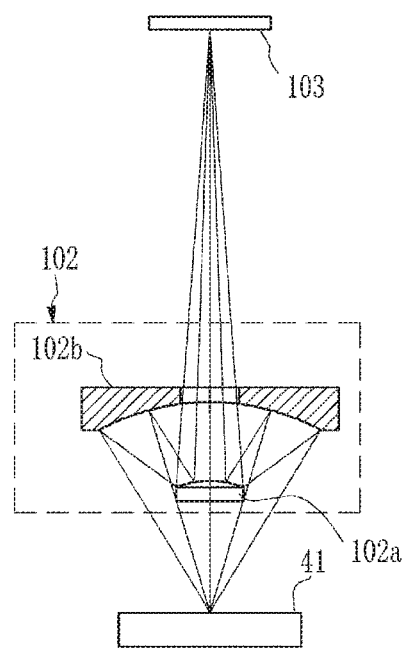
FIG. 40 describes a reflective transfer optical system.

A transfer optical system 102 shown in FIG. 40 can be used in place of the transfer lens 94 shown in FIG. 38. The transfer optical system 102 is an optical system of a known Schwarzschild type and includes a spherical concave mirror 102b having a central opening and a spherical convex mirror 102a. The image light having passed through a mask 103 enters the opening of the spherical concave mirror 102b, is reflected off the spherical convex mirror 102a and the spherical concave mirror 102b, and is focused onto the processed surface of the workpiece 41.

The spherical concave mirror 102b and the spherical convex mirror 102a each have a reflection surface on which a high-reflectance coating that reflects light that belongs to the wavelength tunable range of the wavelength tunable laser apparatus is provided. The high-reflectance coating is, for example, an $MgF_2$ coating on an Al film or a coating formed of a dielectric multilayer film having high reflectance to some extent over the wavelength tunable range of the wavelength tunable laser apparatus.

The transfer optical system 102, which is a reflective optical system using no lens, as the light collection optical system 101 is, is not affected by the chromatic aberrations and also provides excellent light collection efficiency. Further, the reflective transfer optical system 102 is particularly effective when used in a wavelength tunable laser apparatus, as the light collection optical system 101 is.

The above description is intended not to be limiting but merely to be exemplary. It will therefore be apparent for a person skilled in the art that the embodiments of the present disclosure can be changed without departing from the accompanying claims.

The terms used in the entire specification and accompanying claims should each be construed as a "non-limiting" term. For example, the term "include" or "included" should be construed as "does not necessarily include only what is described." The term "have" should be construed as "does not necessarily have only what is described." Further, an indefinite article "a" described in the present specification and the accompanying claims should be construed as a term that means "at least one" or "one or more."

What is claimed is:

1. A laser processing system that irradiates a workpiece with pulsed laser light to perform laser processing on the workpiece, the laser processing system comprising:
   A. a wavelength tunable laser apparatus configured to output the pulsed laser light and be capable of changing a wavelength of the pulsed laser light;
   B. an optical system configured to irradiate the workpiece with the pulsed laser light outputted from the wavelength tunable laser apparatus;
   C. a reference wavelength acquisition section configured to acquire a reference wavelength corresponding to photon absorption according to a material of the workpiece;
   D. a laser processing controller configured to control the wavelength tunable laser apparatus to perform preprocessing before final processing is performed on the workpiece, change the wavelength of the pulsed laser light outputted from the wavelength tunable laser apparatus over a predetermined range containing the reference wavelength, and perform wavelength search preprocessing at a plurality of wavelengths;
   E. a processed state measurer configured to measure a processed state on a wavelength basis achieved by the wavelength search preprocessing performed at the plurality of wavelengths; and
   F. an optimum wavelength determination section configured to assess the processed state on a wavelength basis to determine an optimum wavelength used in the final processing.

2. The laser processing system according to claim 1, wherein the laser processing controller sets the optimum wavelength as a target wavelength of the pulsed laser light outputted from the wavelength tunable laser apparatus when the final processing is performed.

3. The laser processing system according to claim 1, further comprising
   G. a storage section configured to store a wavelength selection table that records the reference wavelength for each material of the workpiece,
   wherein the reference wavelength acquisition section accepts inputted material identification information and refers to the wavelength selection table to acquire the reference wavelength according to the inputted material identification information.

4. The laser processing system according to claim 3, wherein the wavelength selection table records data on a predetermined range containing the reference wavelength, and
   the reference wavelength aquisition section acquires the data on the predetermined range containing the reference wavelength.

5. The laser processing system according to claim 1, wherein the processed state measurer measures as the processed state whether or not at least processing has been performed.

6. The laser processing system according to claim 5, further comprising
   H. a wavelength search fluence determination section configured to determine a fluence of the pulsed laser light on the workpiece, the fluence being a wavelength search fluence used in the wavelength search preprocessing.

7. The laser processing system according to claim 6, wherein the laser processing controller changes the fluence with a target wavelength of the pulsed laser light fixed at the reference wavelength and performs first preprocessing that is fluence determination preprocessing at a plurality of fluences,
   the processed state measurer measures the processed state on a fluence basis achieved by the first preprocessing performed at the plurality of fluences, and
   the wavelength search fluence determination section assesses the processed state for each of the plurality of fluences to determine a maximum of fluences immediately before the processing is performed on the workpiece as the wavelength search fluence.

8. The laser processing system according to claim 7, wherein the laser processing controller performs the wavelength search preprocessing as second preprocessing after the first preprocessing with a target fluence of the pulsed laser light fixed at the wavelength search fluence,
   the processed state measurer measures the processed state on a wavelength basis achieved by the second preprocessing performed at the plurality of wavelengths, and
   the optimum wavelength determination section assesses the processed state on a wavelength basis achieved by the second preprocessing to determine a wavelength at which the processing has been performed as the optimum wavelength.

9. The laser processing system according to claim 1, wherein the processed state measurer is a processed depth measurer that measures a processed depth as the processed state.

10. The laser processing system according to claim 9, wherein the processed depth measurer includes any of a laser microscope, a laser displacement gauge, and an atomic force microscope.

11. The laser processing system according to claim 9, wherein the laser processing controller sets a target fluence of the pulsed laser light as a fluence used in the final process and performs the wavelength search preprocessing, and the optimum wavelength determination section determines a processing speed from a processed depth achieved by the wavelength search preprocessing performed at the plurality of wavelengths and determines a wavelength at which the processing speed is maximized as the optimum wavelength.

12. The laser processing system according to claim 1, wherein the reference wavelength acquisition section acquires a one-photon absorption wavelength that is an absorption wavelength at which one photon is absorbed as the reference wavelength for the material.

13. The laser processing system according to claim 1, wherein the reference wavelength acquisition section acquires a two-photon absorption wavelength that is an absorption wavelength at which two photons are absorbed in addition to the one-photon absorption wavelength as the reference wavelength for the material.

14. The laser processing system according to claim 13, wherein the wavelength tunable laser apparatus outputs the pulsed laser light having a variable pulse width.

15. The laser processing system according to claim 14, further comprising:
I. a wavelength selection section configured to select the two-photon absorption wavelength as the reference wavelength used in the preprocessing in a case where the one-photon absorption wavelength is smaller than a predetermined value; and
J. a pulse width setting section configured to set as the pulse width a second pulse width, which is narrower than a first pulse width set when the one-photon absorption wavelength is selected, in a case where the two-photon absorption wavelength is selected.

16. The laser processing system according to claim 15, further comprising

K. an optimum pulse width determination section configured to determine an optimum pulse width used in the final processing, based on a reference pulse width that is the pulse width set by the pulse width setting section, from a predetermined range containing the reference pulse width.

17. The laser processing system according to claim 16, wherein the laser processing controller changes the pulse width of the pulsed laser light outputted from the wavelength tunable laser apparatus over a predetermined range containing the reference pulse width and performs pulse width search preprocessing at a plurality of pulse widths, the processed state measurer measures the processed state on a pulse width basis achieved by the pulse width search preprocessing performed at the plurality of pulse widths, and the optimum pulse width determination section assesses the processed state on a pulse width basis achieved by the pulse width search preprocessing to determine the optimum pulse width.

18. The laser processing system according to claim 1, wherein in a case where the material of the workpiece is a crystal material, the reference wavelength is an absorption wavelength according to a bandgap of the crystal material.

19. The laser processing system according to claim 1, further comprising
L. an observation apparatus configured to capture an image of a surface of the workpiece and record an observed image.

20. A laser processing method for irradiating a workpiece with pulsed laser light to perform laser processing on the workpiece, the method comprising:
A. a reference wavelength acquisition step of acquiring a reference wavelength corresponding to photon absorption according to a material of the workpiece;
B. a wavelength search preprocessing step of changing a wavelength of the pulsed laser light, which is outputted from a wavelength tunable laser apparatus capable of changing the wavelength of the pulsed laser light, over a predetermined range containing the reference wavelength and performing wavelength search preprocessing at a plurality of wavelengths;
C. a processed state measurement step of measuring a processed state on a wavelength basis achieved by the wavelength search preprocessing performed at the plurality of wavelengths: and
D. an optimum wavelength determination step of assessing the processed state on a wavelength basis to determine an optimum wavelength used in final processing.

* * * * *